United States Patent
Kaneko et al.

(10) Patent No.: US 8,389,185 B2
(45) Date of Patent: Mar. 5, 2013

(54) PIGMENT DISPERSION, COLORED CURABLE COMPOSITION, COLOR FILTER AND METHOD OF MANUFACTURING THE SAME

(75) Inventors: Yushi Kaneko, Haibara-gun (JP); Kaoru Aoyagi, Haibara-gun (JP); Hideki Takakuwa, Haibara-gun (JP); Yuzo Nagata, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 331 days.

(21) Appl. No.: 12/935,556

(22) PCT Filed: Mar. 25, 2010

(86) PCT No.: PCT/JP2010/055989
§ 371 (c)(1),
(2), (4) Date: Sep. 29, 2010

(87) PCT Pub. No.: WO2010/110491
PCT Pub. Date: Sep. 30, 2010

(65) Prior Publication Data
US 2011/0045412 A1    Feb. 24, 2011

(30) Foreign Application Priority Data

Mar. 26, 2009  (JP) ................. 2009-076639
Dec. 4, 2009   (JP) ................. 2009-276468
Feb. 4, 2010   (JP) ................. 2010-023560

(51) Int. Cl.
*G02B 5/20* (2006.01)

(52) U.S. Cl. ......... 430/7; 430/270.1; 106/413; 349/106; 257/440

(58) Field of Classification Search .................. None
See application file for complete search history.

(56) References Cited

U.S. PATENT DOCUMENTS

| 2008/0160432 A1* | 7/2008 | Byon et al. ............ 430/7 |
| 2008/0179572 A1* | 7/2008 | Kim et al. .............. 252/586 |
| 2009/0189128 A1* | 7/2009 | Takiguchi et al. ..... 252/586 |

FOREIGN PATENT DOCUMENTS

| JP | 2006-030541 A | 2/2006 |
| JP | 2007-204658 A | 8/2007 |
| JP | 2007-284589 A | 11/2007 |
| JP | 2009-052010 A | 3/2009 |
| JP | 2010-054725 A | 3/2010 |
| WO | 2008/108167 A1 | 9/2008 |
| WO | 2008/156148 A1 | 12/2008 |

* cited by examiner

*Primary Examiner* — John A. McPherson
(74) *Attorney, Agent, or Firm* — Sughrue Mion, PLLC

(57) ABSTRACT

There are provide a pigment dispersion containing (A) a halogenated zinc phthalocyanine pigment, and (B) a copolymer of at least (b-1) a monomer having at least one group selected from an amino group and a nitrogen-containing heterocyclic group, (b-2) a monomer having a carboxyl group, and (b-3) a macromonomer having a weight-average molecular weight from 1,000 to 50,000, a colored curable composition containing the pigment dispersion, a color filter using the colored curable composition and a method for preparing the same.

15 Claims, No Drawings

PIGMENT DISPERSION, COLORED CURABLE COMPOSITION, COLOR FILTER AND METHOD OF MANUFACTURING THE SAME

TECHNICAL FIELD

The present invention relates to a pigment dispersion preferable for manufacturing a color filter to be used for a liquid crystal display (LCD), a solid-state image sensing device (CCD or CMOS) or the like, a colored curable composition, a color filter having a colored region formed by the colored curable composition, and a method of manufacturing the color filter.

RELATED ART

A color filter is an essential constituent part for a liquid crystal display or a solid-state image sensing device. In recent years, liquid crystal displays have required further improvements in image quality performance (color reproducibility region, brightness, contrast, etc.), as compared to those for conventional TV and monitor applications. In particular, a halogenated zinc phthalocyanine pigment is attracting attention as a pigment optimal for a green color filter (for example, see Japanese Patent Application Laid-Open (JP-A) No. 2007-284589). As compared to a halogenated copper phthalocyanine which is a conventional green pigment, the halogenated zinc phthalocyanine exhibits the presence of a Tmax on a high wavelength side despite a larger average particle diameter of pigment primary particles, and a very sharp half width of the spectral transmission spectrum. Accordingly, a color filter using the halogenated zinc phthalocyanine exhibits high color purity and high contrast. Further, high-level brightness has been achieved by improving coloring power through adjustment of the halogen atom content in the halogenated zinc phthalocyanine.

With regard to colored curable compositions used in the preparation of color filters, attempts have been made to improve contrast by using finer particles as the particle size of the pigment to be used (see, for example, JP-A-2006-30541).

Further, with regard to a color filter for a solid-state image sensing device, reduction of color unevenness is required for the realization of high resolution. For this reason, it has become important to disperse a pigment without the formation of a secondary aggregate, using a finer pigment having a small particle size.

Improvements in color purity have recently been required particularly in color filters for LCDs, and as a consequence, it is necessary to increase a charging amount of the pigment. Further, in color filters for solid-state image sensing devices, the reduction of stray light arising from scattering, or the like is required as a measure to improve the resolution, which also results in a strong demand for the configuration of a colored layer as a thin film, and also an increase in a charging amount of the pigment in the fabrication of color filters for solid-state image sensing devices. In order to increase a charging amount of the pigment, there is a need to increase a pigment concentration in a colored curable composition. However, an increase in a pigment concentration inevitably leads to a decrease in a content of dispersion resins and curable components (monomers, polymerization initiators, etc.) in the colored curable composition, which consequently results in deterioration of the preservation stability or developability, thus providing poor pattern formability. In particular, a color filter for a solid-state image sensing device is required to achieve a high pixel density and miniaturization, and in order to cope with such a demand, a pattern size tends to be very small, which in turn significantly contributes to deterioration of developability (inhibition of residues in unexposed parts).

In addition, with regard to a halogenated zinc phthalocyanine pigment, it was found that the dispersibility and dispersion stability of a pigment dispersion containing the same pigment, or the developability and light resistance of a film using a colored composition containing the same pigment dispersion is inferior to a conventional green pigment. As a dispersant used in the dispersion of the phthalocyanine pigment, for example, JP-A-2007-204658 proposes a comb-like basic resin or the like as a resin-type dispersant to be used in a colored composition using a phthalocyanine pigment such as an aluminum phthalocyanine pigment or a zinc phthalocyanine pigment. However, the dispersibility and dispersion stability of a pigment dispersion using a halogenated zinc phthalocyanine pigment, and the dispersibility, dispersion stability, developability, and light resistance in a colored curable composition containing the same dispersion cannot be satisfied even with the use of such a conventional dispersant. Further, JP-A-2009-52010 has reported a pigment dispersion wherein a halogenated zinc phthalocyanine pigment is dispersed using a block-type dispersion resin and an alkali soluble resin. However, in the pigment dispersion disclosed in JP-A-2009-52010, it was difficult to maintain the dispersion stability under the condition of high pigment concentration, and it was also difficult to maintain developability and light resistance.

DISCLOSURE OF INVENTION

The present invention was made in view of the above circumstances.

There is provided a pigment dispersion having excellent dispersibility and dispersion stability of a pigment even when the dispersion contains a high concentration of the pigment.

Further, there is also provided a colored curable composition having excellent dispersibility and dispersion stability of a pigment even when the composition contains a high concentration of the pigment, and having good developability upon the formation of a cured film and good light resistance of the thus formed cured film.

Further, there is also provided a color filter having good color characteristics such as good contrast and good color evenness, and a method of manufacturing the color filter.

Further, there is also provided a solid-state image sensing device, an image display device and a liquid crystal display, which includes a color filter having good color characteristics such as good contrast and good color evenness.

As a result of extensive and intensive studies in view of the above circumstances, the inventors have completed the present invention based on a pigment dispersion containing a specific dispersible resin, and a colored curable composition containing the dispersible resin.

The present invention includes the following aspects.

<1> A pigment dispersion containing (A) a halogenated zinc phthalocyanine pigment, and (B) a copolymer of at least (b-1) a monomer having at least one group of an amino group or a nitrogen-containing heterocyclic group, (b-2) a monomer having a carboxyl group, and (b-3) a macromonomer having a weight-average molecular weight from 1,000 to 50,000.

<2> The pigment dispersion of <1>, further containing (A') a pigment derivative.

<3> The pigment dispersion of <2>, wherein (A') the pigment derivative has a structure represented by the following formula (P):

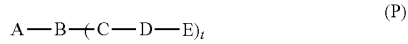

In Formula (P), A represents a partial structure selected from the following Formulae (PA-1) to (PA-3), B represents a single bond, or a (t+1)-valent linking group, C represents a single bond, —NH—, —CONH—, —CO$_2$—, —SO$_2$NH—, —O—, —S— or —SO$_2$—, D represents a single bond, an alkylene group, a cycloan alkylene group or an arylene group, E represents —SO$_3$H', —CO$_2$H or —N(Rpa)(Rpb), Rpa and Rpb each independently represents an alkyl group, a cycloalkyl group or an aryl group, Rpa and Rpb may form a ring, and t represents an integer of 1 to 5.

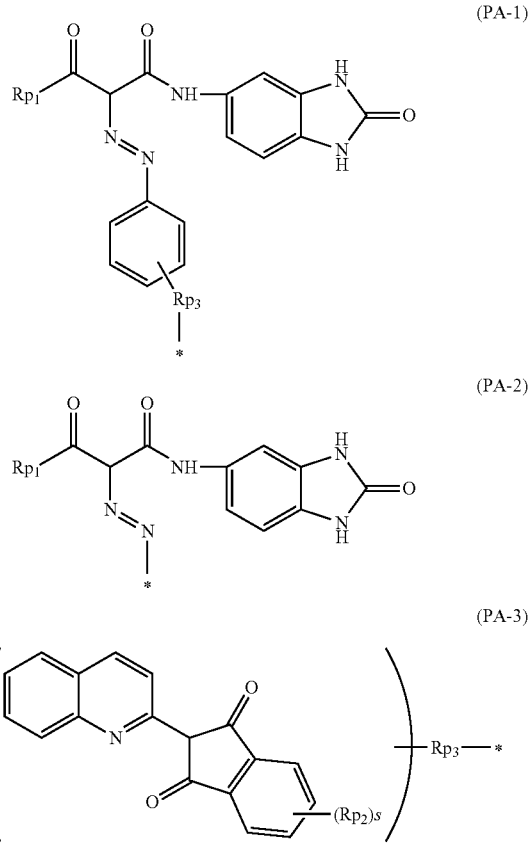

In Formulae (PA-1) and (PA-2), Rp1 represents an alkyl group or aryl group having 1 to 5 carbon atoms. In Formula (PA-3), Rp2 represents a hydrogen atom, a halogen atom, an alkyl group, or a hydroxyl group, and s represents an integer of 1 to 4. In Formula (PA-1) and Formula (PA-3), Rp3 represents a single bond, —NH—, —CONH—, —CO$_2$—, —SO$_2$NH—, —O—, —S— or —SO$_2$—. * represents a linking portion with B.

<4> The pigment dispersion any one of <1> to <3>, wherein (b-1) the monomer having at least one of an amino group or a nitrogen-containing heterocyclic group is a monomer represented by the following Formula (K) or Formula (L).

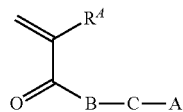

In Formula (K), $R^A$ represents a hydrogen atom, a methyl group, a trifluoromethyl group, a hydroxy methyl group, a fluorine atom, or a chlorine atom, B represents an oxygen atom or —N($R^B$)—, $R^B$ represents a hydrogen atom, an alkyl group, a cycloalkyl group, or an aryl group, C represents a divalent linking group, and A represents an amino group or a nitrogen-containing heterocyclic group.

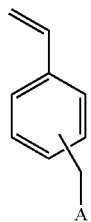

In Formula (L), A represents an amino group or a nitrogen-containing heterocyclic group.

<5> The pigment dispersion of any one of <1> to <4>, wherein (b-1) the monomer having at least one of an amino group or a nitrogen-containing heterocyclic group is a monomer having an amino group.

<6> The pigment dispersion any one of <1> to <5>, wherein (b-2) the monomer having a carboxyl group is acrylic acid or methacrylic acid.

<7> The pigment dispersion any one of <1> to <6>, wherein (b-3) the monomer having a weight-average molecular weight of from 1,000 to 50,000 is a polyester macromonomer.

<8> The pigment dispersion any one of <1> to <7>, wherein a weight-average molecular weight of (b-3) the monomer having a weight-average molecular weight of from 1,000 to 50,000 is from 2,000 to 5,000.

<9> A colored curable composition containing the pigment dispersion of <1> or <2>, (C) a photopolymerizable compound, and (D) a photopolymerization initiator.

<10> The colored curable composition of <9>, wherein (D) the photopolymerization initiator is at least one compound of an oxime compound, a hexaarylbiimidazole compound, or a triazine compound.

<11> A color filter having, on a substrate, a colored region formed by the colored curable composition of <9> or <10>.

<12> A method of manufacturing a color filter including: applying the colored curable composition of <9> or <10> on a substrate to form a colored layer, pattern exposing the colored layer through a mask, and developing the exposed colored layer to form a colored region.

<13> A solid-state image sensing device including the color filter of <11>.

<14> An image display device including the color filter of <11>.

<15> A liquid crystal display including the color filter of <11>.

According to the present invention, it is possible to provide a pigment dispersion having excellent dispersibility and dispersion stability of a pigment even when the dispersion contains a high concentration of the pigment.

Further, according to the present invention, it is possible to provide a colored curable composition having excellent dispersibility and dispersion stability of a pigment even when the composition contains a high concentration of the pigment, and having good developability upon the formation of a cured film and good light resistance of the thus formed cured film.

Further, according to the present invention, it is possible to provide a color filter having good color characteristics such as good contrast and good color evenness, by using the colored curable composition of the present invention, and a method of manufacturing the same.

Further, according to the present invention, it is possible to provide a solid-state image sensing device, an image display device and a liquid crystal display, which include a color filter having good color characteristics such as good contrast and good color evenness.

BEST MODE FOR CARRYING OUT THE INVENTION

Hereinafter, the pigment dispersion, colored curable composition and color filter of the present invention, and the manufacturing method of the color filter will be described in more detail.

Further, a colored region in the color filter of the present invention includes a colored pixel (colored pattern) region, and a light blocking film-forming region in the color filter.

Further, a numerical range represented by "to" in the present specification represents a range including numerical values described in front of and behind "to", as the minimum value and the maximum value.

[Pigment Dispersion]

The pigment dispersion of the present invention is a pigment dispersion containing (A) a halogenated zinc phthalocyanine pigment, and (B) a copolymer (hereinafter, referred to suitably as "specific resin") of at least (b-1) a monomer having at least one group of an amino group or a nitrogen-containing heterocyclic group, (b-2) a monomer having a carboxyl group, and (b-3) a macromonomer having a weight-average molecular weight from 1,000 to 50,000.

The pigment dispersion of the present invention exhibits excellent dispersibility and dispersion stability of a pigment even when the dispersion contains a high concentration of the pigment, by containing the above-mentioned individual components. Further, the pigment dispersion of the present invention also exhibits an improvement in light resistance, contrary to expectations. Even though it is an assumption, the reason for such improved effects is thought to be due to the following.

That is, a halogenated zinc phthalocyanine pigment has a large zinc atom at the center, and unlike a halogenated copper phthalocyanine pigment, it is therefore thought that metallic zinc takes a square pyramid structure which is placed higher than a plane composed of four nitrogen atoms of isoindole. In this way, a dipole moment increases, and therefore the pigment-to-pigment aggregation is thought to be stronger than the halogenated copper phthalocyanine pigment having a plane structure. On the other hand, the pigment dispersion of the present invention contains B) a copolymer (specific resin) of (b-1) a monomer having at least one of an amino group or a nitrogen-containing heterocyclic group, (b-2) a monomer having a carboxyl group, and (b-3) a macromonomer having a weight-average molecular weight from 1,000 to 50,000. This specific resin is thought to exhibit improvements in the dispersibility and dispersion stability of a pigment dispersion, because an amino group or nitrogen-containing heterocyclic group derived from the monomer of (b-1) and a carboxylic group derived from the monomer of (b-2) strongly bind to halogenated zinc phthalocyanine, and the pigment-to-pigment aggregation is inhibited by a molecular chain structure derived from the macromonomer of (b-3). Further, with regard to light resistance, it is believed that the specific resin coordinates the potent pigment to enclose the pigment, whereby the pigment is protected against an attack of light-excited singlet oxygen.

<(B) Copolymer of at Least (b-1) a Monomer Having at Least One Group of an Amino Group or a Nitrogen-Containing Heterocyclic Group, (b-2) a Monomer Having a Carboxyl Group, and (b-3) a Macromonomer Having a Weight-Average Molecular Weight from 1,000 to 50,000>

The pigment dispersion of the present invention contains (B) a copolymer (specific resin) of at least (b-1) a monomer having at least one group of an amino group or a nitrogen-containing heterocyclic group, (b-2) a monomer having a carboxyl group, and (b-3) a macromonomer having a weight-average molecular weight from 1,000 to 50,000.

The specific resin functions as a dispersant.

By containing the specific resin, the pigment dispersion of the present invention finely disperses a halogenated zinc phthalocyanine pigment having poor dispersibility and dispersion stability, and also exhibits excellent effects on the dispersion stability.

The specific resin is prepared by copolymerization of (b-1) a monomer having at least one group of an amino group or a nitrogen-containing heterocyclic group, (b-2) a monomer having a carboxyl group, (b-3) a macromonomer having a weight-average molecular weight from 1,000 to 50,000, and, if necessary, other monomers, as starting materials.

Hereinafter, the starting materials to obtain the specific resin, i.e., (b-1) a monomer having at least one group of an amino group or a nitrogen-containing heterocyclic group, (b-2) a monomer having a carboxyl group, and (b-3) a macromonomer having a weight-average molecular weight from 1,000 to 50,000, will be described in more detail.

<(b-1) Monomer Having at Least One Group of an Amino Group or a Nitrogen-Containing Heterocyclic Group>

(b-1) the monomer having at least one group of an amino group or a nitrogen-containing heterocyclic group (hereinafter, referred to suitably as "monomer (b-1)") is a monomer having at least one group of an amino group or a nitrogen-containing heterocyclic group, and having a molecular weight from 50 to 1,000.

Examples of the amino group in the monomer (b-1) include primary, secondary and tertiary amino groups. From the viewpoint of dispersion stability, preferred is a secondary or a tertiary amino group, and more preferred is a tertiary amino group. As the amino group, preferred is an amino group containing a linear or branched alkyl group having 1 to 10 carbon atoms, a cycloalkyl group having 3 to 10 carbon atoms, or an aryl group having 6 to 15 carbon atoms, and most preferred is an amino group containing a linear or branched alkyl group having 1 to 5 carbon atoms. Specific examples of the amino group include —NHMe, —NHEt, —NHPr, —NHiPr, —NHBu, —NH(tert-Bu), —NMe$_2$, -Net$_2$, —NPr$_2$, —NPh$_2$, and a morpholino group. (Here, Me represents a methyl group, Et represents an ethyl group, Pr represents a propyl group, Bu represents a butyl group, and Ph represents a phenyl group)

A nitrogen-containing heterocyclic group of the monomer (b-1) is a cyclic substituent having at least one nitrogen atom in the cyclic structure. The cyclic structure may be a saturated cyclic structure or an unsaturated cyclic structure. The cyclic structure may be a monocyclic structure or a condensed cyclic structure. The cyclic structure may be unsubstituted or substituted. Further, even though the nitrogen-containing heterocyclic group derived from the monomer (b-1) may, be present in a side chain structure or a main chain structure in the specific resin, within the side chain structure is more preferred from the viewpoint of dispersibility and dispersion stability.

Specific examples of the nitrogen-containing heterocyclic group include pyrrolidine, pyrroline, tetrahydropyridine, piperazine, homopiperazine, piperidine, triazine, morpholine, hexamethylenetetramine, diazabicycloundecene, decahydroquinoline, diazabicyclooctane, pyrrolidinone, δ-valerolactam, succinimide, glutarimide, imidazolidone, tetrahydropyrimidone, urazole, dihydrouracil, barbituric acid, indole, carbazole, julolidine, phenoxazine, phenothiazine, oxindole, phenanthridinone, isatine, phthalimide, diiminoisoindoline, iminoisoindolinone, diiminobenzisoindoline, naphthalimide, quinazolinedione, pyrrole, porphyrin, porphyrin-metal complexes, phthalocyanine, phthalocyanine-metal complexes, naphthalocyanine, naphthalocyanine-metal complexes, pyrazole, imidazole, triazole, tetrazole, isoxazole, oxazole, isothiazole, thiazole, thiadiazole, thiatriazole, iminostilbene, azaindole, indazole, benzimidazole, benzotriazole, azabenzimidazole, anthranil, benzisoxazole, benzoxazole, benzothiazole, benzofurazan, benzothiadiazole, triazole-pyrimidine, triazole-pyridine, purine, xanthine, pyridine, pyridazine, pyrimidine, pyrimidone, uracil, pyrazine, quinoline, acridine, cinnoline, benzocinnoline, quinoxaline, quinazoline, quinoxaline, phenazine, phenanthroline, perimidine, acridone and the like, and these may be unsubstituted or substituted.

More preferred examples of the nitrogen-containing heterocyclic group include indole, carbazole, phenoxazine, phenothiazine, oxindole, phenanthridinone, isatine, phthalimide, diiminoisoindoline, iminoisoindolinone, diiminobenzisoindoline, naphthalimide, quinazolinedione, pyrrole, pyrazole, imidazole, triazole, tetrazole, isoxazole, oxazole, isothiazole, thiazole, thiadiazole, thiatriazole, iminostilbene, azaindole, indazole, benzimidazole, benzotriazole, azabenzimidazole, anthranil, benzisoxazole, benzoxazole, benzothiazole, benzofurazan, benzothiadiazole, triazole-pyrimidine, triazole-pyridine, purine, xanthine, pyridine, pyridazine, pyrimidine, pyrimidone, uracil, pyrazine, quinoline, acridine, cinnoline, benzocinnoline, quinoxaline, quinazoline, quinoxaline, phenazine, phenanthroline, acridone, and the like.

Examples of the substituent which the nitrogen-containing heterocyclic group in the monomer (b-1) may have include a halogen atom, an alkyl group, a cycloalkyl group, an alkenyl group, a cycloalkenyl group, an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, aryloxycarbonyloxy group, an amino group (including an alkylamino group and an anilino group), an acylamino group, an aminocarbonylamino group, an alkoxycarbonylamino group, an aryloxycarbonylamino group, a sulfamoylamino group, an alkyl- or aryl-sulfonylamino group, a mercapto group, an alkylthio group, an arylthio group, a heterocyclic thio group, a sulfamoyl group, a sulfo group, an alkyl- or aryl-sulfinyl group, an alkyl- or aryl-sulfonyl group, an acyl group, an aryloxycarbonyl group, an alkoxycarbonyl group, a carbamoyl group, an aryl or heterocyclic azo group, an imido group, a phosphino group, a phosphinyl group, a phosphinyloxy group, a phosphinylamino group, a silyl group, and the like.

Hereinafter, the substituents which the nitrogen-containing heterocyclic group may have will be further described in detail.

Examples of the substituent include a halogen atom (for example, a fluorine atom, a chlorine atom, a bromine atom or an iodine atom), an alkyl group (for example, a linear or branched, a substituted or unsubstituted alkyl group, preferably an alkyl group having 1 to 30 carbon atoms, for example, methyl, ethyl, n-propyl group, isopropyl group, tert-butyl, n-octyl, 2-chloroethyl, 2-cyanoethyl or 2-ethylhexyl), and a cycloalkyl group (preferably, a substituted or unsubstituted cycloalkyl group having 3 to 30 carbon atoms, such as cyclohexyl or cyclopentyl, or a polycycloalkyl group, for example, a group having a polycyclic structure, such as bicycloalkyl group (a substituted or unsubstituted bicycloalkyl group preferably having 5 to 30 carbon atoms, e.g., bicyclo[1,2,2]heptan-2-yl, bicyclo[2,2,2]octan-3-yl) and tricycloalkyl group. A monocyclic cycloalkyl group and a bicycloalkyl group are preferred, and a monocyclic cycloalkyl group is particularly preferred), an alkenyl group (a linear or branched, substituted or unsubstituted alkenyl group, preferably an alkenyl group having 2 to 30 carbon atoms, for example vinyl, allyl, prenyl, geranyl and oleyl), a cycloalkenyl group (preferably, a substituted or unsubstituted cycloalkenyl group having 3 to 30 carbon atoms, such as 2-cyclopenten-1-yl or 2-cyclohexen-1-yl, or a polycycloalkenyl group such as bicycloalkenyl group (a substituted or unsubstituted bicycloalkenyl group preferably having 5 to 30 carbon atoms, e.g., bicyclo[2,2,1]hept-2-en-1-yl, or bicyclo[2,2,2]oct-2-en-4-yl) or a tricycloalkenyl group. A monocyclic cycloalkenyl group is particularly preferred). An alkynyl group (a substituted or unsubstituted alkynyl group having 2 to 30 carbon atoms, such as ethynyl, propargyl and trimethylsilylethynyl), an aryl group (preferably a substituted or unsubstituted aryl group having 6 to 30 carbon atoms, for example, phenyl, p-tolyl, naphthyl, m-chlorophenyl or o-hexadecanoylaminophenyl), a heterocyclic group (preferably, a 5- to 7-membered substituted or unsubstituted, saturated or unsaturated, aromatic or non-aromatic, monocyclic or condensed heterocyclic group, more preferably a heterocyclic group having at least one heteroatom of a nitrogen atom, an oxygen atom or a sulfur atom, with the ring-constituting atom being selected from a carbon atom, a nitrogen atom and a sulfur atom, still more preferably a 5- or 6-membered aromatic heterocyclic group having 3 to 30 carbon atoms, for example, 2-furyl, 2-thienyl, 2-pyridyl, 4-pyridyl, 2-pyrimidinyl or 2-benzothiazolyl), a cyano group, a hydroxyl group, a nitro group, a carboxyl group, an alkoxy group (preferably, a substituted or unsubstituted alkoxy group having 1 to 30 carbon atoms, for example, methoxy, ethoxy, isopropoxy, tert-butoxy, n-octyloxy or 2-methoxyethoxy), an aryloxy group (preferably, a substituted or unsubstituted aryloxy group having 6 to 30 carbon atoms, for example phenoxy, 2-methylphenoxy, 2,4-di-tert-amylphenoxy, 4-tert-butylphenoxy, 3-nitrophenoxy or 2-tetradecanoylaminophenoxy), a silyloxy group (preferably, a silyloxy group having 3 to 20 carbon atoms, for example trimethyl silyloxy and tert-butyldimethylsilyloxy), a heterocyclic oxy group (preferably, a substituted or unsubstituted heterocyclic oxy group having 2 to 30 carbon atoms, and the heterocyclic moiety is preferably the heterocyclic moiety described above for the heterocyclic group. Examples of the heterocyclic oxy group include 1-phenyl-tetrazol-5-oxy and 2-tetrahyropyranyloxy), an acyloxy group (preferably, a formyloxy group, a substituted or unsubstituted alkylcarbonyloxy group having 2 to 30 carbon atoms, or a substituted or unsubstituted arylcarbonyloxy group having 6 to 30 carbon atoms, and examples thereof include formyloxy, acetyloxy, pivaloyloxy, stearoyloxy, benzoyloxy and p-methoxyphenylcarbonyloxy), a carbamoyloxy group (preferably, a substituted or unsubstituted carbamoyloxy group having a 1 to 30 carbon atoms, and examples thereof include N,N-dimethylcarbamoyloxy, N,N-diethylcarbamoyloxy, morpholinocarbonyloxy, N,N-di-n-octylaminocarbonyloxy and N-n-octylcarbamoyloxy), an alkoxycarbonyloxy group (preferably, a substituted or unsubstituted alkoxycarbonyloxy group having 2 to 30 carbon atoms, and examples thereof include methoxycarbonyloxy, ethoxycarbonyloxy, tert-butoxycarbonyloxy and n-octylcarbonyloxy), an aryloxycarbonyloxy group (preferably, a substituted or unsubstituted aryloxycarbonyloxy group having 7 to 30 carbon atoms, and examples thereof include phenoxycarbonyloxy, p-methoxyphenoxycarbonyloxy and p-n-hexadecyloxyphenoxycarbonyloxy), an amino group (preferably, an amino group, a substituted or unsubstituted alkylamino group having 1 to 30 carbon atoms, a substituted or unsubstituted arylamino group having 6 to 30 carbon atoms, or a heterocyclic amino group having 0 to 30 carbon atoms, and examples thereof include amino, methylamino, dimethylamino, anilino, N-methylanilino, diphenylamino and N-1,3,5-triazin-2-ylamino), an acylamino group (preferably, a formylamino group, a substituted or unsubstituted alkylcarbonylamino group having 1 to 30 carbon atoms, or a substituted or unsubstituted arylcarbonylamino group having 6 to 30 carbon atoms, and examples thereof include formylamino, acetylamino, pivaloylamino, lauroylamino, benzoylamino and 3,4,5-tri-n-octyloxyphenylcarbonylamino), an aminocarbonylamino group (preferably, a substituted or unsubstituted aminocarbonylamino group having 1 to 30 carbon atoms, and examples thereof include carbamoylamino, N,N-dimethylaminocarbonylamino, N,N-diethylaminocarbonylamino and morpholinocarbonylamino), an alkoxycarbonylamino group (preferably, a substituted or unsubstituted alkoxycarbonylamino group having 2 to 30 carbon atoms, and examples thereof include methoxycarbonylamino, ethoxycarbonylamino, tert-butoxycarbonylamino, n-octadecyloxycarbonylamino and N-methyl-methoxycarbonylamino), an aryloxycarbonylamino group (preferably, a substituted or unsubstituted aryloxycarbonylamino group having 7 to 30 carbon atoms, and examples thereof include phenoxycarbonylamino, p-chlorophenoxycarbonylamino and m-n-octyloxyphenoxycarbonylamino), a sulfamoylamino group (preferably, a substituted or unsubstituted sulfamoylamino group having 0 to 30 carbon atoms, and examples thereof include sulfamoylamino, N,N-dimethylaminosulfonylamino and N-n-octylaminosulfonylamino), an alkyl- or aryl-sulfonylamino group (preferably, a substituted or unsubstituted alkylsulfonylamino group having 1 to 30 carbon atoms, or a substituted or unsubstituted arylsulfonylamino group having 6 to 30 carbon atoms, and examples thereof include methylsulfonylamino, butylsulfonylamino, phenylsulfonylamino, 2,3,5-trichlorophenylsulfonylamino and p-methylphenylsulfonylamino), and a mercapto group, an alkylthio group (preferably, a substituted or unsubstituted alkylthio group having 1 to 30 carbon atoms, and examples thereof include methylthio, ethylthio and n-hexadecylthio), an arylthio group (preferably, a substituted or unsubstituted arylthio group having 6 to 30 carbon atoms, and examples thereof include phenylthio, p-chlorophenylthio and m-methoxyphenylthio), a heterocyclic thio group (preferably, a substituted or unsubstituted heterocyclic thio group having 2 to 30 carbon atoms, and the heterocyclic moiety is preferably the heterocyclic moiety described above for the heterocyclic group. Examples of the heterocyclic thio group include 2-benzothiazolylthio and 1-phenyltetrazol-5-ylthio), a sulfamoyl group (preferably, a substituted or unsubstituted sulfamoyl group having 0 to 30 carbon atoms, and examples thereof include N-ethylsulfamoyl, N-(3-dodecyloxypropyl)sulfamoyl, N,N-dimethylsulfamoyl, N-acetylsulfamoyl, N-benzoylsulfamoyl and N—(N'-phenylcarbamoyl)sulfamoyl, and a sulfo group, an alkyl- or aryl-sulfinyl group (preferably, a substituted or unsubstituted alkylsulfinyl group having 1 to 30 carbon atoms, or a substituted or unsubstituted arylsulfinyl group having a carbon number 6 to 30, and examples thereof include methylsulfinyl, ethylsulfinyl, phenylsulfinyl and p-methylphenylsulfinyl), an alkyl- or aryl-sulfonyl group (preferably, a substituted or unsubstituted alkylsulfonyl group having 1 to 30 carbon atoms, or a substituted or unsubstituted arylsulfonyl group having 6 to 30 carbon atoms, and examples thereof include methylsulfonyl, ethylsulfonyl, phenylsulfonyl and p-methylphenylsulfonyl), an acyl group (preferably, a formyl group, a substituted or unsubstituted alkylcarbonyl group having 2 to 30 carbon atoms, or a substituted or unsubstituted arylcarbonyl group having 7 to 30 carbon atoms, and examples thereof include acetyl, pivaloyl, 2-chloroacetyl, stearoyl, benzoyl and p-n-octyloxyphenylcarbonyl), an aryloxycarbonyl group (preferably, a substituted or unsubstituted aryloxycarbonyl group having 7 to 30 carbon atoms, and examples thereof include phenoxycarbonyl, o-chlorophenoxycarbonyl, m-nitrophenoxycarbonyl and p-tert-butylphenoxycarbonyl), an alkoxycarbonyl group (preferably, a substituted or unsubstituted alkoxycarbonyl group having 2 to 30 carbon atoms, and examples thereof include methoxycarbonyl, ethoxycarbonyl, tert-butoxycarbonyl and n-octadecyloxycarbonyl), a carbamoyl group (preferably, a substituted or unsubstituted carbamoyl group having 1 to 30 carbon atoms, and examples thereof include carbamoyl, N-methylcarbamoyl, N,N-dimethylcarbamoyl, N,N-di-n-octylcarbamoyl and N-(methylsulfonyl)carbamoyl), an aryl or heterocyclic azo group (preferably, a substituted or unsubstituted aryl azo group having 6 to 30 carbon atoms, or a substituted or unsubstituted heterocyclic azo group having 3 to 30 carbon atoms (the heterocyclic moiety is preferably the heterocyclic moiety described above for the heterocyclic group), and examples thereof include phenylazo, p-chlorophenylazo and 5-ethylthio-1,3,4-thiadiazol-2-ylazo), an imido group (preferably, a substituted or unsubstituted imido group having 2 to 30 carbon atoms, and examples thereof include N-succinimido and N-phthalimido), a phosphino group (preferably, a substituted or unsubstituted phosphino group having 2 to 30 carbon atoms, and examples thereof include dimethylphosphino, diphenylphosphino and methylphenoxyphosphino), a phosphinyl group (preferably, a substituted or unsubstituted phosphinyl group having 2 to 30 carbon atoms, and examples thereof include phosphinyl, dioctyloxyphosphinyl and diethoxyphosphinyl), and a phosphinyloxy group (preferably, a substituted or unsubstituted phosphinyloxy group having 2 to 30 carbon atoms, and examples thereof include diphenoxyphosphinyloxy and dioctyloxyphosphinyloxy), a phosphinylamino group (preferably, a substituted or unsubstituted phosphinylamino group having 2 to 30 carbon atoms, and examples thereof include dimethoxyphosphinylamino and dimethylaminophosphinylamino), a silyl group (preferably, a substituted or unsubstituted silyl group having 3 to 30 carbon atoms, and examples thereof include trimethylsilyl, tert-butyldimethylsilyl and phenyldimethylsilyl).

In the functional groups above, those having a hydrogen atom may be deprived of the hydrogen atom and be further substituted by the above-described substituent. Examples of such a functional group include an alkylcarbonylaminosulfonyl group, an arylcarbonylaminosulfonyl group, an alkylsulfonylaminocarbonyl group and an arylsulfonylaminocarbonyl group, and specific examples thereof include a methylsulfonylaminocarbonyl group, a p-methylphenylsulfonylaminocarbonyl group, an acetylaminosulfonyl group and a benzoylaminosulfonyl group.

As the monomer (b-1), a monomer having an amino group, a pyridinyl group, an imidazoyl group, a phthalimide group, a naphthalimide group, a benzimidazole group, or an acridone group is preferred from the viewpoint of dispersion stability, developability and light resistance. More preferred is a monomer having an amino group or a naphthalimide group.

As the monomer (b-1), there may be used a known monomer having at least one group of an amino group or a nitrogen-containing heterocyclic group, and having a molecular weight from 50 to 1,000. From the viewpoint of polymerizability, an acrylic monomer or a styrene monomer is preferred, and an acrylic ester monomer represented by the following Formula (K), or a styrene monomer represented by the following Formula (L) is most preferred. By using such a monomer, the specific resin can have an amino group or nitrogen-containing heterocyclic group in the side chain moiety, which can strongly interact with a halogenated zinc phthalocyanine pigment. As a result, dispersion stability and light resistance of the pigment dispersion and the colored curable composition are improved.

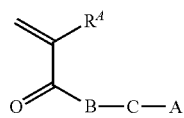

(K)

In Formula (K), $R^A$ represents a hydrogen atom, a methyl group, a trifluoromethyl group, a hydroxy methyl group, a fluorine atom, or a chlorine atom, B represents an oxygen atom or —N($R^B$)—, $R^B$ represents a hydrogen atom, an alkyl group, a cycloalkyl group, or an aryl group, C represents a divalent linking group, and A represents an amino group or a nitrogen-containing heterocyclic group.

As $R^A$ in Formula (K), particularly preferred are a hydrogen atom and a methyl group.

As the divalent linking group represented by C, preferred are an alkylene group having 2 to 20 carbon atoms, an alkylene aminocarbonyl group having 2 to 20 carbon atoms, a cycloalkylene group having 5 to 10 carbon atoms, and an arylene group having 6 to 10 carbon atoms, and most preferred are an alkylene group having 2 to 10 carbon atoms, and an alkylene aminocarbonyl group having 2 to 10 carbon atoms.

Examples of the alkyl group represented by $R^B$ include alkyl groups having 1 to 10 carbon atoms. Particularly preferred is an alkyl group having 1 to 5 carbon atoms. The amino group or nitrogen-containing heterocyclic group represented by A has the same definition as described for the amino group or heterocyclic group of the monomer (b-1), and a preferred range is also the same.

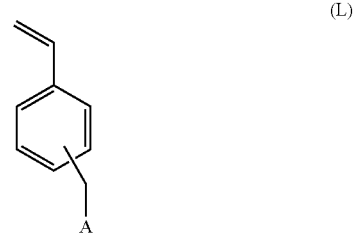

(L)

In Formula (L), A represents an amino group or a nitrogen-containing heterocyclic group. The amino group or heterocyclic group represented by A has the same definition as described for the amino group or heterocyclic group of the monomer (b-1), and a preferred range is also the same.

The monomer (b-1) may be used alone or in a combination of two or more thereof.

Specific examples of the monomer (b-1) are exemplified hereinafter, but the present invention is not limited thereto. Further, in specific examples of (M-1) to (M-23), and (M-31) to (M-50), $R^A$ represents a hydrogen atom, a methyl group, a trifluoromethyl group, a hydroxy methyl group, a fluorine atom, or a chlorine atom.

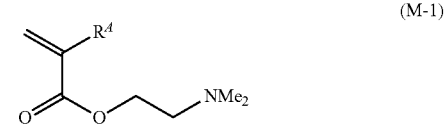

(M-1)

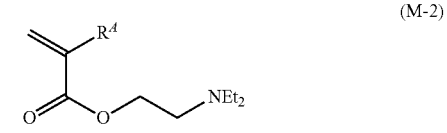

(M-2)

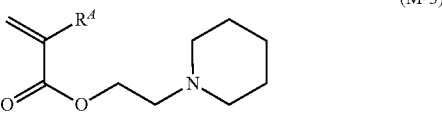

(M-3)

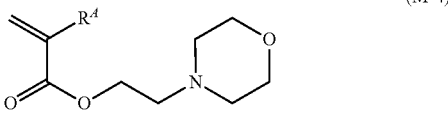

(M-4)

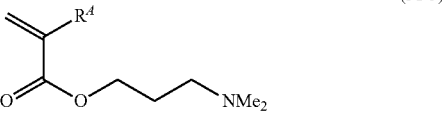

(M-5)

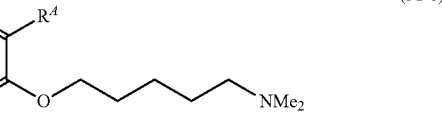

(M-6)

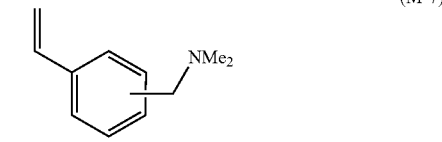

(M-7)

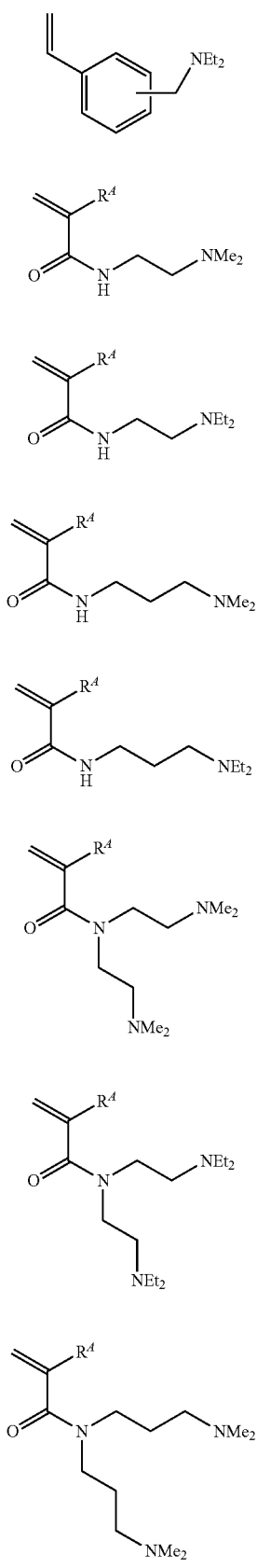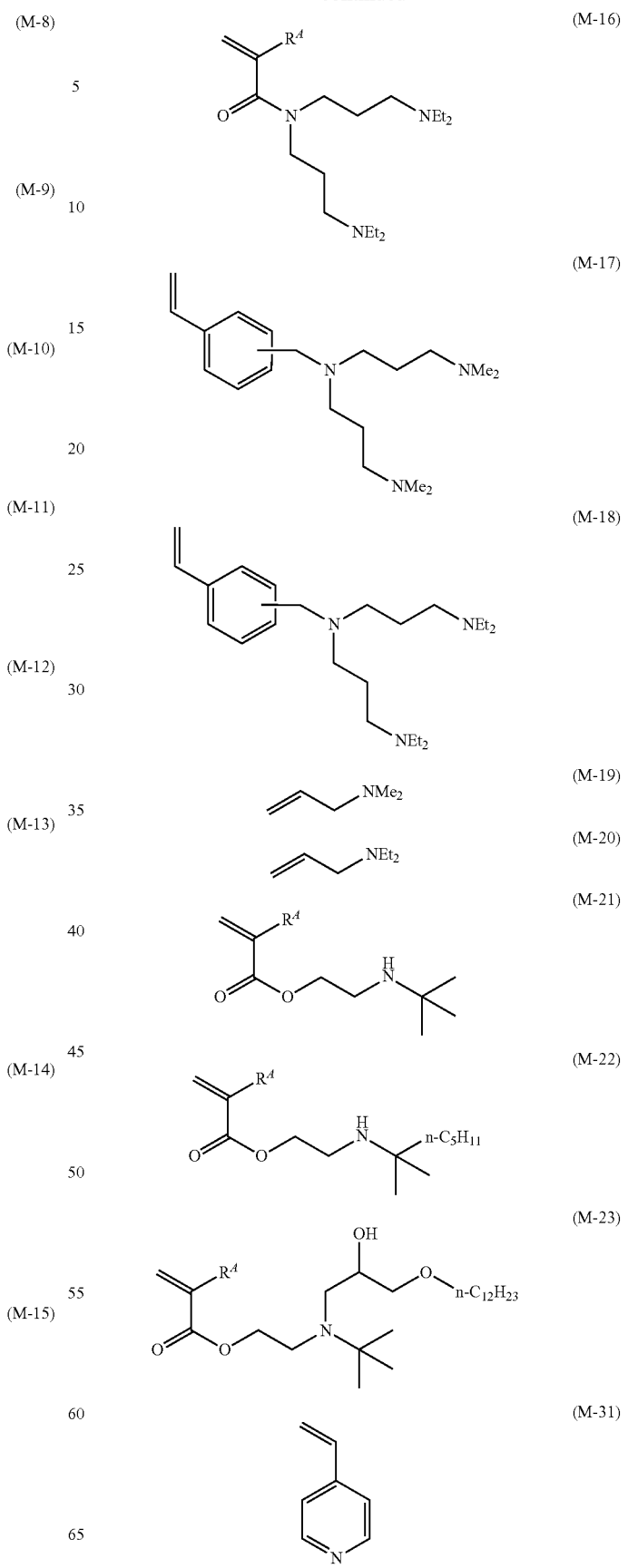

(M-32) 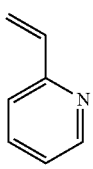
(M-33) 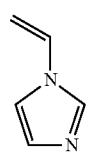
(M-34) 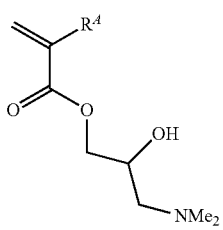
(M-35) 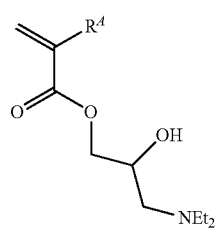
(M-36) 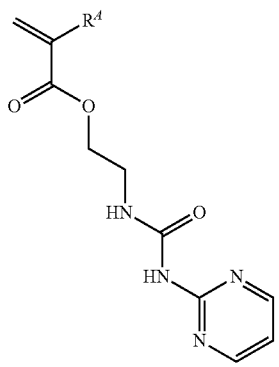
(M-37) 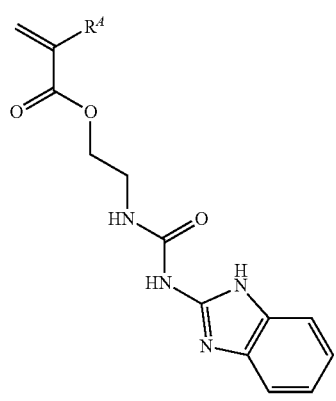
(M-38) 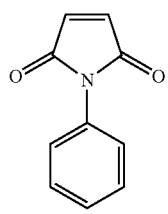
(M-39) 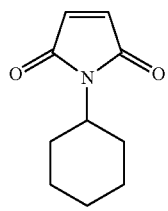
(M-40) 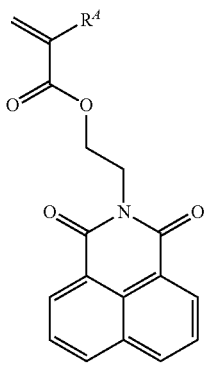
(M-41) 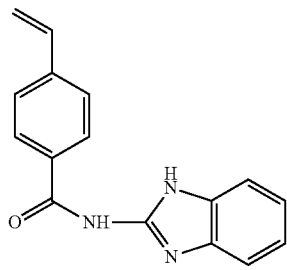
(M-42) 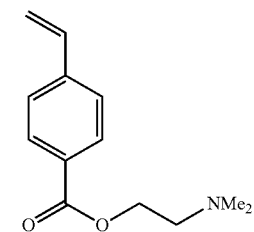
(M-43) 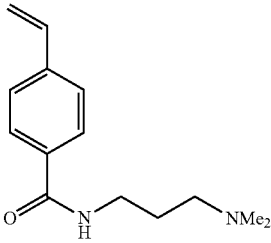

(M-44)
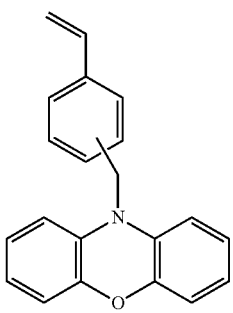

(M-45)
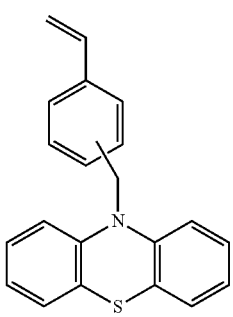

(M-46)
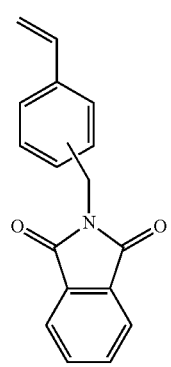

(M-47)
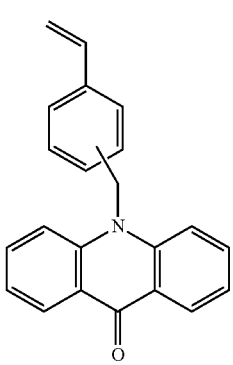

(M-48)
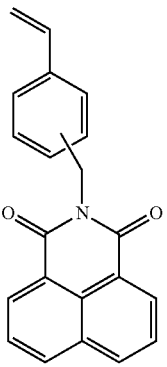

(M-49)
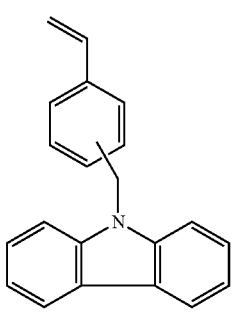

(M-50)
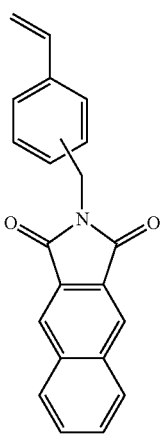

Among specific examples of (M-1) to (M-23) and (M-31) to (M-50), preferred are specific examples of (M-1) to (M-6), (M-9) to (M-16), (M-21) to (M-23), (M-37), (M-40), (M-47), (M-48), and (M-49) wherein $R^A$ is a hydrogen atom or a methyl group. Particularly preferred is a specific example of (M-1), (M-2), (M-11), (M-12), (M-37), (M-47) or (M-48) pigment from the viewpoint of dispersion stability of the pigment dispersion, and developability exhibited by the colored curable composition using the pigment dispersion.

<(b-2) Monomer Having Carboxyl Group>

The monomer having a (b-2) carboxyl group (hereinafter, referred to suitably as "monomer (b-2)") is a monomer having at least one carboxyl group and a molecular weight from 50 to 500.

Even though a known monomer having at least one carboxyl group and a molecular weight from 50 to 500 can be used as the monomer (b-2), an acrylic monomer or a styrene monomer is preferred from the viewpoint of polymerizability, and a (meth)acrylic ester monomer and a (meth)acrylic amide monomer are particularly preferred.

The monomer (b-2) may be used alone or in a combination of two or more thereof.

Specific examples of the monomer (b-2) are exemplified hereinafter, but the present invention is not limited thereto. Further, in specific examples of (M-24) to (M-30), (M-51) and (M-52), $R^A$ represents a hydrogen atom, a methyl group, a trifluoromethyl group, a hydroxy methyl group, a fluorine atom, or a chlorine atom.

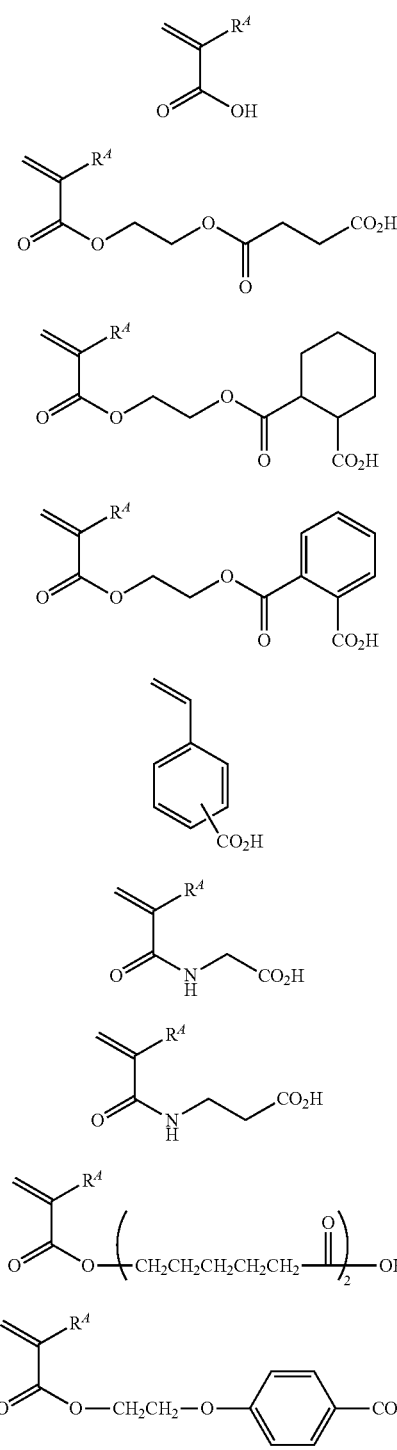

Among specific examples of (M-24) to (M-30), (M-51), and (M-52), particularly preferred are specific examples of (M-24) and (M-29) wherein $R^A$ is a hydrogen atom or a methyl group, from the viewpoint of dispersion stability of the pigment dispersion, and developability exhibited by the colored curable composition using the pigment dispersion. Particularly, most preferred is (M-24) wherein $R^A$ is a hydrogen atom or a methyl group.

<(b-3) Macromonomer Having a Weight-Average Molecular Weight from 1,000 to 50,000>

The (b-3) macromonomer having a weight-average molecular weight from 1,000 to 50,000 (hereinafter, referred to suitably as "macromonomer (b-3)" is an oligomer or polymer having the above-specified weight-average molecular weight and a polymerizable group at the end thereof.

A weight-average molecular weight of the macromonomer (b-3) is in the range from 1,000 to 50,000, preferably from 1,000 to 20,000, more preferably from 2,000 to 10,000, and particularly preferably from 2,000 to 5,000. When a weight-average molecular weight of the macromonomer (b-3) is within the above-specified range, dispersibility and dispersion stability of the pigment dispersion, and developability exhibited by the colored curable composition using the pigment dispersion are improved.

Further, the weight average molecular weight in the present specification is in terms of polystyrene conversion, as measured by gel permeation chromatography (GPC).

As the macromonomer (b-3), a known macromonomer may be used.

Examples of the macromonomer (b-3) include macromonomer AA-6 (methacryloyl group-terminated polymethyl methacrylate), AS-6 (methacryloyl group-terminated polystyrene), AN-6S (methacryloyl group-terminated styrene/acrylonitrile copolymer), AB-6S (methacryloyl group-terminated polybutyl acrylate) (all manufactured by TOAGOSEI), PLACCEL (Polycaprolactonediol) FM5 (5:1 mol addition product of ε-caprolactone and 2-hydroxyethyl methacrylate), FA10L (10:1 mol addition product of ε-caprolactone and 2-hydroxyethyl acrylate) (all manufactured by DAICEL CHEMICAL INDUSTRIES, LTD.), and the polyester macromonomer as disclosed in JP-A-2-272009. Among these, particularly preferred is a polyester macromonomer having excellent flexibility or solventphilic property from the viewpoint of dispersibility and dispersion stability of the pigment dispersion, and developability and light resistance exhibited by the colored curable composition using the pigment dispersion.

The macromonomer (b-3) preferably includes a macromonomer represented by the following Formulae (i), (ii) or (i)-2.

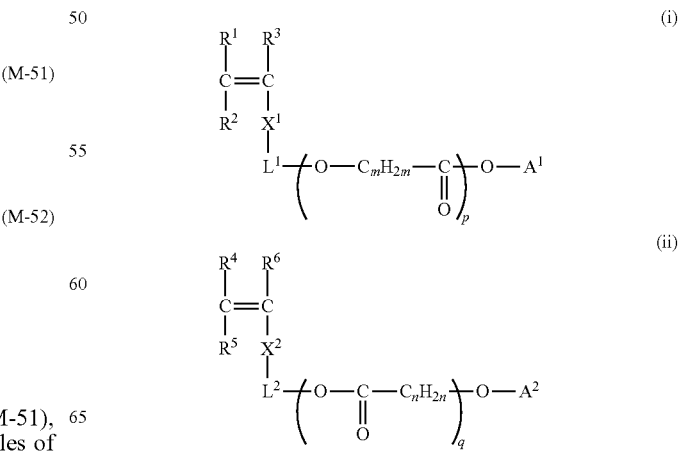

-continued

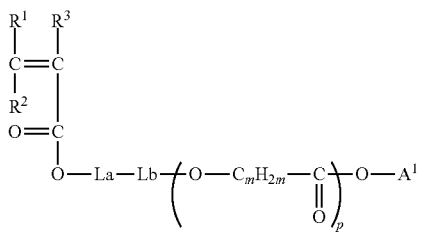

In Formulae (i), (ii) or (i)-2, $R^1$ to $R^6$ each independently represents a hydrogen atom, or a monovalent organic group, $X^1$ and $X^2$ each independently represents —CO—, —C(=O)O—, —CONH—, —OC(=O)—, or phenylene group, $L^1$ and $L^2$ each independently represents a single bond, or divalent organic linking group, La represents an alkylene group having 2 to 10 carbon atoms, Lb represents —C(=O)— or —NHC(=O)—, $A^1$ and $A^2$ each independently represents a monovalent organic group, m and n each independently represents an integer of 2 to 8, p and q each independently represents an integer of 1 to 100.

Preferable specific examples of the macromonomer represented by Formulae (i), (i i) or (i)-2 (Macromonomers (I-1) to (I-23)) are exemplified hereinafter, but the present invention is not limited thereto.

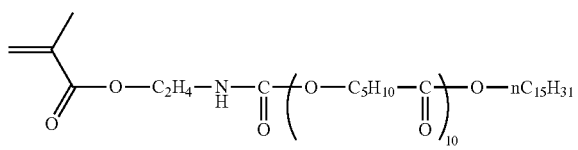
(I-1)

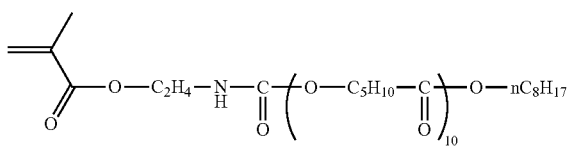
(I-2)

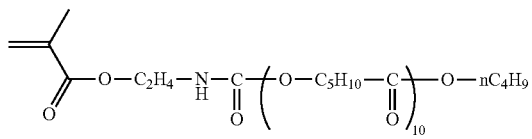
(I-3)

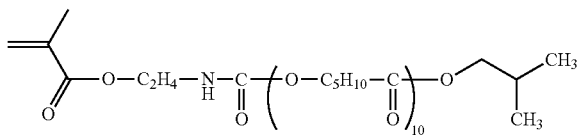
(I-4)

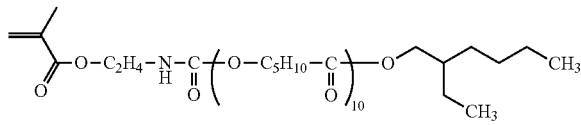
(I-5)

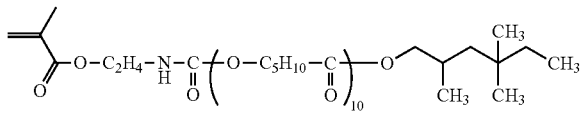
(I-6)

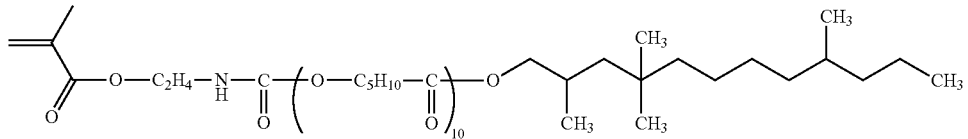
(I-7)

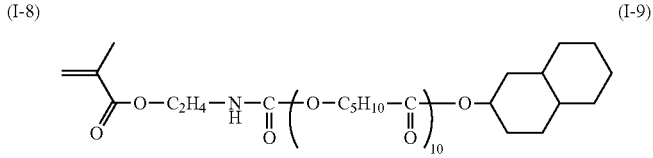
(I-8)

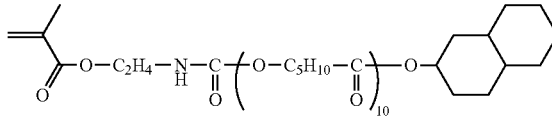
(I-9)

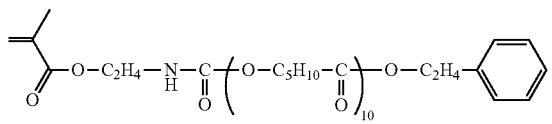
(I-10)

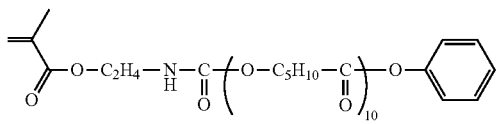
(I-11)

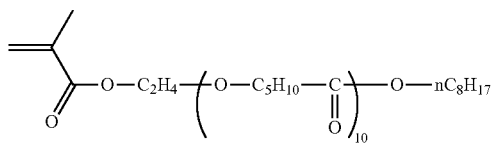
(I-12)

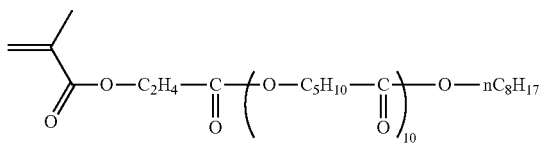
(I-13)

-continued

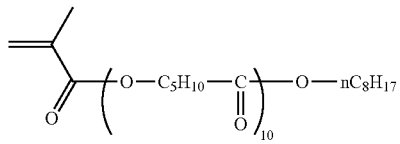 (I-14)

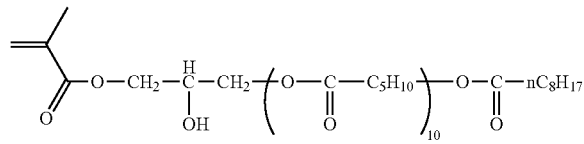 (I-15)

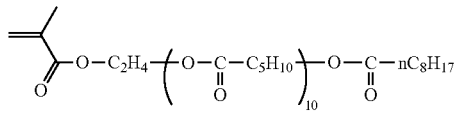 (I-16)

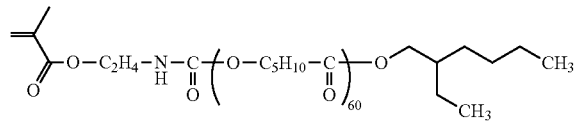 (I-17)

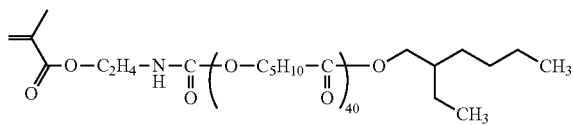 (I-18)

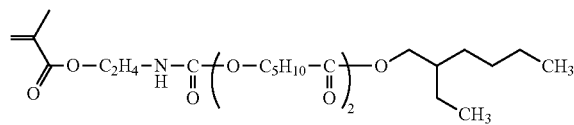 (I-19)

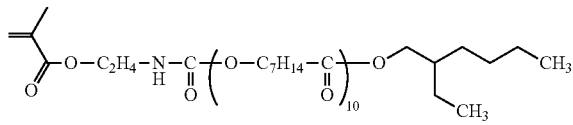 (I-20)

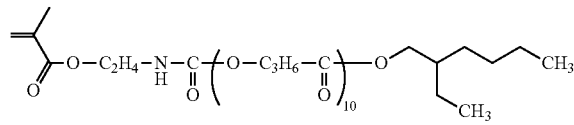 (I-21)

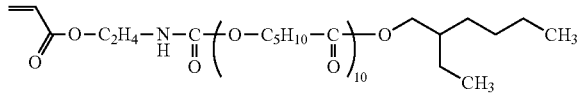 (I-22)

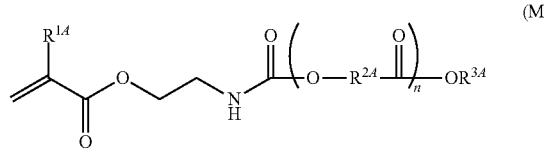 (I-23)

Most preferred macromonomer (b-3) is a polyester macromonomer represented by the following Formula (M).

$$\underset{R^{1A}}{\overset{}{\bigg\Vert}}\!\!-\!O\!-\!C_2H_4\!-\!\underset{H}{N}\!-\!\underset{O}{\overset{O}{\Vert}}\!\!\left(\!O\!-\!R^{2A}\!\underset{O}{\overset{O}{\Vert}}\!\right)_{\!n}\!\!OR^{3A}$$ (M)

In Formula (M), $R^{1A}$ represents a hydrogen atom or a methyl group, $R^{2A}$ represents an alkylene group, $R^{3A}$ represents an alkyl group, and n represents an integer of 5 to 100.

In particular, $R^{2A}$ is preferably a linear or branched alkylene group having 5 to 20 carbon atoms, and most preferably —$(CH_2)_5$—. $R^{3A}$ is preferably a linear or branched alkyl group having 5 to 20 carbon atoms. n is preferably an integer of 5 to 30, and most preferably an integer of 10 to 20.

The macromonomer (b-3) may be used alone or in a combination of two or more.

The specific resin preferably contains 10 to 50% by mass of a repeating unit derived from the monomer (b-1), based on the total mass of the specific resin, more preferably 15 to 45% by mass, and particularly preferably 20 to 40% by mass. When a content of the repeating unit derived from monomer (b-1) is within the above-specified range, dispersibility and dispersion stability of the pigment dispersion, and developability exhibited by the colored curable composition using the pigment dispersion are further improved.

The repeating unit derived from the monomer (b-1) in the specific resin preferably essentially contains an amino group from the viewpoint of dispersibility and dispersion stability.

The repeating unit derived from the monomer (b-1) in the specific resin more preferably contains both the amino group and the nitrogen-containing heterocyclic group from the viewpoint of further improved dispersibility and dispersion stability, and more preferably contains the nitrogen-containing heterocyclic group in the side chain structure of the specific resin.

A content ratio of the amino group and the nitrogen-containing heterocyclic group (amino group: nitrogen-containing heterocyclic group, mass ratio) in the monomer (b-1)-derived repeating unit of the specific resin is preferably in the range of 100:0-5:95, more preferably 100:0-10:90, and particularly preferably 100:0-15:85.

An acid value of the specific resin is preferably in the range of 10 mgKOH/g to 200 mgKOH/g, more preferably 20 mgKOH/g to 150 mgKOH/g, and particularly preferably 40 mgKOH/g to 100 mgKOH/g. When an acid value of the specific resin is within the above-specified range, dispersibility and dispersion stability of the pigment dispersion, and developability exhibited by the colored curable composition using the pigment dispersion are improved. An acid value of the specific resin can be measured by base titration.

The repeating unit derived from the monomer (b-2) is preferably contained in the specific resin such that an acid value of the specific resin is within the above-specified range.

The specific resin preferably contains 15 to 90% by mass of the macromonomer (b-3)-derived repeating unit based on the total mass of the specific resin, more preferably 25 to 80% by mass, and most preferably 35 to 60% by mass. When a content of the macromonomer (b-3)-derived repeating unit is within the above-specified range, dispersibility and dispersion stability of the pigment dispersion, and developability exhibited by the colored curable composition using the pigment dispersion are further improved.

Specific examples of the specific resin include, but are not limited to, resins (J-1) to (J-9), (J-12) to (J-20), etc., exemplified in conjunction with Synthesis Examples, in the Example section which will be illustrated hereinafter.

The specific resin preferably has a weight-average molecular weight from 5,000 to 30,000, in terms of polystyrene conversion value according to a GPC method, more preferably from 7,000 to 25,000, and most preferably from 10,000 to 20,000. When a weight-average molecular weight of the specific resin is within the above-specified range, dispersibility and dispersion stability of the pigment dispersion, and developability exhibited by the colored curable composition using the pigment dispersion are further improved.

A content ratio (b-1:b-2:b-3, mass ratio) of the monomer (b-1)-derived repeating unit, the monomer (b-2)-derived repeating unit, and the macromonomer (b-3)-derived repeating unit in the specific resin is preferably in the range of 10 to 50:2 to 30:30 to 80, more preferably 20 to 50:5 to 20:40 to 70, and particularly preferably 20 to 40:8 to 20:40 to 60.

The specific resin may be a resin exhibiting curability.
In order to improve the curability of the specific resin, a polymerizable group may be additionally introduced. The introduction of a polymerizable group may be carried out, for example, by a known method such as a method of reacting a carboxyl group of the specific resin with (meth)acrylate (for example, glycidyl methacrylate, etc.) containing an epoxy group, or a method of reacting a hydroxyl group of the specific resin with (meth)acrylate containing an isocyanate group or a cyclic acid anhydride containing a polymerizable group.

When the specific resin has polymerizability, a content of the repeating unit having a polymerizable group is preferably within the range of 5 to 50% by mass based on the total mass of the specific resin, and more preferably 10 to 40% by mass.

The specific resin may contain repeating units other than the above-mentioned one, so as to improve solubility in the solvent or coatability. Examples of such a repeating unit include repeating units derived from alkyl(meth)acrylate, cycloalkyl(meth)acrylate, aralkyl(meth)acrylate, (meth) acrylic acid amide, 2-hydroxy ethyl(meth)acrylate, styrene, and the like.

The specific resin is preferably prepared by radical polymerization of monomer (b-1), monomer (b-2), macromonomer (b-3), and, if necessary, optional another monomer, as starting materials. Upon the preparation of the specific resin by radical polymerization, polymerization conditions such as temperature, pressure, the type and amount of radical initiators, and the type of solvents are the same as those of conventional polymerization methods.

The pigment dispersion of the present invention exhibits superior dispersibility and dispersion stability due to the incorporation of a specific resin, and therefore it is possible to contain a pigment at high concentration.

A content of the specific resin in the pigment dispersion of the present invention is preferably in the range of 20 to 80% by mass based on the total mass of the pigment, more preferably 20 to 50% by mass, and particularly preferably 20 to 45% by mass. When a content of the specific resin is within the above-specified range, it is possible to sufficiently achieve a high concentration of the pigment in the pigment dispersion. Accordingly, for example, when a colored curable composition containing the pigment dispersion of the present invention is used for LCDs, the color purity can be improved. Further, when the colored curable composition is used for solid-state image sensing devices, the resolution can be improved due to the realization of a thin film. The specific resin may be used alone or in a combination of two or more thereof.

<(A) Halogenated Zinc Phthalocyanine Pigment>

The pigment dispersion of the present invention contains a halogenated zinc phthalocyanine pigment.

The halogenated zinc phthalocyanine pigment in the present invention is a pigment having a structure where up to 16 chlorine atoms and/or bromine atoms bind per one phthalocyanine molecule (structure). If the number of chlorine atoms and/or bromine atoms bound to the phthalocyanine molecule is increased, the color of the halogenated zinc phthalocyanine pigment turns into green from blue.

In order to ensure that the halogenated zinc phthalocyanine pigment is green, the number of bromine atoms as halogen atoms bound to the phthalocyanine molecule is preferably 8 or higher. Inter alia, the number of bromine atoms of 12 or higher is more preferred because a high-brightness green color having an increased yellow tone is achieved. In terms of a more yellowish green color, a higher content of bromine atoms relative to chlorine atoms is preferable.

Examples of the halogenated zinc phthalocyanine pigment include compounds represented by the following Formula (F).

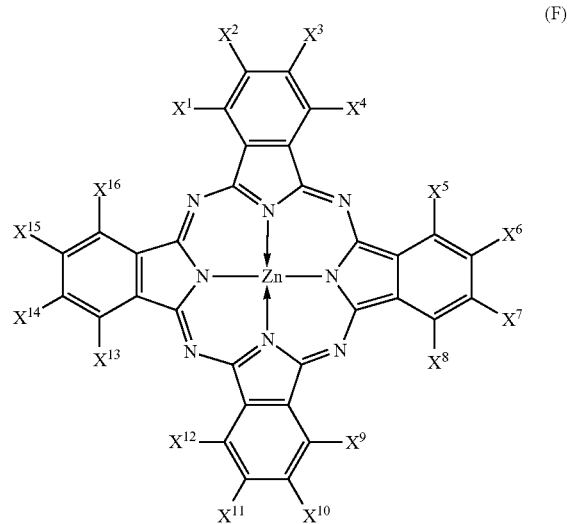

(F)

In Formula (F), $X^1$ to $X^{16}$ each independently represent a chlorine atom, a bromine atom or a hydrogen atom, provided that at least one of $X^1$ to $X^{16}$ is a chlorine atom or a bromine atom.

An average primary particle diameter of the halogenated zinc phthalocyanine pigment is preferably in the range of 5 nm to 100 nm, more preferably 5 nm to 70 nm, more preferably 5 nm to 50 nm, and particularly preferably 5 nm to 40 nm.

By ensuring that an average primary particle diameter of the halogenated zinc phthalocyanine pigment is within the above-specified range, for example, when the pigment dispersion of the present invention is to be contained in a colored curable composition which is used in the formation of a colored region of a color filter, color unevenness is inhibited, and a color filter having good contrast is obtained.

In the present invention, the term "average primary particle diameter" is a value which is obtained by photographing particles within the field of view under a transmission electron microscope, calculating an average value of a long diameter and a short diameter for 100 primary particles of halogenated zinc phthalocyanine pigment constituting an aggregate on the two-dimensional image, and averaging it.

The halogenated zinc phthalocyanine pigment contained in the pigment dispersion of the present invention may be used alone or in a combination of two or more thereof.

A combination embodiment of the halogenated zinc phthalocyanine pigments may be, for example, a combination containing a plurality of polyhalogenated zinc phthalocyanine pigments having a different substitution number of halogen atoms selected from a bromine atom and a chlorine atom in Formula (F) and a specific halogen atom composition in a specific ratio.

A preferred combination embodiment of the halogenated zinc phthalocyanine pigments may be a combination of a halogenated zinc phthalocyanine pigment containing 16 bromine atoms and a halogenated zinc phthalocyanine pigment containing 15 bromine atoms and 1 chlorine atom. In this case, a ratio of two pigments is preferably in the range of 80:20 to 100:0.

An average composition of the halogenated zinc phthalocyanine pigment is calculated from the mass analysis based on mass spectroscopy, and the analysis of a halogen content by flask combustion ion chromatography. Further, mol % of individual halogenated zinc phthalocyanine pigments in the dispersion containing the halogenated zinc phthalocyanine pigments is similarly calculated easily by the interpretation of mass analysis results.

The halogenated zinc phthalocyanine pigment can be prepared, for example, by the method disclosed in JP-A-2007-320986, or JP-A-2008-19383.

There is no particular limitation on the method of preparing halogenated zinc phthalocyanine into a pigment. For example, even though halogenated zinc phthalocyanine before pigment making is dispersed in a dispersion medium and the same time pigment making may be carried out, the crystal growth can be easily inhibited by the solvent treatment, where halogenated metal phthalocyanine is heated and stirred in a large amount of an organic solvent, and it is also preferred to adopt solvent salt milling treatment in terms of obtaining pigment particles having a large specific surface area.

As used herein, the term "solvent salt milling" means that halogenated zinc phthalocyanine immediately after the synthesis thereof or halogenated zinc phthalocyanine (crude pigment) ground and not subjected to pigment making after the synthesis thereof, an inorganic salt, and an organic solvent are kneaded, followed by grinding them.

When the solvent salt milling treatment is carried out, it is preferred to use the latter crude pigment than the former pigment immediately after the synthesis thereof. Specifically, a crude pigment, an inorganic salt, and an organic solvent that does not dissolve the inorganic salt used in the milling process are placed in a kneader, followed by kneading and grinding. As the kneader, for example a kneader or a mix muller may be used.

<Other Pigments>

The pigment dispersion of the present invention may contain a known pigment in addition to the halogenated zinc phthalocyanine pigment.

Such an additional pigment is preferably finer, taking into consideration the fact that a color filter obtained by application of the pigment dispersion of the present invention preferably has high transmissivity. Taking into consideration handleability of the pigment dispersion, the additional pigment preferably has an average primary particle from 5 nm to 100 nm, and more preferably from 5 nm to 50 nm.

Examples of the inorganic pigment used in the pigment dispersion of the present invention include metal compounds represented by metal oxides, metal complexes, and the like. Specifically, exemplified are metal oxides such as oxides of iron, cobalt, aluminum, cadmium, lead, copper, titanium, magnesium, chromium, zinc, and antimony, and composite oxides of these metals.

Examples of the organic pigment that can be used in the pigment dispersion of the present invention include:

C.I. Pigment Yellow 1, 1:1, 2 to 6, 9, 10, 12 to 14, 16, 17, 24, 31, 32, 34, 35, 35:1, 36, 36:1, 37, 37:1, 40 to 43, 48, 53, 55, 61, 62, 62:1, 63, 65, 73 to 75, 81, 83, 87, 93 to 95, 97, 100, 101, 104, 105, 108 to 111, 116, 117, 119, 120, 126, 127, 127:1, 128, 129, 133, 134, 136, 138, 139, 142, 147, 148, 150, 151, 153 to 155, 157 to 170, 172 to 176, 180 to 185, 188 to 191, 191:1, 192 to 200, 202 to 208;

C.I. Pigment Orange 1, 2, 5, 13, 16, 17, 19 to 24, 34, 36, 38, 39, 43, 46, 48, 49, 61, 62, 64, 65, 67 to 75, 77 to 79;

C.I Pigment Red 1 to 9, 12, 14 to 17, 21 to 23, 31, 32, 37, 38, 41, 47, 48, 48:1 to 48:4, 49, 49:1, 49:2, 50:1, 52:1, 52:2, 53, 53:1 to 53:3, 57, 57:1, 57:2, 58:4, 60, 63, 63:1, 63:2, 64, 64:1, 68, 69, 81, 81:1 to 81:4, 83, 88, 90:1, 101, 101:1, 104, 108, 108:1, 109, 112 to 114, 122, 123, 144, 146, 147, 149, 151, 166, 168 to 170, 172 to 179, 181, 184, 185, 187, 188, 190, 193, 194, 200, 202, 206 to 210, 214, 216, 220, 221, 224, 230 to 233, 235 to 239, 242 to 245, 247, 249 to 251, 253 to 260, 262 to 276;

C.I. Pigment Violet 1, 1:1, 2, 2:2, 3, 3:1, 3:3, 5, 5:1, 14 to 16, 19, 23, 25, 27, 29, 31, 32, 37, 39, 42, 44, 47, 49, 50;

C.I Pigment Blue 1, 1:2, 9, 14, 15, 15:1 to 15:4, 15:6, 16, 17, 19, 25, 27 to 29, 33, 35, 36, 56, 56:1, 60, 61, 61:1, 62, 63, 66 to 68, 71 to 76, 78, 79;

C.I. Pigment Green 1, 2, 4, 7, 8, 10, 13 to 15, 17 to 19, 26, 36, 45, 48, 50, 51, 54, 55;

C.I. Pigment Brown 23, 25, 26;

C.I Pigment Black 1, 7;

carbon black, acetylene black, lamp black, bone black, graphite, iron black, aniline black, cyanine black, titanium black, and the like.

In the pigment dispersion of the present invention, another pigment that can be particularly preferably used in a combination with the halogenated zinc phthalocyanine pigment is a yellow pigment. Examples of the yellow pigment include the following pigments.

C.I. Pigment Yellow 11, 24, 108, 109, 110, 138, 139, 150, 151, 154, 155, 167, 180, 185;

When they are used together, a mass ratio of the halogenated zinc phthalocyanine pigment and the yellow pigment is preferably in the range of 100:5 to 100:150, and particularly preferably 100:30 to 100:120.

Further, in the present invention, if necessary, a fine and granulated organic pigment may be used as another pigment. Micronization of the pigment is carried out by grinding (salt milling) of the pigment using a high-viscosity liquid composition together with a pigment, a water-soluble organic solvent, and water-soluble inorganic salts.

These fine and granulated organic pigments may be used in a combination thereof for increasing color purity. Examples of such combination are as follows. A mixture of a red pigment such as an anthraquinone pigment, a perylene pigment or a diketopyrropyrrole pigment with a diazo yellow pigment, an isoindoline yellow pigment or a quinophthalone yellow pigment, or a perylene red pigment, an anthraquinone red pigment or a diketopyrrolopyrrole red pigment. A mixture of a green pigment such as a halogenated phthalocyanine pigment with a disazo yellow pigment, a quinophthalone yellow pigment, an azomethine yellow pigment or an isoindoline yellow pigment. A mixture of a blue pigment such as a phthalocyanine pigment with a dioxazine purple pigment.

Further, when the pigment dispersion of the present invention is applied in the formation of the black matrix, carbon black, graphite, titanium black, iron oxide, titanium oxide may be used alone or as mixtures thereof as suitable additional pigments. A combination of carbon black and titanium black is preferred.

A total content of pigments in the pigment dispersion of the present invention is preferably 30% by mass or higher based on the total solid content of the pigment dispersion, more preferably from 35% by mass to 80% by mass, and more preferably from 40% by mass to 70% by mass.

<(A') Pigment Derivative>

The pigment dispersion of the present invention preferably further contains a pigment derivative.

The pigment derivative is a compound having a structure in which the organic pigment is partially substituted with an acidic group, a basic group or pthalimide methyl group. From the viewpoint of dispersibility and dispersion stability, the pigment derivative preferably contains a pigment derivative having an acidic group or a basic group.

Examples of the organic pigment for constituting the pigment derivative include a diketopyrrolopyrrole pigment, an azo pigment, a phthalocyanine pigment, an anthraquinone pigment, a quinacridone pigment, a dioxazine pigment, a perynone pigment, a perylene pigment, a thio indigo pigment, an isoindoline pigment, an isoindolinone pigment, a quinophthalone pigment, a styrene pigment, a metal complex pigment, and the like.

Further, the acidic group of the pigment derivative is preferably sulfonic acid, carboxylic acid, and a quaternary ammonium salt, more preferably a carboxylic group and a sulfonate group, and particularly preferably a sulfonate group. The basic group of the pigment derivative is preferably an amino group, and particularly preferably a tertiary amino group.

As the pigment derivative, in particular, pigment derivatives of quinoline, imidazolone and isoindoline are preferred. More preferred are quinoline- and imidazolone-based pigment derivatives. In particular, preferred is a pigment derivative having a structure represented by the following Formula (P).

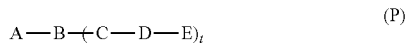

In Formula (P), A represents a partial structure selected from the following Formulae (PA-1) to (PA-3), B represents a single bond, or a (t+1)-valent linking group, C represents a single bond, —NH—, —CONH—, —CO$_2$—, —SO$_2$NH—, —O—, —S— or —SO$_2$—, D represents a single bond, an alkylene group, a cycloan alkylene group or an arylene group, E represents —SO$_3$H, —CO$_2$H or —N(Rpa)(Rpb), Rpa and Rpb each independently represents an alkyl group, a cycloalkyl group or an aryl group, Rpa and Rpb may form a ring, and t represents an integer of 1 to 5.

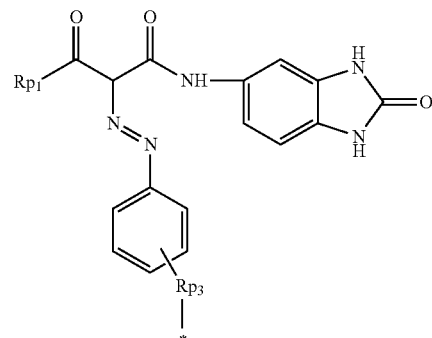

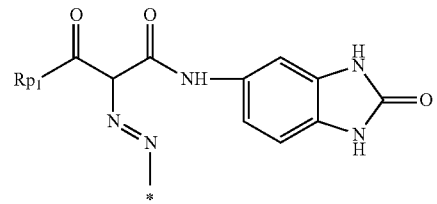

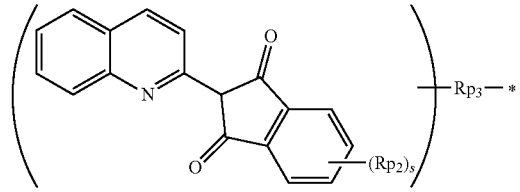

In Formulae (PA-1) and (PA-2), Rp1 represents an alkyl group or aryl group having 1 to 5 carbon atoms. In Formula (PA-3), Rp2 represents a hydrogen atom, a halogen atom, an alkyl group, or a hydroxyl group, and s represents an integer of 1 to 4. In Formula (PA-1) and Formula (PA-3), Rp3 represents a single bond, —NH—, —CONH—, —SO$_2$NH—, —O—, —S— or —SO$_2$—, and * represents a linking portion with B.

In Formula (P), Rp1 is particularly preferably a methyl group or a phenyl group, and most preferably a methyl group. In Formula (PA-3), Rp2 is preferably a hydrogen atom or a halogen atom, and most preferably a hydrogen atom or a chlorine atom.

In Formula (P), examples of the linking group of a (t+1) value represented by B include an alkylene group, a cycloan alkylene group, an arylene group and a hetero arylene group. Among these, particularly preferred is a linking group represented by the following structural formulae (PA-4) to (PA-9).

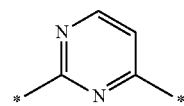

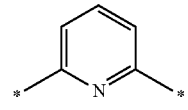

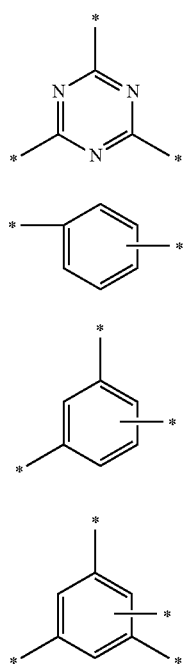

(PA-6)

(PA-7)

(PA-8)

(PA-9)

Among the structural formulae (PA-4) to (PA-9), particularly a pigment derivative having a linking group represented by structural formula (PA-5) or (PA-8) as B is preferred due to excellent dispersibility.

In Formula (P), examples of the alkylene group, the cycloalkylene group and the arylene group represented by D include methylene, ethylene, propylene, butylene, pentylene, hexylene, decylene, cyclopropylene, cyclobutylene, cyclopentylene, cyclohexylene, cyclooctylene, cyclodecylene, phenylene, naphthylene, and the like. Among these, an alkylene group is particularly preferred as D, and alkylene having 1 to 5 carbon atoms is most preferred.

In Formula (P), when E represents —N(Rpa)(Rpb), examples of the alkyl group, the cycloalkyl group and the aryl group in the Rpa and Rpb include methyl, ethyl, propyl, isopropyl, butyl, sec-butyl, tert-butyl, pentyl, isopentyl, neopentyl, hexyl, octyl, decyl, cyclopropyl, cyclobutyl, cyclopentyl, cyclohexyl, cyclooctyl, cyclodecyl, phenyl, naphthyl, and the like. As the Rpa and Rpb, an alkyl group is particularly preferred, and an alkyl group having 1 to 5 carbon atoms is most preferred. The t is preferably 1 or 2.

Specific examples of the pigment derivative are exemplified hereinunder, but the present invention is not limited thereto.

(A1)

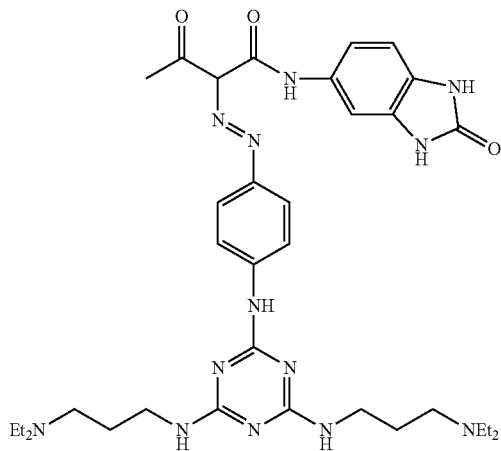

(A2)

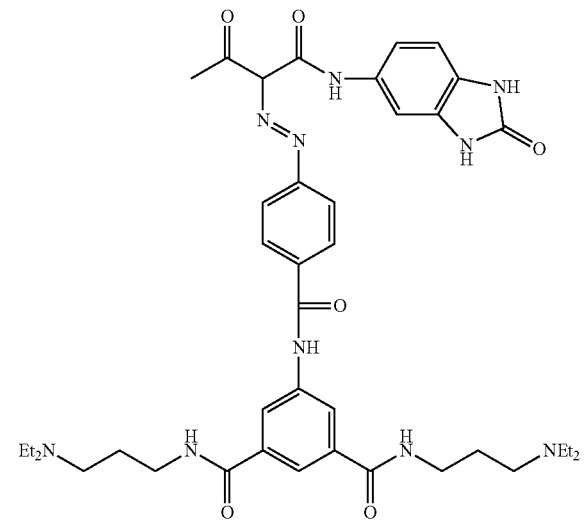

(A3)

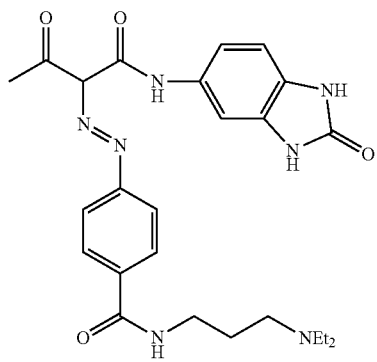

(A4)

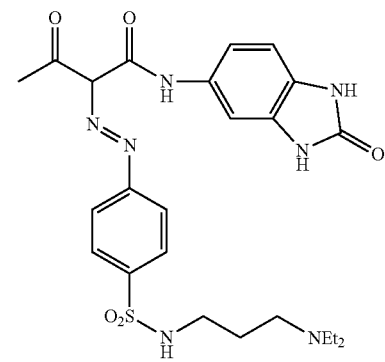

-continued
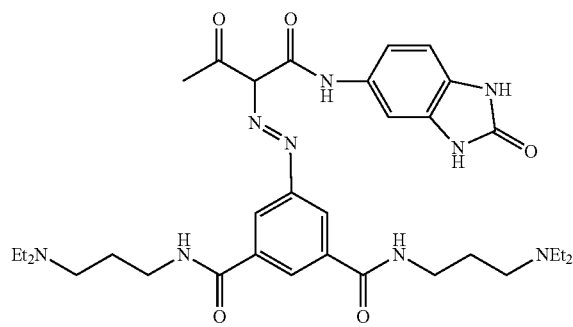
(A5)
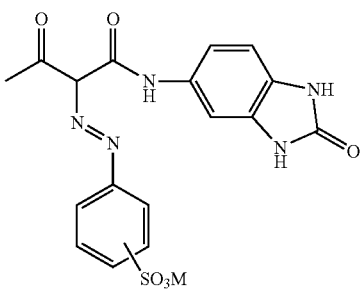
(A6)
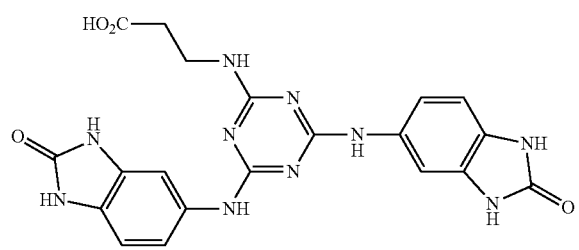
(A-7)
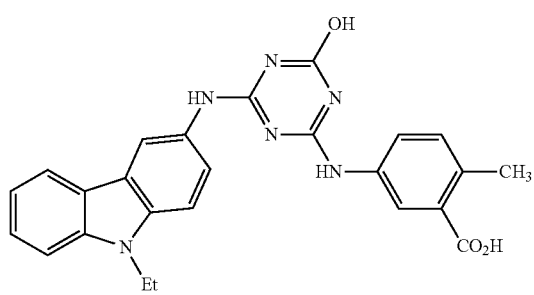
(A-8)
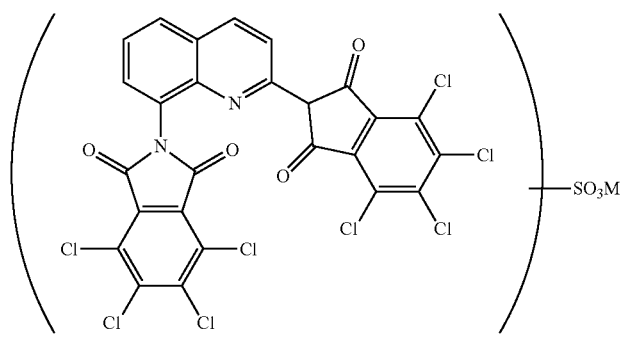
(A-9)
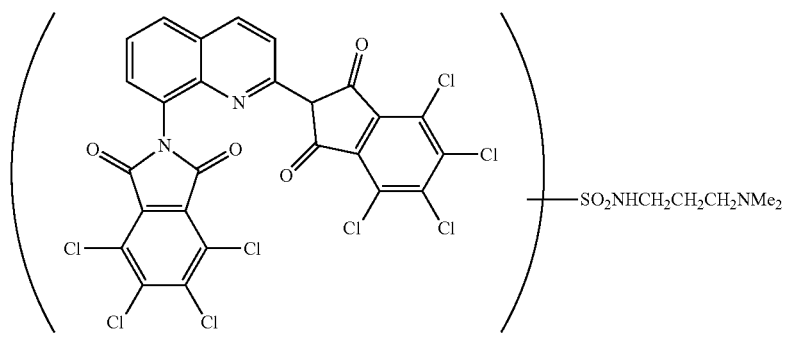
(A-10)
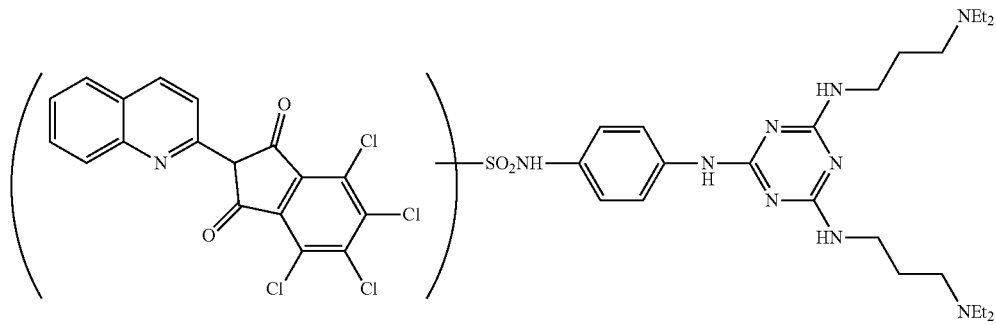
(A-11)

-continued
(A-12)
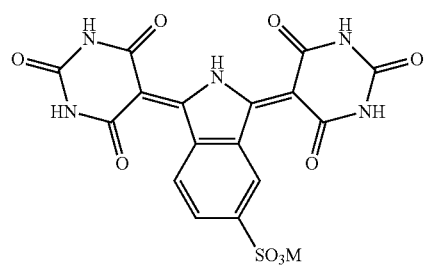
(A-13)
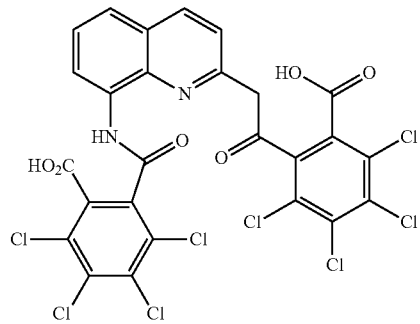
(A-14)
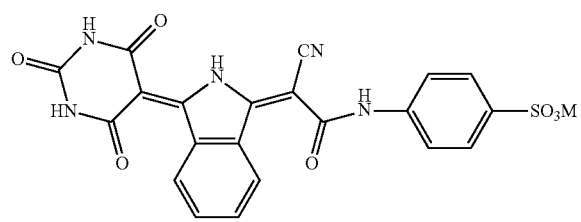
(A-15)
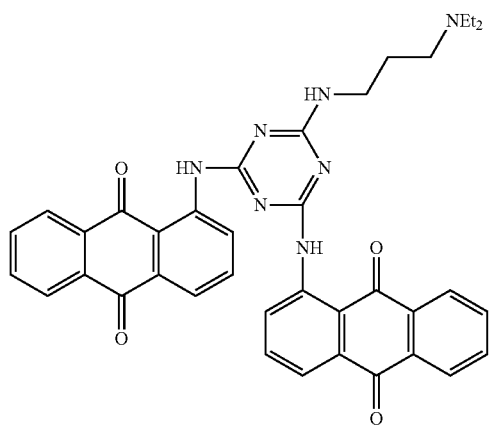
(A-16)
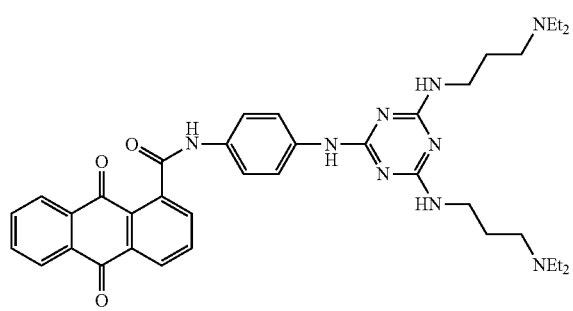
(A-17)
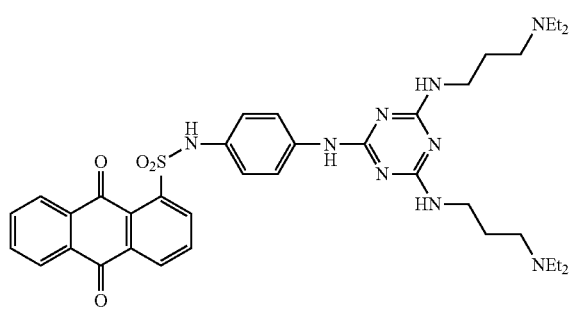
(A-18)
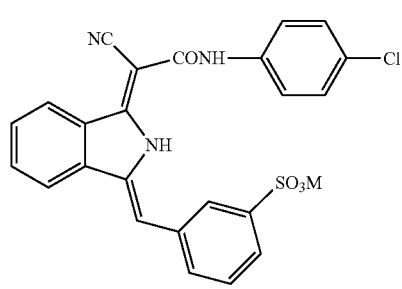

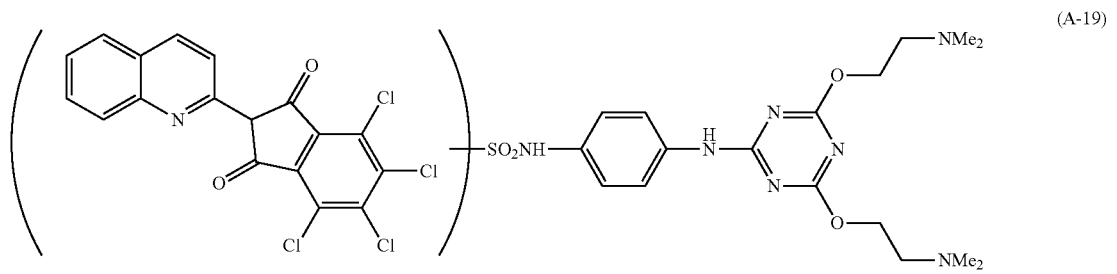
(A-19)
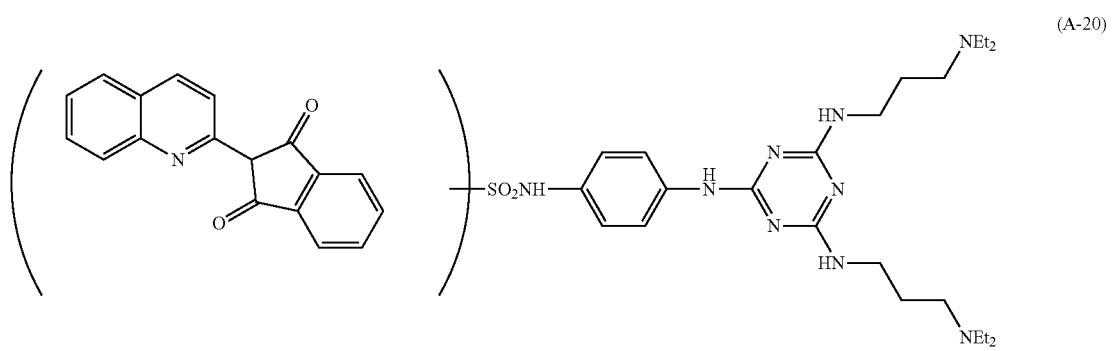
(A-20)
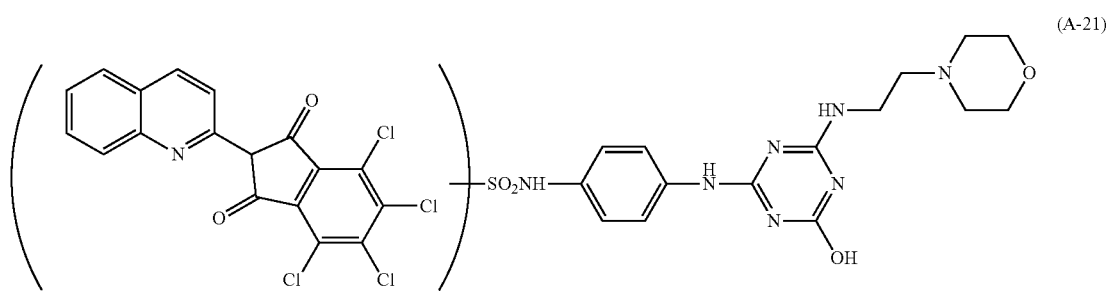
(A-21)
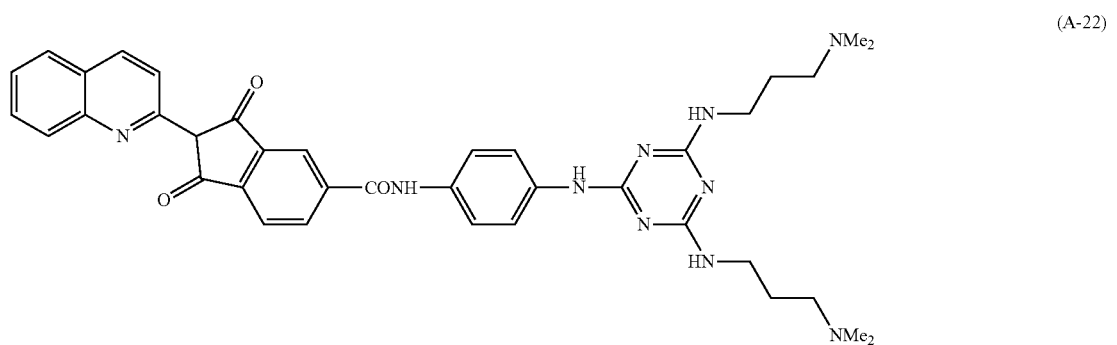
(A-22)

-continued
(A-23)
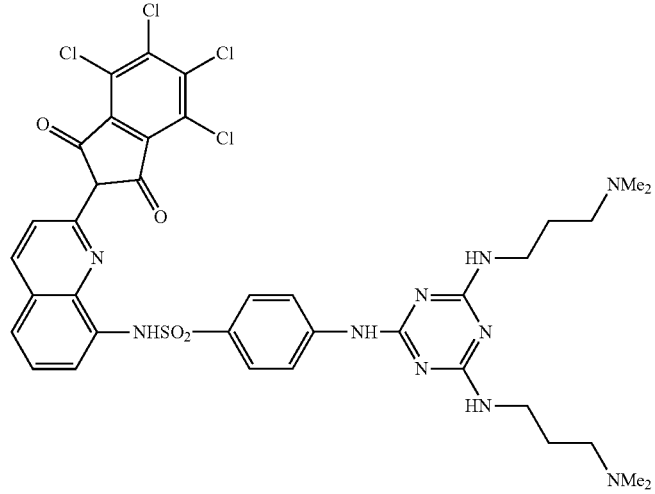
(A-24)
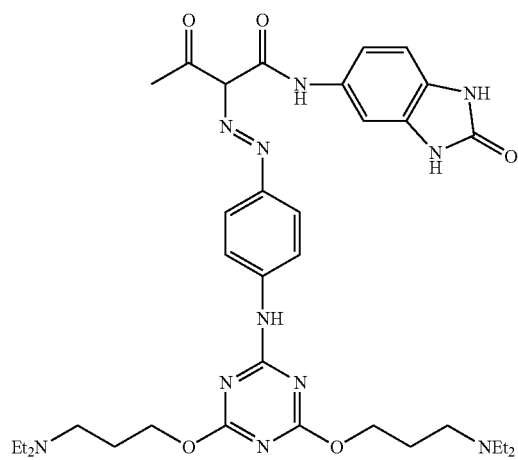
(A-25)
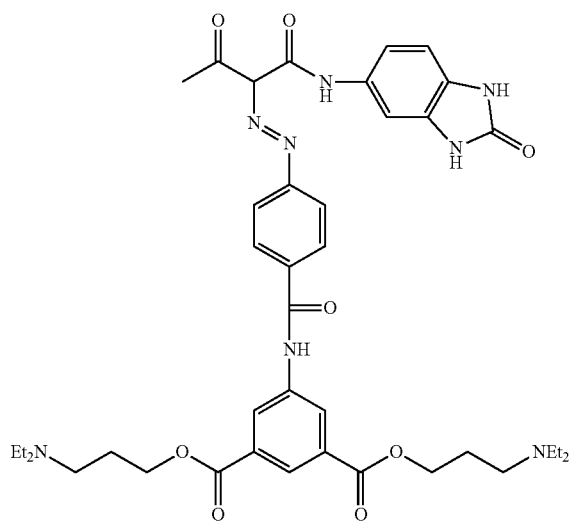
(A-26)
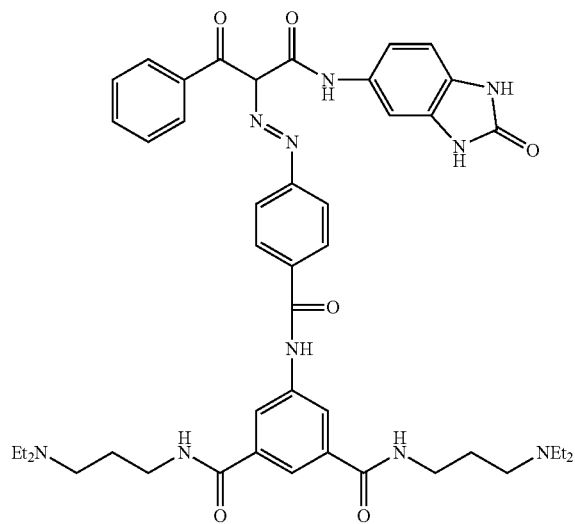
(A-27)
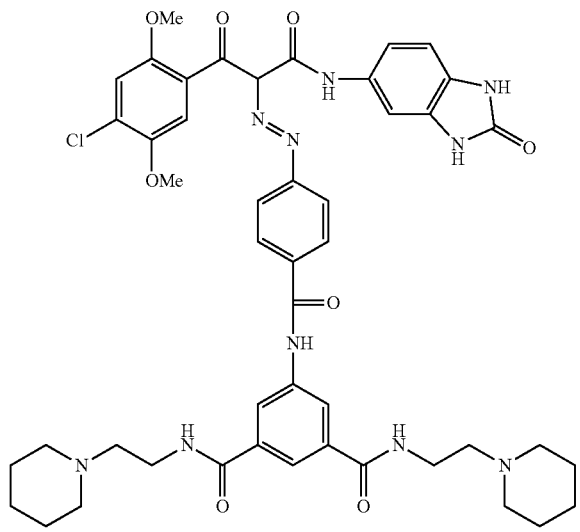

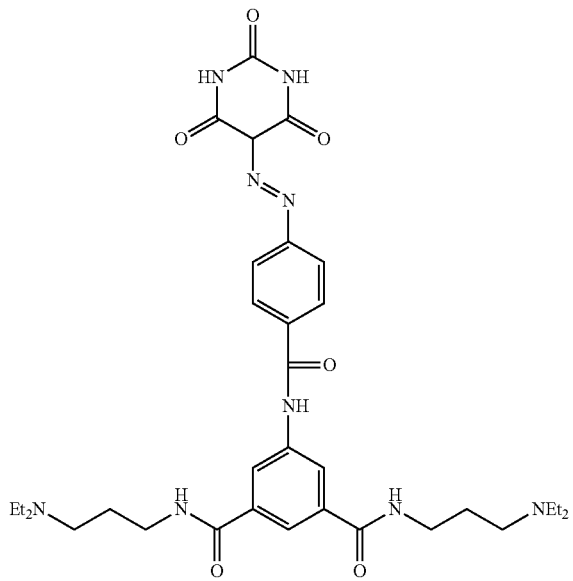
(A-28)

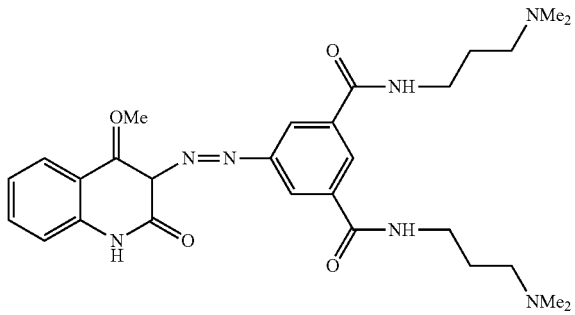
(A-29)

Among the pigment derivatives, preferred are (A-1), (A-2), (A-5), (A-9), (A-10), (A-11), (A-19), (A-20), (A-21), (A-22), (A-23), (A-24) and (A-25), and more preferred are (A-1), (A-2), (A-9), (A-10) and (A-23).

A content of the pigment derivative in the pigment dispersion of the present invention is preferably in the range of 1 to 50% by mass based on the total mass of the pigment, and more preferably 3 to 30% by mass. Pigment derivatives may be used alone or in a combination of two or more thereof.

<Solvent>

The pigment dispersion of the present invention contains a solvent.

The solvent is selected depending on the solubility of individual components contained in the pigment dispersion, or the coatability of the pigment dispersion when it is applied to a curable composition. As the solvent, there are used esters, ethers, ketones, and aromatic hydrocarbons. Among these, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, diethylene glycol monoethyl ether acetate, diethylene glycol monobutyl ether acetate, propylene glycol methyl ether, propylene glycol monomethyl ether acetate (PGMEA) and the like are preferred.

A content of the solvent in the pigment dispersion of the present invention is preferably in the range of 50 to 95% by mass, and more preferably 70 to 90% by mass.

<Other Polymer Materials>

The pigment dispersion of the present invention may contain other polymer materials in addition to the above-described components, from the viewpoint of improving the dispersion stability, controlling of the developability upon application of the pigment dispersion to a curable composition, and the like.

Examples of other polymer materials include polyamidoamine and salts thereof, polycarboxylic acid and salts thereof, high molecular weight unsaturated acid esters, modified polyurethane, modified polyesters, modified poly(meth)acrylate, (meth)acrylic copolymers (in particular, a (meth)acrylic copolymer containing a carboxylic group and a polymerizable group in the side chain is preferred), a naphthalene sulfonic acid-formalin condensate, and the like. These polymer materials operate by adsorbing onto the surface of the pigment and preventing re-aggregation. Thus, a terminal-modified polymer having an anchor site to the pigment surface, a graft type polymer and a block type polymer may be mentioned as preferred structures. For example, mention may be made of a graft copolymer containing a monomer having a heterocyclic ring and a polymerizable oligomer having an ethylenically unsaturated bond as copolymer units.

Further, examples of other polymer materials include polyamide amine phosphoric acid salt, high molecular weight unsaturated polycarboxylic acid, polyetherester, aromatic sulfonic acid-formalin polycondensates, polyoxyethylene nonyl phenyl ether, polyester amine, polyoxyethylene sorbitan monooleate, polyoxyethylene monostearate, and the like.

These polymer materials may be used alone or in a combination of two or more thereof.

A content of other polymer materials in the pigment dispersion of the present invention is preferably in the range of 20 to 80% by mass relative to the pigment, more preferably 30 to 70% by mass, and even more preferably 40 to 60% by mass.

There is no particular limitation on the preparation method of the pigment dispersion of the present invention. For example, the dispersion of a pigment can be carried out by mixing and dispersing the pigment and the dispersant with a homogenizer in advance and then finely dispersing the resulting dispersion with zirconia beads in a beads dispersing machine (for example, Disper Mat manufactured by GETZMANN). The dispersing time is preferably from about 3 hours to about 6 hours.

The pigment dispersion of the present invention is preferable for colored curable compositions for manufacturing of color filters, printing ink, ink jet ink, paints, and the like.

[Colored Curable Composition]

The colored curable composition of the present invention is a colored curable composition containing the pigment dispersion of the present invention, (C) a photopolymerizable compound, and (D) a photopolymerization initiator.

Due to the above-described configuration, the colored curable composition of the present invention exhibits excellent dispersibility and dispersion stability of a pigment even when the dispersion contains a high concentration of the pigment, and good developability upon the formation of a cured film and good light resistance of the thus formed cured film.

<(C) Photopolymerizable Compound>

The polymerizable monomer is preferably compounds having a boiling point of 100° C. or higher at a normal pressure and having at least one addition-polymerizable ethylenically unsaturated group. The above-mentioned ethylenically unsaturated group is particularly preferably (meth)acryloyl. Among them, more preferred is a tetra-functional or higher acrylate compound.

Examples of the compound having a boiling point of 100° C. or higher at a normal pressure and having at least one addition-polymerizable ethylenically unsaturated group include mono-functional acrylates and methacrylates such as polyethylene glycol mono(meth)acrylate, polypropylene glycol mono(meth)acrylate, and phenoxyethyl(meth)acrylate; poly-functional acrylates and methacrylates such as polyethylene glycol di(meth)acrylate, trimethylolethane tri(meth)acrylate, neopentylglycol di(meth)acrylate, pentaerythritol tri(meth)acrylate, pentaerythritol tetra(meth)acrylate, dipentaerythritol penta(meth)acrylate, dipentaerythritol hexa(m-etharylate, hexanediol (meth)acrylate, trimethylolpropane tri(acryloyloxypropyl)ether, tri(acryloyloxyethyl) isocyanurate, monomers obtained by adding ethylene oxide and propylene oxide to polyfunctional alcohols such as glycerin and trimethylolethane and successively (meth)acrylating the addition compounds, poly(meth)acrylating products of pentaerythritol or dipentaerythritol, urethane acrylates described in JP-B Nos. Sho 48-41708 and Sho 50-6034 and JP-A-51-37193, polyester acrylates described in JP-A-48-64183 and JP-B Nos. Sho 49-43191 and Sho 52-30490, and epoxy acrylates which are reaction products of epoxy resins and (meth)acrylic acids; and their mixtures.

Further, examples of the photopolymerizable compound include photocurable monomers and oligomers introduced in Journal of Japan Adhesive Society (Adhesion Society of Japan) Vol. 20, No. 7, pp. 300-308.

Further, the specific examples of Formulae (1) and (2) in JP-A-10-62986, and the described compounds therein obtained by (meth)acrylation after adding ethylene oxide and propylene oxide in a polyfunctional alcohol, can also be used as the photopolymerizable compound.

Among them, the photopolymerizable compound is preferably a compound having a structure where dipentaerythritol penta(meth)acrylate, dipentaerythritol hexa(meth)acrylate, and their acryloyl groups have an ethylene glycol or propylene glycol residue. An oligomer type thereof can also be used as the photopolymerizable compound.

Further, preferred examples of the photopolymerizable compound also include urethane acrylates, such as those described in Japanese Patent Publication (JP-B) No. 48-41708, JP-A-51-37193, JP-A-2-32293, JP-A-2-16765, and urethane compounds which have an ethylene oxide skeleton, as described in JP-B-No. 58-49860, JP-B-No. 56-17654, JP-B-No. 62-39417, and JP-B-No. 62-39418.

Further, colored curable compositions with extremely excellent sensitization speed, depending on use, may be obtained by using the addition polymerizable compounds having an amino structure and a sulfide structure within their molecules, as described in JP-A-63-277653, JP-A-63-260909, and JP-A-1-105238, as the photopolymerizable compound. Examples of commercial products thereof include urethane oligomers UAS-10, UAB-140 (manufactured by Sanyo-Kokusaku Pulp Co., Ltd.), UA-7200 (manufactured by Shin Nakamura Chemical Co., Ltd.), DPHA-40H (manufactured by Nippon Kayaku Co., Ltd.), UA-306H, UA-306T, UA-3061, AH-600, T-600, AI-600 (manufactured by Kyoeisha Co., Ltd.), and the like.

Further, as the photopolymerizable compound, ethylenically unsaturated compounds having an acidic group are also preferred, with commercial products thereof including TO-756, which is a carboxyl group-containing 3-functional acrylate, and TO-1382, which is a carboxyl group-containing 5-functional acrylate (manufactured by Toagosei, Co., Ltd.), and the like.

The photopolymerizable compound may be used alone or in a combination of two or more thereof.

A content of the photopolymerizable compound is preferably in the range of 3 to 55 parts by mass, with respect to total solid content of 100 parts by mass of the colored curable composition, and more preferably 10 to 50 parts by mass. When a content of the photopolymerizable compound is within the above-specified range, sufficient curing reaction can be carried out.

<(D) Photopolymerization Initiator>

The colored curable composition of the present invention contains a photopolymerization initiator for the purpose of improving the sensitivity and pattern formability.

The photopolymerization initiator in the present invention is a compound that is degraded by light to initiate and promote the polymerization of the polymerizable component in the present invention, and preferably has absorption in a wavelength region of 300 nm to 500 nm. The photopolymerization initiators may be used alone or in a combination of two or more of them.

Preferred examples of the photopolymerization initiator include acetophenone compounds, ketal compounds, benzophenone compounds, benzoin compounds, benzoyl compounds, xanthone compounds, activated halogenated compound compounds, acridine compounds, biimidazole compounds, and oxime ester compounds. For example, mention may be made of activated halogen compounds such as halomethyl oxadiazole described in JP-A-57-6096, and halomethyl-s-triazine described in JP-B-59-1281 and JP-A-53-133428, aromatic carbonyl compounds such as ketal, acetal, or benzoin alkyl esters described in the specifications of U.S. Pat. No. 4,318,791 and EP-A No. 88050, aromatic ketone compounds such as benzophenones described in the specification of U.S. Pat. No. 4,199,420, (thio)xanthone or acridine compounds described in the specification of FR Patent No. 2456741, coumarin or biimidazole compounds described in JP-A-10-62986, organic boron-sulfonium complexes described in JP-A-8-015521, and the like.

Specific examples of the compound that can be used as the photopolymerization initiator include the following compounds.

Examples of the acetophenone compound include 2,2-diethoxyacetophenone, p-dimethylamino acetophenone, 2-hydroxy-2-methyl-1-phenyl-propan-1-one, p-dimethylamino acetophenone, 4'-isopropyl-2-hydroxy-2-methyl-propiophenone, 1-hydroxy-cyclohexyl phenyl ketone, 2-benzyl-2-dimethylamino-1-(4-morpholinophenyl)-butanone-1,2-tolyl-2-dimethylamino-1-(4-morpholinophenyl)-butanone-1,2-methyl-1-[4-(methylthio)phenyl]-2-morpholino-propanone-1, and the like.

Examples of the ketal compound include benzyl dimethyl ketal, benzyl-β-methoxy ethyl acetal, and the like.

Examples of the benzophenone compound include benzophenone, 4,4'-(bisdimethylamino) benzophenone, 4,4'-(bisdiethylamino) benzophenone, 4,4'-dichloro benzophenone, and the like.

Examples of the benzoyl compound include benzoin isopropyl ether, benzoin isobutyl ether, benzoin methyl ether, methyl-o-benzoyl benzoate, and the like.

Examples of the xanthone compound include diethylthioxanthone, diisopropylthioxantone, mono isopropyl thioxantone, chlorothioxantone, and the like.

Examples of the acridine compound include 9-phenylacridine, 1,7-bis(9-acridinyl)heptane, and the like.

Preferred examples of the biimidazole compound include hexaaryl biimidazole compounds such as 2-(o-chlorophenyl)-4,5-diphenyl imidazolyl dimer, 2-(o-methoxyphenyl)-4,5-diphenyl imidazolyl dimer, and 2-(2,4-dimethoxyphenyl)-4,5-diphenyl imidazolyl dimer.

Preferred examples of activated halogen compounds (triazine compounds, oxadiazole compounds, coumarin compounds) include 2,4-bis(trichloromethyl)-6-p-methoxyphenyl-s-triazine, 2,4-bis(trichloromethyl)-6-p-methoxy styryl-s-triazine, 2,4-bis(trichloromethyl)-6-(1-p-dimethylaminophenyl)-1,3-butadienyl-s-tri-azine, 2,4-bis(trichloromethyl)-6-biphenyl-s-triazine, 2,4-bis(trichloromethyl)-6-(p-methylbiphenyl)-s-triazine, p-hydroxyethoxystyryl-2,6-di(trichloromethyl)-s-triazine, methoxystyryl 2,6-di(trichloromethyl)-s-triazine, 3,4-dimethoxystyryl-2,6-di(trichloromethyl)-s-triazine, 4-benzoxolane-2,6-di(trichloromethyl)-s-triazine, 4-(o-bromo-p-N,N-(diethoxy carbonylamino)-phenyl)-2,6-di(chloromethyl)-s-triazine, 4-(p-N,N-(diethoxycarbonylamino)-phenyl)-2,6-di(chloromethyl)-5-triazine, 2-trichloromethyl-5-styryl-1,3,4-oxadiazole, 2-trichloromethyl-5-(cyanostyryl)-1,3,4-oxadiazole, 2-trichloromethyl-5-(naphth-1-yl)-1,3,4-oxadiazole, 2-trichloromethyl-5-(4-styryl)styryl-1,3,4-oxadiazole, 3-methyl-5-amino-((s-triazin-2-yl)amino)-3-phenylcoumarin, 3-chloro-5-diethylamino-((s-triazin-2-yl)amino)-3-phenylcoumarin, 3-butyl-5-dimethylamino-((s-triazin-2-yl)amino)-3-phenylcoumarin, and the like.

Examples of the oxime compound include the compounds described in J. C. S. Perkin II (1979) 1653-1660, J. C. S. Perkin II (1979) 156-162, Journal of Photopolymer Science and Technology (1995) 202-232 and in JP-A-2000-66385; the compounds described in JP-A-2000-80068 and Japanese Patent Application National Publication (Laid-Open) No. 2004-534797; and the like.

Other examples of the photopolymerization initiator in addition to the above include 1-phenyl-1,2-propanedione-2-(o-ethoxycarbonyl)oxime, O-benzoyl-4'-(benzmercapto) benzoyl-hexyl-ketoxime, 2,4,6-trimethyl phenylcarbonyl diphenylphosphonyl oxide, salts of hexafluoro-phosphorotrialkylphenylphosphonium, and the like.

Further, examples of the photopolymerization initiator include vicinal polyketolaldonyl compounds, as described in the specification of U.S. Pat. No. 2,367,660; α-carbonyl compounds, as described in the specification of U.S. Pat. Nos. 2,367,661 and 2,367,670; acyloin ethers, as described in the specification of U.S. Pat. No. 2,448,828; aromatic acyloin compounds substituted with an α-hydrocarbon, as described in the specification of U.S. Pat. No. 2,722,512; polynuclear quinone compounds, as described in the specification of U.S. Pat. Nos. 3,046,127 and 2,951,758; combinations of triarylimidazole dimer/p-aminophenyl ketone, as described in the specification of U.S. Pat. No. 3,549,367; benzothiazole compound/trihalomethyl-s-triazine compound, as described in JP-B No. 51-48516; oxime ester compounds, as described in J. C. S. Perkin II (1979) 1653-1660, J. C. S. Perkin II (1979) 156-162, Journal of Photopolymer Science and Technology (1995) 202-232, and in JP-A-2000-66385; and the like. These photopolymerization initiators can also be used in a combinations thereof.

Even though the above-mentioned initiators may be optionally used as the photopolymerization initiator to be used in the present invention, from the viewpoint of exposure sensitivity, preferred are triazine compounds of organic halogen compounds, ketal compounds, benzoin compounds, metallocene compounds, hexaaryl biimidazole compounds, oxime compounds, acyl phosphine (oxide) compounds, and hexaalkylamino compounds, and triazine compound, more preferred is at least one compound selected from the group consisting of oxime compounds, hexaaryl biimidazole compounds, and alkylamino compounds, even more preferred is at least one compound selected from the group consisting of oxime compounds, hexaaryl biimidazole compounds, and triazine compounds, and most preferred is an oxime compound.

In particular, when the colored curable composition of the present invention is used in the formation of colored pixels in a color filter of a solid-state image sensing device, in the composition formula, a pigment concentration in the composition increases, and correspondingly an amount of the photopolymerization initiator to be used decreases, thus resulting in deterioration of the sensitivity. Further, when exposure is carried out using a stepper, the use of an initiator, such as triazine compound, generating a halogen-containing compound upon performing the exposure, contributes to the corrosion of equipment, thus making it difficult to use such equipment. Taking into consideration these problems, an oxime compound is preferable as a photopolymerization initiator satisfying the sensitivity and various performances. In particular, most preferred is an oxime compound which has absorption in a wavelength of 365 nm.

In the present invention, among the oxime ester compounds, preferred is a compound represented by the following Formula (a), from the viewpoint of sensitivity, stability over time, and coloring upon post-heating. Further, preferred are also IRGACURE OXE-01, OXE-02, and the like (manufactured by Ciba Specialty Chemicals).

(a)

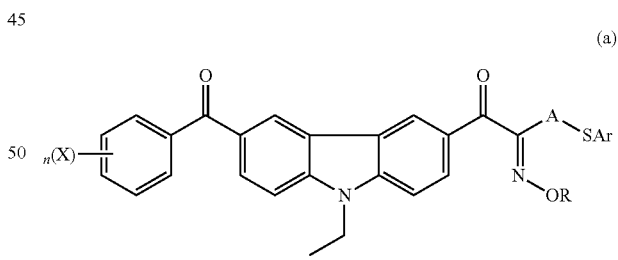

In Formula (a), R and X each independently represent a monovalent substituent, A represents a divalent organic group, Ar represents an aryl group, and n represents an integer of 1 to 5.

As R, an acyl group is preferred from the viewpoint of high sensitization. Specifically, preferred is an acetyl group, a propionyl group, a benzoyl group, or a tolyl group.

As A, an unsubstituted alkylene group, an alkylene group substituted with an alkyl group (for example, a methyl group, an ethyl group, a tert-butyl group, or a dodecyl group), an alkylene group substituted with an alkenyl group (for example, a vinyl group, or an allyl group), and an alkylene group substituted with an aryl group (for example, a phenyl group, a p-tolyl group, a xylyl group, a cumenyl group, a naphthyl group, an anthryl group, a phenanthryl group, or a styryl group) are preferred from the viewpoint of increasing the sensitivity and inhibiting the coloration due to heat-induced temporal changes.

As Ar, a substituted or unsubstituted phenyl group is preferred from the viewpoint of increasing the sensitivity and inhibiting the coloration due to heat-induced temporal changes. When Ar is a substituted phenyl group, the substituent thereof is preferably a halogen group such as a fluorine atom, a chlorine atom, a bromine atom, or an iodine atom.

As X, preferred is an alkyl group which may be substituted, an aryl group which may be substituted, an alkenyl group which may be substituted, an alkynyl group which may be substituted, an alkoxy group which may be substituted, an aryloxy group which may be substituted, an alkyl thioxy group which may be substituted, an alkylthioxy group which may be substituted, or an amino group which may be substituted, from the viewpoint of improving the solvent solubility and absorption efficiency of a long wavelength region. Further, n in Formula (a) is preferably an integer of 1 to 2.

Specific examples of the oxime ester compound suitable for the colored curable composition of the present invention are illustrated hereinafter, but the present invention is not limited thereto.

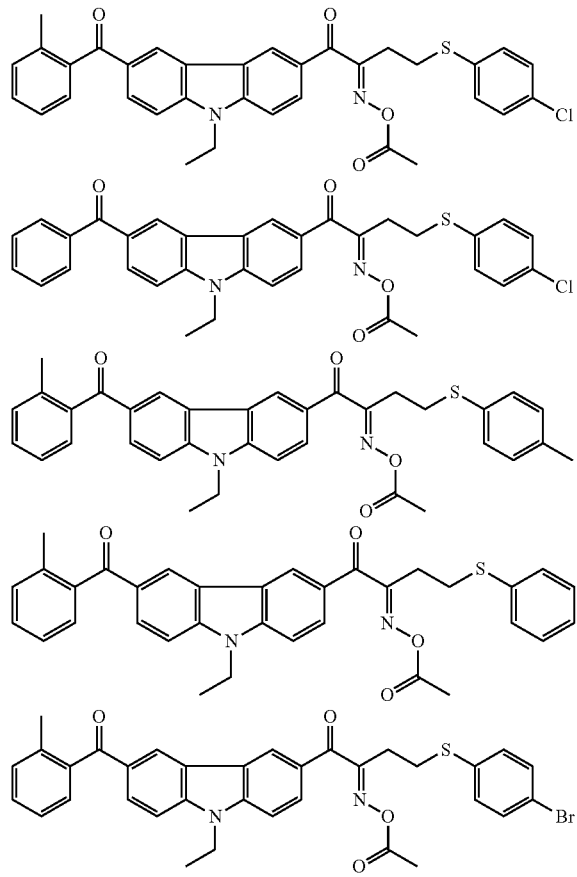

The photopolymerization initiators may be used alone or in a combination of two or more thereof. A content of the photopolymerization initiator is preferably in the range of 0.1% by mass to 50% by mass based on the total solid content of the colored curable composition of the present invention, more preferably 0.5% by mass to 30% by mass, and particularly preferably 1% by mass to 20% by mass. Within this range, good sensitivity can be obtained. Further, when the colored curable composition is used in the formation of colored region in a color filter, good pattern formability can be obtained.

<Sensitizing Agent>

The colored curable composition of the present invention may contain a sensitizing agent for the purpose of improvement in generating efficiency of the initiator and achievement of a long wavelength of the sensitizing wavelength. As the sensitizing agent to be used in the invention, those having the absorption wavelength in the wavelength region of 300 nm to 450 nm are presented.

Examples of the sensitizing agent include polynucleic aromatic groups (such as phenanthrene, anthracene, pyrene, perylene, triphenylene, and 9,10-dialkoxyanthracene), xantenes (such as fluorescein, eosin, erythrosine, Rhodamine B, and Rose bengal), thioxantones, cyanines, phthalocyanines, thiazines (such as thionine, methylene blue, and toluidine blue), acrydines, anthraquinones, squariums, coumarines, phenothiadines, phenadines, styrylbenzenes, azo compounds, diphenyl methane, triphenylmethane, distyrylbenzenes, carbazols, porphiline, Spiro compounds, quinacridones, indigo, styryl, pyrylium compounds, pyromethene compounds, pyrazolotriazole compounds, benzothiazole compounds, barbituric acid derivatives, acetophenone, benzophenone, aromatic ketone compounds such as Michler's ketone, heterocyclic compounds such as N-aryl oxazolidinone, and the like.

<Chain Transfer Agent>

Depending on the type of photopolymerization initiators to be used, a chain transfer agent is preferably added to the colored curable composition of the present invention. Examples of the chain transfer agent include alkyl esters of N,N-dialkylamino benozoic acid or thiol compounds such as 2-mercaptobenzothiazole, 2-mercapto-1-phenyl benzimidazole group, and 3-mercaptopropionic acid. The chain transfer agent may be used alone or in a combination of two or more thereof.

<Alkali Soluble Resin>

The colored curable composition of the present invention preferably further contains an alkali soluble resin. Incorporation of the alkali soluble resin improves the developability and the pattern formability.

The alkali soluble resin is a linear organic polymer, and may be suitably selected from an alkali soluble resin having at least one group within the molecule (preferably a molecule with an acrylic copolymer or a styrene copolymer as a main chain) promoting alkali solubility (such as a carboxyl group, a phosphoric acid group, or a sulfonic acid group). Among these, resins which are soluble in an organic solvent and developable by a weak alkali aqueous solution are more preferable.

A known radical polymerization method is, for example, applicable for production of the alkali soluble resin. Polymerization conditions during manufacturing the alkali soluble resin with a radical polymerization method, such as the temperature, pressure, type of radical initiator and amount thereof, type of solvent, and the like are easily determined by a person skilled in the art, and the conditions can be derived experimentally.

The linear organic polymer used as the alkali soluble resin is preferably a polymer having carboxylic acid at the side chain, and examples thereof include a methacrylic acid copolymer, an acrylic acid copolymer, an itaconic acid copolymer, a crotonic acid copolymer, a maleic acid copolymer, a partially esterified maleic acid copolymer, and the like, and acidic cellulose derivatives having carboxylic acid at a side chain thereof, polymers obtained by adding an acid anhydride to a hydroxyl group-containing polymer. In particular, a copolymer of (meth) acrylic acid and other monomers copolymerizable therewith is suitable as the alkali soluble resin.

Examples of other monomers copolymerizable with (meth)acrylic acid include alkyl(meth)acrylates, aryl(meth)acrylates, vinyl compounds, and the like. Specific examples of the alkyl(meth)acrylates and aryl(meth)acrylates include methyl(meth)acrylate, ethyl(meth)acrylate, propyl(meth)acrylate, butyl(meth)acrylate, isobutyl(meth)acrylate, pentyl (meth)acrylate, hexyl(meth)acrylate, octyl(meth)acrylate, phenyl(meth)acrylate, benzyl(meth)acrylate, tolyl(meth)acrylate, naphthyl(meth)acrylate, and cyclohexyl(meth)acrylate. Examples of the vinyl compound include styrene, α-methyl styrene, vinyl toluene, glycidyl(meth)acrylate, acrylonitrile, vinyl acetate, N-vinylpyrrolidone, tetrahydrofurfuryl(meth)acrylate, polystyrene macromonomer, polymethyl(meth)acrylate macromonomer, and the like.

The alkali soluble resin preferably includes a polymer (a) which is a polymerization product of a compound represented by the following Formula (ED) (hereinafter, referred to as "ether dimer") as an essential monomer component. By containing the polymer (a), the colored curable composition of the present invention is capable of forming a cured film having heat resistance as well as very excellent transparency.

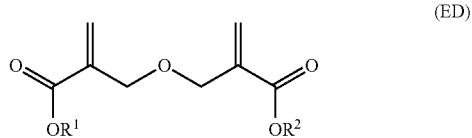

(ED)

In Formula (ED), $R^1$ and $R^2$ each independently represents a hydrogen atom or a hydrocarbon group having 1 to 25 carbon atoms which may be substituted.

Even though there is no particular limitation on the hydrocarbon group having 1 to 25 carbon atoms which is represented by $R^1$ and $R^2$ in Formula (ED) and may be substituted, mention may be made of a linear or branched alkyl group such as methyl, ethyl, n-propyl, isopropyl, n-butyl, isobutyl, t-butyl, t-amyl, stearyl, lauryl, or 2-ethyl hexyl; an aryl group such as phenyl; a cycloaliphatic group such as cyclohexyl, t-butyl cyclohexyl, dicyclopentadienyl, tricyclodecanyl, isobornyl, adamantyl, or 2-methyl-2-adamantyl; an alkoxy-substituted alkyl group such as 1-methoxyethyl, or 1-ethoxyethyl; an aryl group-substituted alkyl group such as benzyl; and the like. Among them, in particular, a primary or secondary hydrocarbon group, such as methylethyl, cyclohexyl, or benzyl, which is not readily separated by acid or heat, is preferred from the viewpoint of heat resistance. Further, $R^1$ and $R^2$ may be identical or different from each other.

Specific examples of the ether dimmer include: dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(t-butyl)-2,2'-[oxybis(methylene)bis-2-propenoate, di(t-amyl-2,2'-[oxybis (methylene)]bis-2-propenoate, di(stearyl)-2,2'-[oxybis (methylene)]bis-2-propenoate, di(lauryl)-2,2'-[oxybis (methylene)]bis-2-propenoate, di(2-ethylhexyl)-2,2'-[oxybis (methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, biphenyl-2,2'-[oxybis (methylene)]bis-2-propenoate, dicyclohexyl-2,2'-[oxybis (methylene)]bis-2-propenoate, di(t-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, di(2-methyl-2-adamantyl)-2,2'-[oxybis (methylene)]bis-2-propenoate, and the like. Among them, in particular, dimethyl-2,2'-[oxybis(methylene)bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are preferred. These ether dimers may be used alone or in a combination of two or more thereof.

Among alkali soluble resins, in particular, a benzyl(meth) acrylate/(meth)acrylic acid copolymer or a multiblock copolymer consisting of benzyl(meth)acrylate/(meth)acrylic acid/another monomer is preferred. In addition, exemplified are copolymerization products of 2-hydroxyethylmethacrylate, a 2-hydroxypropyl(meth)acrylate/polystyrene macromonomer/benzylmethacrylate/methacrylic acid copolymer, a 2-hydroxy-3-phenoxypropylacrylate/polymethylmethacrylate macromonomer/benzylmethacrylate/methacrylic acid copolymer, a 2-hydroxyethylmethacrylate/polystyrene macromonomer/methylmethacrylate/methacrylic acid copolymer, a 2-hydroxyethylmethacrylate/polystyrene macromonomer/benzylmethacrylic acid copolymer, described in JP-A-7-140654, and the like.

Further, an alkali soluble resin having a polymerizable group may be used to improve crosslinking effects of the colored curable composition in the present invention. As the alkali soluble resin having a polymerizable group, an alkali soluble resin containing an allyl group, a (meth)acrylic group, or an aryloxyalkyl group at the side chain thereof is useful. Preferred examples of the alkali soluble resin having a polymerizable group include:

an acrylic resin containing a urethane-modified polymerizable double bond obtained by reacting an isocyanate group and an OH group in advance, with leaving one unreacted isocyanate group, and reacting a compound containing a (meth)acryloyl group and an acrylic resin containing a carboxyl group;

an acrylic resin containing an unsaturated group obtained by reacting an acrylic resin containing a carboxyl group and a compound having both an epoxy group and a polymerizable double bond in the molecule;

an acrylic resin containing a polymerizable double bond obtained by reacting an acid pendant-type epoxy acrylate resin, an acrylic resin containing an OH group, and a dibasic acid anhydride having a polymerizable double bond;

a resin obtained by acrylic resin isocyanate containing an OH group and a compound having a polymerizable group; and a resin obtained by basic treatment of a resin containing an ester group having, at the α or β position, a leaving group such as a halogen atom or a sulfonate group, at the side chain thereof, described in JP-A-2002-229207 and JP-A-2003-335814.

An acid value of the alkali soluble resin is preferably in the range of 30 mgKOH/g to 200 mgKOH/g, more preferably 50 mgKOH/g to 150 mgKOH/g, and most preferably 70 mgKOH/g to 120 mgKOH/g.

A weight-average molecular weight (Mw) of the alkali soluble resin is preferably in the range of 2,000 to 50,000, more preferably 5,000 to 30,000, and most preferably 7,000 to 20,000.

A content of alkali soluble resin in the colored curable composition is preferably in the range of 1 to 15% by mass, based on the total solid content of the composition, more preferably 2 to 12% by mass, and particularly preferably 3 to 10% by mass.

<Polymerization Inhibitor>

With regard to the colored curable composition of the present invention, it is desirable to add a small amount of a polymerization inhibitor for inhibiting the unnecessary thermal polymerization of the polymerizable compound during the production or the storage of the colored curable composition.

As the polymerization inhibitor to be used in the present invention, hydroquinone, p-methoxyphenol, di-t-butyl-p-cresol, pyrogarol, t-butylcatechol, benzoquinone, 4,4'-thiobis(3-methyl-6-t-butylphenol), 2,2'-methylene bis(4-methyl-6-t-butylphenol), N-nitrosophenylhydroxyamine cerium (I) salt, and the like are presented. An addition amount of the polymerization inhibitor is preferably from about 0.01% by mass to about 5% by mass with respect to a mass of the total composition.

<Dye>

In the present invention, in order to obtain a desired spectrum, a dye may be used in a combination with the pigment. As the dye, pyrazole azo dyes, anilinoazo dyes, triphenylmethane dyes, antraquinone dyes, anthrapyridone dyes, benzylidene dyes, oxonol dyes, pyrazolotriazolazo dyes, pyridonazo dyes, cyanine dyes, phenothiazine dyes, pyrrolopyrazolazomethine dyes, xanthene dyes, phthalocyanine dyes, penzopyran dyes, indigo dyes or the like may be used. Specifically, dyes that are conventionally known for the use in color filters may be used. For example, preferred are the colorants disclosed in JP-A-64-90403, JP-A-64-91102, JP-A-1-94301, JP-A-6-11614, Japanese Patent No. 2592207, the specification of U.S. Pat. No. 4,808,501, the specification of U.S. Pat. No. 5,667,920, the specification of U.S. Pat. No. 5,059,500, JP-A-5-333207, JP-A-6-35183, JP-A-6-51115, JP-A-6-194828, JP-A-8-211599, JP-A-4-249549, JP-A-10-123316, JP-A-11-302283, JP-A-7-286107, JP-A-2001-4823, JP-A-8-15522, JP-A-8-29771, JP-A-8-146215, JP-A-11-343437, JP-A-8-62416, JP-A-2002-14220, JP-A-2002-14221, JP-A-2002-14222, JP-A-2002-14223, JP-A-8-302224, JP-A-8-73758, JP-A-8-179120, and JP-A-8-151531. Toning may be carried out during dispersion of the pigment or fabrication of a resist.

<Substrate Adhesive>

In the present invention, a substrate adhesive for improving the adhesiveness to a substrate may also be added. As the substrate adhesive, it is preferable to use a silane-based coupling agent, a titanate-based coupling agent or an aluminum-based coupling agent. Examples of the silane-based coupling agent include γ-methacryloxypropyltrimethoxysilane, γ-methacryloxypropyltriethoxysilane, γ-acryloxypropyltrimethoxysilane, γ-acryloxypropyltriethoxysilane, γ-mercaptopropyltrimethoxysilane, γ-aminopropyltriethoxysilane, phenyltrimethoxysilane, and the like. Among them, γ-methacryloxypropyltrimethoxysilane is preferred as the substrate adhesive.

A content of the substrate adhesive is preferably in the range of 0.1% by mass to 30% by mass, more preferably 0.5% by mass to 20% by mass, and particularly preferably 1% by mass to 10% by mass, based on the total solid fraction of the curable composition of the present invention, from the viewpoint of preventing any residue of the curable composition from remaining behind in the uncured areas when the colored curable composition was subjected to exposure and development.

—Surfactant—

Various kinds of surfactants may be added to the colored photosensitive composition of the present invention from the viewpoint of improving the coatability thereof. Various surfactants such as fluorosurfactants, nonionic surfactants, cationic surfactants, anionic surfactants, and silicone surfactants can also be used as such a surfactant.

In particular, the colored photosensitive composition of the present invention contains a fluorine-based surfactant, and therefore when it is formulated into a coating solution, liquid characteristics (in particular, fluidity) is further improved, thus resulting in further improvements in uniformity of a coating thickness or saving of liquid.

That is, when a film is formed using a coating solution where a colored photosensitive composition containing a fluorine-based surfactant was applied, permeability and coatability into the to-be-coated surface are improved due to a reduction in the surface tension between a to-be-coated surface and a coating solution. Accordingly, it is effective in that the formation of a uniform-thickness film with less thickness unevenness is more preferably carried out, even when a thin film having a thickness of several μm is formed with a small amount of the liquid, A content of fluorine in the fluorine-based surfactant is preferably in the range of 3% by mass to 40% by mass, more preferably 5% by mass to 30% by mass, and particularly preferably 7% by mass to 25% by mass. The fluorine-based surfactant having a fluorine content falling within the above-specified range is effective from the viewpoint of coating film uniformity and liquid saving, and also exhibits good solubility in a colored photosensitive composition.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, F437, MEGAFACE F479, MEGAFACE F482, MEGAFACE F780, MEGAFACE F781 (all manufactured by DIC corporation), Fluorad FC430, Fluorad FC431, Fluorad FC171 (all manufactured by Sumitomo 3M), Surflon S-382, Surflon SC-101, Surflon SC-103, Surflon SC-104, Surflon SC-105, Surflon SC-1068, Surflon SC-381, Surflon SC-383, Surflon SC393, Surflon KH-40 (all manufactured by Asahi Glass), CW-1 (manufactured by Zeneca Co., Ltd), and the like.

Specific examples of the nonionic surfactant include polyoxyethylene laurylether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid ester (e.g., Pluronic L10, L31, L61, L62, 10R5, 17R2, 25R2, Tetronic 304, 701, 704, 901, 904, 150R1, manufactured by BASF).

Specific examples of the cationic surfactant include phthalocyanine derivatives (trade name EFKA-745, manufactured by Morita), organosiloxane polymer KP341 (manufactured by Shin-Etsu Chemical Chemical Co., Ltd.), (meth)acrylic (co)polymer Polyflow No. 75, No. 90, No. 95 (manufactured by Kyoeisha Chemical Co., Ltd.), W001 (manufactured by Yusho Co., Ltd.), and the like.

Specific examples of the anionic surfactant include W004, W005, and W017 (manufactured by Yusho Co., Ltd.).

Examples of the silicone-based surfactant include Toray silicone DC3PA, Toray silicone SH7PA, Toray silicone DC11PA, Toray silicone SH21PA, Toray silicone SH28PA, Toray silicone SH29PA, Toray silicone SH30PA, Toray silicone SH8400 (all manufactured by Toray silicone), TSF-4440, TSF-4300, TSF-4445, TSF-444(4)(5)(6)(7)$_6$, TSF-4460, TSF-4452 (all manufactured by Toshiba Silicone Co., Ltd.), KP341 (manufactured by Shin-Etsu Silicone Co., Ltd.), BYK323, BYK330 (manufactured by Byk Chemie), and the like.

The surfactants may be used alone or in a combination of two or more thereof.

<Other Components>

The photocurable composition of the present invention may contain, if necessary, various additives including a chain transfer agent such as N,N-dialkylamino benzoic acidalkyl ester or 2-mercapto benzothiazole, a thermal polymerization initiator such as azo compound peroxide compound, a thermal polymerization component, a polyfunctional thiol or epoxy compound for increasing film strength or sensitivity, an ultraviolet absorbent such as alkoxybenzophenone, a plasticizer such as dioctylphthalate, a developability improving agent such as low-molecular weight organic carboxylic acid, other fillers, a polymer compound other than the above alkali soluble resins, an antioxidant, an aggregation inhibitor, or the like.

Further, a thermal curing agent may be added to increase the curability of film by post-heating after the development. Examples of the thermal curing agent include an azo compound, a thermal polymerization initiator such as peroxide, a Novolak resin, a resol resin, an epoxy compound, a styrene compound, and the like.

—Preparation of Colored Curable Composition—

The colored curable composition of the present invention is preferably prepared by using a solvent in a combination with the above-mentioned individual components.

Examples of the solvent include esters such as ethyl acetate, n-butyl acetate, isobutyl acetate, isoamyl acetate, isobutyl acetate, amyl formate, butyl propionate, isopropyl butyrate, ethyl butyrate, butyl butyrate, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, methyl 3-oxypropionate, ethyl 3-oxypropionate, methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanoate and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol methyl ether acetate, propylene glycol ethyl ether acetate and propylene glycol propyl ether acetate; ketones such as methyl ethyl ketone, cyclohexanone, 2-heptanon and 3-heptanone; and aromatic hydrocarbons such as toluene and xylene.

Among these solvents, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether acetate and the like are preferred.

These solvents may be used alone or in a combination of two or more thereof.

The colored curable composition of the present invention is applicable to printing ink, ink jet ink and the like as well as the fabrication of color filters for use in LCDs or solid-state image sensing devices.

Even when it contains a high concentration of a fine pigment, the colored curable composition of the present invention enhances the pigment dispersion stability and developability and forms a good colored region with highly precise color characteristics, whereby the colored curable composition exhibits significant effects even upon the fabrication of a color filter for a solid-state image sensing device, in particular the formation of a pixel having a film thickness of 0.8 μm or less, preferably ranging from 0.1 μm to 0.5 μm.

When the colored curable composition of the present invention is applied for the formation of a color filter provided in an LCD having excellent color reproducibility or a solid-state image sensing device having excellent resolution, it is advantageously possible to form a thin film due to having excellent dispersion stability. Therefore, in such an application, it is preferred to prepare an embodiment containing the pigment at a high concentration.

A concentration of the pigment in the colored curable composition of the present invention is preferably 40% by mass or higher, and more preferably 45% by mass or higher, based on the total solid content of the colored curable composition (i.e., the sum of pigment, dispersive component, resin component, polymerizable compound, photopolymerizable initiator, and other additives, with the exclusion of the solvent).

[Color Filter and Manufacturing Method Thereof]

The color filter of the present invention is hereunder described along with its manufacturing method.

The color filter of the present invention includes a substrate having thereon a colored region (colored pattern) formed using the colored curable composition of the present invention.

The color filter of the present invention is hereunder described in detail through its manufacturing method (manufacturing method of the color filter of the present invention).

The manufacturing method of the color filter of the present invention includes coating the curable composition of the present invention on a substrate to form a colored layer made of the colored curable composition (colored layer forming process); pattern exposing the colored layer through a mask (exposure process); and developing the exposed colored layer to form a colored region (development process).

<Colored Layer Forming Process>

In the colored layer forming process, the curable composition of the present invention is coated on a substrate to form a colored layer (curable composition layer) made of the colored curable composition.

Examples of the substrate which can be used in this process include substrates to be used for liquid crystal display devices and the like, for example, alkali-free glass, soda-lime glass, Pyrex™ (registered trademark) glass, quartz glass and glass obtained by depositing a transparent conductive film on such glass; photoelectric conversion device substrates to be used for imaging devices and the like, for example, silicon substrates; and complementary metal oxide semiconductors (CMOS). On these substrates, there may be the case where black stripes for isolating respective pixels are formed.

An undercoat layer may be provided on such a substrate for the purpose of improving adhesiveness to an upper layer, preventing diffusion of substances or flattening the surface of the substrate as the need arises.

As a coating method of the colored curable composition of the present invention on the substrate, various coating methods such as slit coating, an inkjet method, rotary coating, cast coating, roll coating and a screen printing method can be applied.

The film thickness measured immediately after the application of the colored curable composition is preferably from 0.1 to 10 μm, more preferably from 0.2 to 5 μm, and even more preferably from 0.2 to 3 μm, from the viewpoints of the uniformity of film thickness and the ease of drying of the applied solvent.

Drying (pre-baking) of the colored layer (curable composition layer) coated on the substrate can be carried out for from 10 to 300 seconds at a temperature of from 50° C. to 140° C. by using a hot plate, an oven, etc.

A post-drying coated film thickness of the colored layer (hereinafter, referred to properly as "dried film thickness") is preferably from 0.05 μm to 1.0 μm, more preferably from 0.1 μm to 0.8 μm, and particularly preferably from 0.2 μm to 0.7 μm, in view of securing the color density, and in view of alleviating the inconvenience caused by the fact that the light coming from oblique directions does not reach the photoreceiver and makes a significant difference in the light collecting efficiency between the corners and the central area of a device.

<Exposure Process>

In the exposure process, the colored layer (curable composition layer) formed in the foregoing colored forming process is exposed through a mask having a prescribed mask pattern.

As to the exposure in this process, the pattern exposure of the coated film can be carried out by exposing the colored layer through a prescribed mask pattern to cure only a light exposed coating film. As radiations which can be used for the exposure, in particular, ultraviolet rays such as g-rays, h-rays and i-rays can be preferably used. The irradiation dose is preferably from 30 mJ/cm$^2$ to 1500 mJ/cm$^2$, more preferably 50 mJ/cm$^2$ to 1000 mJ/cm$^2$, and most preferably from 80 mJ/cm$^2$ to 50 mJ/cm$^2$.

[Development Process]

Next, when an alkali development treatment (developing process) is carried out, the unexposed parts from the above-described exposure process are eluted with a developer solution, so that only the photocured parts are left behind. By the development process, a pattern-forming film composed of pixels having respective colors (for example, three colors or four colors) can be formed.

The development can be carried out by using any of a tape method, a shower method, a spray method, and a puddling method, optionally in a combination with a swing method, a spin method, an ultrasonic method or the like. Further, a puddling phenomenon can also be used as the development method.

Development unevenness can be prevented by soaking the target surface in water or the like before placing it in contact with the developer solution.

The developer solution is preferably an organic alkaline developer solution which does not damage circuits or the like on the undercoat. The developing temperature is usually from 20° C. to 30° C., and the developing time is 20 to 90 seconds.

Examples of the alkali agent used in the developer solution include organic alkaline compounds such as aqueous ammonia, ethylamine, diethylamine, dimethylethanolamine, tetramethylammonium hydroxide, tetraethylammonium hydroxide, choline, pyrrole, piperidine and 1,8-diazabicyclo-[5,4,0]-7-undecene; inorganic compounds such as sodium hydroxide, potassium hydroxide, sodium hydrogen carbonate and potassium hydrogen carbonate; and the like.

An alkaline aqueous solution prepared by diluting one of these alkali agents with purified water to a concentration of 0.001% to 10% by mass, and preferably 0.01% to 1% by mass, is preferably used as the developer solution. In addition, when a developer solution formed from such an alkaline aqueous solution is used, the color filter is generally washed (rinsed) with purified water after development.

Subsequently, an excess developer solution is removed by washing, and thereby the color filter is dried.

In addition, the production method of the present invention may also include, after carrying out the above-described colored layer formation process, exposure process and development process, if necessary, a curing process for curing the formed colored pattern by post-heating (postbake) and/or post-exposure. The postbake is a heat treatment after development intended to complete the curing, and is usually performed by a thermal curing treatment at 100° C. to 270° C. Even though the postbake may be carried out using g-rays, h-rays, i-rays, an excimer laser such as KrF or ArF, an electron beam, X-rays, or the like when light is used, it is preferred to carry out the postbake using a conventional high-pressure mercury lamp at a low temperature of 20° C. to 50° C. for 10 to 180 seconds, preferably 30 to 60 seconds. When post-exposure and post-heating are combined, the post-exposure is preferably carried out first.

A color filter having a desired color is produced by repeating the above-described colored layer formation process, exposure process and developing process, for a number corresponding to the number of desired colors.

Since the color filter of the present invention is manufactured using the colored curable composition of the present invention having excellent exposure sensitivity, the composition cured at the exposed part provides excellent adhesiveness to the substrate and excellent development resistance, increases the adhesiveness between the formed colored pattern and the substrate, and also exhibits a pattern with a desired high resolution cross-section shape.

The colored curable composition of the present invention can be easily removed by washing with a known washing solution, for example, even when the composition is adhered to a nozzle at the discharge port of an applicator, a piping of an applicator, the interior of an applicator or the like. In this case, for more efficient and better washing and removal, the above-mentioned solvent as the solvent contained in the colored curable composition of the present invention is preferably used as a washing solution.

Further, the washing solutions described in JP-A-7-128867, JP-A-7-146562, JP-A-8-278637, JP-A-2000-273370, JP-A-2006-85140, JP-A-2006-291191, JP-A-2007-2101, JP-A-2007-2102, JP-A-2007-281523, and the like can be appropriately used as the washing solution for washing and removing the colored curable composition of the present invention.

As the washing solution, alkylene glycol monoalkylether carboxylate, or alkylene glycol monoalkylether is preferably used.

These solvents utilizable as the washing solution may be used alone or in a combination of two or more thereof.

When two or more solvents are mixed, preferred is a mixed solvent in which a solvent having a hydroxyl group and a solvent having no hydroxyl group are mixed. A mass ratio of the solvent having a hydroxyl group and the solvent having no hydroxyl group is in the range of 1/99 to 99/1, preferably 10/90/to 90/10, and more preferably 20/80 to 80/20. As the mixed solvent, a mixed solvent of propylene glycol monomethyl ether acetate (PGMEA) and propylene glycol monomethyl ether (PGME) in a ratio of 60/40 is particularly preferable.

Further, the color filter of the present invention prepared by the manufacturing method of the color filter of the present invention can be suitably used in an image display device such as electronic paper or organic EL, liquid crystal display (LCD) or a solid-state image sensing device such as CCD.

In particular, the color filter is suitable for CCD elements or CMOS of high resolution, which may contain more than one million pixels.

The color filter of the present invention may be used as, for example, a color filter which is disposed between the photoreceiver of each pixel and a microlens for collecting light, in a CCD.

This application claims priority from Japanese Patent Application No. 2009-076639 filed on Mar. 26, 2009, Japanese Patent Application No. 2009-276468 filed on Dec. 4, 2009, and Japanese Patent Application No. 2010-023560 filed on Feb. 4, 2010, the disclosure of which are incorporated by reference herein.

All publications, patent applications, and technical standards mentioned in this specification are herein incorporated by reference to the same extent as if each individual publication, patent application, or technical standard was specifically and individually indicated to be incorporated by reference.

EXAMPLES

Now, the present invention will be described in more detail with reference to the following Examples. These examples are provided only for illustrating the present invention and should not be construed as limiting the scope and spirit of the present invention. Unless otherwise specifically indicated, "part", or "%" is "part by mass" or "% by mass".

Synthesis Example 1

Synthesis of Resin (J-1)

A specific resin (J-1) was synthesized as follows.

55 g of a macromonomer (N-1) (weight-average molecular weight according to a GPC method (a conversion value against polystyrene): 3,500), 35 g of a monomer (M-1), 10 g of methacrylic acid, and 6 g of dodecanethiol were added to 233 g of propylene glycol monomethylether, followed by stirring under a nitrogen atmosphere at 75° C. for 1 hour. 0.5 g of 2,2'-azobis (V-601, manufactured by Wako Pure Chemical Industries, Ltd.) was added thereto, followed by heating for 2 hours. Then, 0.5 g of 2,2'-azobis(methyl isobutyrate) was added thereto, followed by heating for 2 hours. Then, the reaction solution was heated at 90° C. for 2 hours, and cooled to afford 30 wt % of a resin (J-1).

The scheme is as follows.

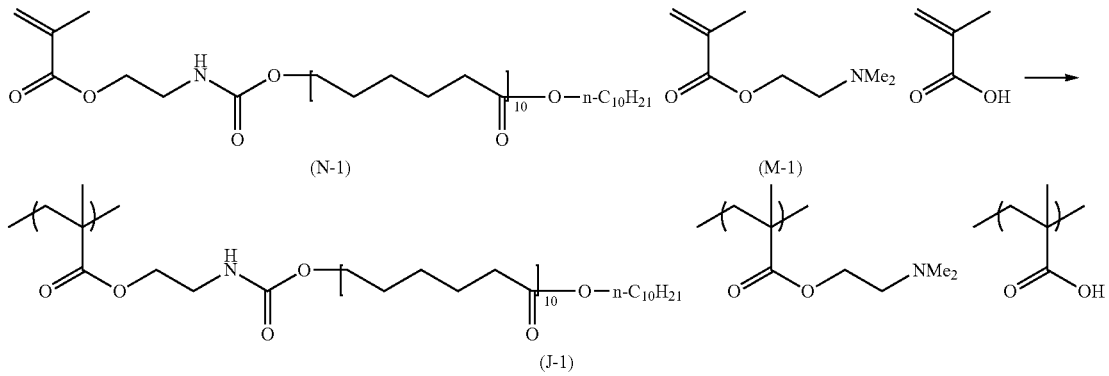

In addition, the macromonomer (N-1), the monomer (M-1), and the methacrylic acid used in Synthesis Example 1 respectively correspond to a macromonomer (b-3), a monomer (b-1), and a monomer (b-2) which constitute the specific resin.

Synthesis Examples 2 to 18, Comparative Synthesis Examples 1 and 2

Synthesis of Resins (J-2) to (J-20)

Specific resins (J-2) to (J-9), (J-12) to (J-20), and comparative resins (J-10) to (J-11) were obtained in the same manner as in Synthesis Example 1, except that the macromonomer (N-1), the monomer (M-1), and the methacrylic acid used in Synthesis Example 1 were changed to macromonomers and monomers shown in Table 1 below.

The macromonomer (N-2) shown in Table 1 was "AA-6" (weight-average molecular weight according to a GPC method (a conversion value against polystyrene): 6500) (manufactured by TOAGOSEI CO., LTD.), (N-3) was "Placcel FA10L" (weight-average molecular weight according to a GPC method (a conversion value against polystyrene): 3000) (manufactured by DAICEL CHEMICAL INDUSTRIES, LTD.), and (N-4) and (N-5) were the following macromonomers ((N-4): weight-average molecular weight (conversion value against polystyrene) of 13,000, (N-5): weight-average molecular weight (conversion value against polystyrene) of 21,000).

Monomers (M-7), (M-17), (M-37), (M-40), (M-47) and (M-48) shown in Table 1 were monomers mentioned hereinbefore as specific examples of the monomer (b-1). Further, the monomer (M-28) was a monomer mentioned hereinbefore as a specific example of the monomer (b-2).

TABLE 1

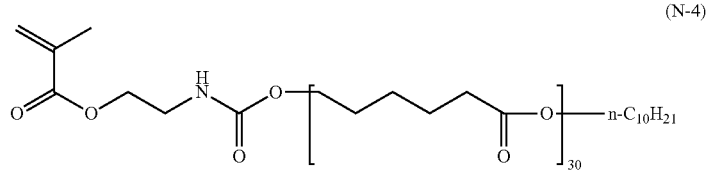

(N-4)

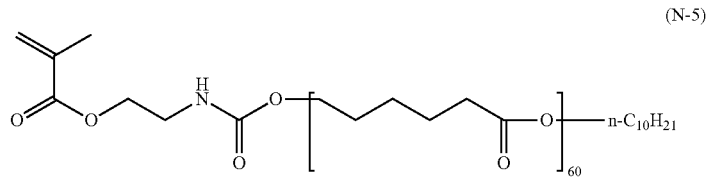

(N-5)

|  | Resin | Macromonomer | Monomer 1 | Monomer 2 |
|---|---|---|---|---|
| Synthesis Example 1 | (J-1) | (N-1) 55 g | 2-dimethyl aminoethyl methacrylate 35 g | Methacrylic acid 10 g |
| Synthesis Example 2 | (J-2) | (N-1) 85 g | 2-dimethyl aminoethyl methacrylate 10 g | Methacrylic acid 5 g |
| Synthesis Example 3 | (J-3) | (N-1) 25 g | 2-dimethyl aminoethyl methacrylate 55 g | Methacrylic acid 20 g |
| Synthesis Example 4 | (J-4) | (N-1) 45 g | 3-dimethyl amino propyl methacrylic amide 35 g | 1-(2-hydroxy ethyl)-2-(2-methacryloyloxy ethyl) phthalate 20 g |
| Synthesis Example 5 | (J-5) | (N-1) 55 g | (M-7) 35 g | (M-28) 10 g |
| Synthesis Example 6 | (J-6) | (N-1) 55 g | (M-17) 35 g | Acrylic acid 10 g |
| Synthesis Example 7 | (J-7) | (N-1) 55 g | 2-(tert-butyl amino)ethyl methacrylate 35 g | Methacrylic acid 10 g |
| Synthesis Example 8 | (J-8) | (N-2) 55 g | 2-dimethyl aminoethyl methacrylate 35 g | Methacrylic acid 10 g |
| Synthesis Example 9 | (J-9) | (N-3) 55 g | 2-dimethyl aminoethyl methacrylate 35 g | Methacrylic acid 10 g |
| Synthesis Example 10 | (J-12) | (N-1) 55 g | 4-vinyl pyridine 35 g | Methacrylic acid 10 g |
| Synthesis Example 11 | (J-13) | (N-1) 55 g | N-vinyl imidazole 35 g | Methacrylic acid 10 g |
| Synthesis Example 12 | (J-14) | (N-4) 55 g | 2-dimethyl aminoethyl methacrylate 35 g | Methacrylic acid 10 g |
| Synthesis Example 13 | (J-15) | (N-5) 55 g | 2-dimethyl aminoethyl methacrylate 35 g | Methacrylic acid 10 g |
| Synthesis Example 14 | (J-16) | (N-1) 55 g | (M-37) 25 g 2-dimethyl aminoethyl methacrylate 10 g | Methacrylic acid 10 g |
| Synthesis Example 15 | (J-17) | (N-1) 55 g | (M-38) 25 g 2-dimethyl aminoethyl methacrylate 10 g | Methacrylic acid 10 g |
| Synthesis Example 16 | (J-18) | (N-1) 55 g | (M-47) 25 g 2-dimethyl aminoethyl methacrylate 10 g | Methacrylic acid 10 g |
| Synthesis Example 17 | (J-19) | (N-1) 55 g | (M-48) 25 g 2-dimethyl aminoethyl methacrylate 10 g | Methacrylic acid 10 g |
| Synthesis Example 18 | (J-20) | (N-1) 55 g | (M-48) 35 g | Methacrylic acid 10 g |
| Comparative Synthesis Example 1 | (J-10) | (N-1) 55 g | 2-dimethyl aminoethyl methacrylate 35 g | Methyl methacrylate 10 g |
| Comparative Synthesis Example 2 | (J-11) | (N-1) 55 g | Methyl methacrylate 35 g | Methacrylic acid 10 g |

Table 2 below shows physical properties (weight-average molecular weight, amine value, and acid value) of resins (J-1) to (J-20) obtained in Synthesis Examples 1 to 18, and Comparative Synthesis Examples 1 and 2.

TABLE 2

| Resins | Weight-average molecular weight | Amine value (mgKOH/g) | Acid value (mgKOH/g) |
|---|---|---|---|
| (J-1) | 14000 | 125 | 65 |
| (J-2) | 32000 | 35 | 31 |
| (J-3) | 8000 | 192 | 135 |
| (J-4) | 13000 | 113 | 40 |
| (J-5) | 11000 | 120 | 36 |
| (J-6) | 13000 | 194 | 79 |
| (J-7) | 15000 | 106 | 63 |
| (J-8) | 21000 | 124 | 64 |
| (J-9) | 15000 | 125 | 65 |
| (J-10) | 15000 | 125 | 0 |
| (J-11) | 14000 | 0 | 66 |
| (J-12) | 13000 | 187 | 65 |
| (J-13) | 15000 | 0 | 65 |
| (J-14) | 34000 | 125 | 65 |
| (J-15) | 56000 | 125 | 65 |
| (J-16) | 18000 | 32 | 64 |
| (J-17) | 15000 | 36 | 65 |
| (J-18) | 16000 | 35 | 66 |
| (J-19) | 15000 | 34 | 65 |
| (J-20) | 17000 | 0 | 64 |

Examples 1 to 25, and Comparative Examples 1 to 5

Hereinafter, Examples and Comparative Examples will be described in which pigment dispersions were prepared.

Further, Solsperse 24000GR (condensate of polyethylene imine and polyester, manufactured by Avecia) used in Comparative Example 3, AJISPER PB821 (condensate of polyarylamine and polyester, Ajinomoto Fine-Techno Co., Inc.) used in Comparative Example 4, and a resin (B) used in Comparative Example 5 were used as a 30% by mass solution thereof in propylene glycol monomethylether acetate.

1-1. Preparation of Pigment Dispersion

According to the composition formula shown in Table 3, a mixture consisting of 40 parts of a pigment, 5 parts of a pigment derivative, 60 parts of a solution of a specific resin or comparative resin in propylene glycol monomethylether acetate (18 parts in terms of solids), and 300 parts of propylene glycol monomethylether acetate was mixed and dispersed in a bead mill (zirconia beads: 0.3 mm in diameter) for 3 hours to prepare pigment dispersions (X-1) to (X-30).

Further, PG58, PY139, PY150, and PY185 in Table 3 represent C.I. Pigment Green 58, C.I. Pigment Yellow 139, C.I. Pigment Yellow 150, and C.I. Pigment Yellow 185, respectively.

1-2. Evaluation of Dispersibility and Dispersion Stability

Viscosity of the resulting pigment dispersions (X-1) to (X-30) was measured 1 day (24 hours) and 14 days (336 hours) after dispersion to evaluate the dispersibility and dispersion stability. The measurement of viscosity was carried out using a TV-22 viscometer cone plate type (manufactured by Toki Sangyo Co., Ltd.). The evaluation environment was 25° C.

A small viscosity value of the pigment dispersion represents that dispersibility of the pigment is excellent. In addition, the smaller viscosity value of the pigment dispersion and the smaller increment in viscosity over time represent the better dispersion stability of the pigment. The results obtained are given in Table 3 below.

TABLE 3

| | Pigment dispersion | Pigment | Resin | Pigment derivative | Viscosity (1 day) | Viscosity (14 days) |
|---|---|---|---|---|---|---|
| Example 1 | (X-1) | PG58 | (J-1) | — | 12 mPa·s | 15 mPa·s |
| Example 2 | (X-2) | PG58 | (J-1) | W1 | 7 mPa·s | 7 mPa·s |
| Example 3 | (X-3) | PG58 | (J-1) | W2 | 7 mPa·s | 7 mPa·s |
| Example 4 | (X-4) | PG58 | (J-2) | W1 | 12 mPa·s | 14 mPa·s |
| Example 5 | (X-5) | PG58 | (J-3) | W1 | 13 mPa·s | 12 mPa·s |
| Example 6 | (X-6) | PG58 | (J-4) | W1 | 6 mPa·s | 7 mPa·s |
| Example 7 | (X-7) | PG58 | (J-5) | W1 | 7 mPa·s | 7 mPa·s |
| Example 8 | (X-8) | PG58 | (J-6) | W2 | 7 mPa·s | 7 mPa·s |
| Example 9 | (X-9) | PG58 | (J-7) | W2 | 12 mPa·s | 13 mPa·s |
| Example 10 | (X-10) | PG58 | (J-8) | W1 | 15 mPa·s | 18 mPa·s |
| Example 11 | (X-11) | PG58 | (J-9) | W1 | 12 mPa·s | 14 mPa·s |
| Example 12 | (X-12) | PG58/PY139 (mass ratio 80/20) | (J-1) | W2 | 7 mPa·s | 8 mPa·s |
| Example 13 | (X-13) | PG58/PY150 (mass ratio 75/25) | (J-1) | W2 | 7 mPa·s | 8 mPa·s |
| Example 14 | (X-14) | PG58/PY185 (mass ratio 80/20) | (J-1) | W2 | 8 mPa·s | 8 mPa·s |
| Example 15 | (X-15) | PG58/PY185 (mass ratio 80/20) | (J-1)/Resin A (mass ratio 80/20) | W3 | 7 mPa·s | 9 mPa·s |
| Example 16 | (X-16) | PG58/PY185 (mass ratio 80/20) | (J-1) | W4 | 7 mPa·s | 9 mPa·s |
| Example 17 | (X-21) | PG58 | (J-12) | W2 | 14 mPa·s | 16 mPa·s |

TABLE 3-continued

| | Pigment dispersion | Pigment | Resin | Pigment derivative | Viscosity (1 day) | Viscosity (14 days) |
|---|---|---|---|---|---|---|
| Example 18 | (X-22) | PG58 | (J-13) | W2 | 16 mPa·s | 18 mPa·s |
| Example 19 | (X-24) | PG58 | (J-14) | W2 | 10 mPa·s | 11 mPa·s |
| Example 20 | (X-25) | PG58 | (J-15) | W2 | 15 mPa·s | 17 mPa·s |
| Example 21 | (X-26) | PG58/PY185 (mass ratio 80/20) | (J-16) | W2 | 7 mPa·s | 8 mPa·s |
| Example 22 | (X-27) | PG58/PY185 (mass ratio 80/20) | (J-17) | W2 | 10 mPa·s | 12 mPa·s |
| Example 23 | (X-28) | PG58/PY185 (mass ratio 80/20) | (J-18) | W2 | 6 mPa·s | 7 mPa·s |
| Example 24 | (X-29) | PG58/PY185 (mass ratio 80/20) | (J-19) | W2 | 4 mPa·s | 4 mPa·s |
| Example 25 | (X-30) | PG58/PY185 (mass ratio 80/20) | (J-20) | W2 | 14 mPa·s | 18 mPa·s |
| Comparative Example 1 | (X-17) | PG58 | (J-10) | W2 | 38 mPa·s | Not measurable |
| Comparative Example 2 | (X-18) | PG58 | (J-11) | W1 | 50 mPa·s | Not measurable |
| Comparative Example 3 | (X-19) | PG58 | Solsperse 24000GR | W1 | 45 mPa·s | Not measurable |
| Comparative Example 4 | (X-20) | PG58 | Ajisper PB821 | W1 | 55 mPa·s | Not measurable |
| Comparative Example 5 | (X-23) | PG58/PY150 (mass ratio 75/25) | Resin A/Resin B (mass ratio 60/40) | — | 25 mPa·s | 35 mPa·s |

Pigment derivatives (W1), (W2), (W3) and (W4) shown in Table 3 are (A-9), (A-10), (A-1) and (A-2) described hereinbefore as specific examples of the pigment derivative. Further, the mass ratio described in Columns "Pigment" and "Resin" is a mass ratio relative to solids. Resin A and resin B shown in Table 3 were synthesized as follows.

(Synthesis of Resin A)

400 parts by mass of propylene glycol 1-monomethylether 2-acetate were placed in a reaction container, followed by stirring under nitrogen flow at 90° C. Next, to a monomer bath were added 30 parts by mass of dimethyl-2,2'-[oxybis(methylene)]bis-2-bropenoate, 60 parts by mass of methacrylic acid, 110 parts by mass of cyclohexyl methacrylate, 5.2 parts by mass of t-butylperoxy-2-ethyl hexanoate, and 40 parts by mass of propylene glycol 1-monomethylether 2-acetate, and to a chain transfer agent bath were added 5.2 parts by mass of n-dodecyl mercaptan, and 27 parts by mass of propylene glycol 1-monomethylether 2-acetate, followed by dropwise addition over 135 minutes, respectively. 60 minutes after the dropwise addition was complete, the reaction container was elevated to 110° C. 3 hours later, 39.6 parts by mass of methacrylic acid glycidyl, 0.4 parts by mass of 2,2'-methylene bis(4-methyl-6-t-butylphenol), and 0.8 parts by mass of triethyl amine were added thereto under a dry air atmosphere, followed by reaction 110° C. for 9 hours. The resulting resin A had a weight-average molecular weight of 9,000, and an acid value of 105 mgKOH/g.

(Synthesis of Resin B)

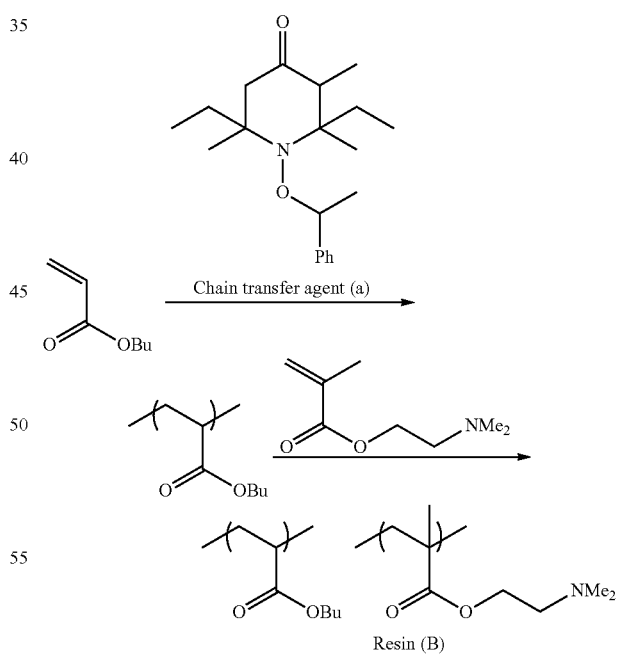

200 g of butyl acrylate and 9.1 g of chain transfer agent (a) were heated under nitrogen flow at 140° C. for 5 hours. Then, the unreacted butyl acrylate was evaporated under reduced pressure to obtain 140 g of polybutyl acrylate. Then, 70 g of 2-dimethyl amino ethyl methacrylate was added thereto, followed by heating under nitrogen flow at 140° C. for 5 hours. Then, the unreacted 2-dimethyl amino ethyl methacrylate was evaporated under reduced pressure to obtain 195 g of a block type resin (B) having a repeating unit consisting of butyl acrylate and a repeating unit consisting of 2-dimethyl amino ethyl methacrylate. The resulting resin had a weight-average molecular weight of 8,000, a number average molecular weight of 6,200, and an amine value of 100 mgKOH/g.

Examples 26 to 56, and Comparative Examples 6 to 10

Hereinafter, Examples and Comparative Examples will be described in which colored curable compositions were prepared for the formation of a color filter for use in an LCD.

2-1 Preparation of a Colored Curable Composition (Coating Solution)

The pigment dispersions prepared in Examples 1 to 25, and Comparative Examples 1 to 5 were respectively mixed and stirred to the following composition ratio, thereby preparing colored curable compositions.

<Composition of Colored Curable Composition>

| | |
|---|---|
| The above pigment dispersion: type described in Table 4 | 600 parts |
| Photopolymerization initiator: type described in Table 4 | 20 parts |
| Dipentaerythritolhexaacrylate | 20 parts |
| Resin (L-1) having the following structure (30 wt % PGMEA solution) | 20 parts (6 parts in terms of solids) |
| Solvent: PGMEA | 900 parts |
| Substrate adhesive: 3-methacryloxypropyltrimethoxysilane) | 1 part |

In the above composition formula, PEGMEA is an abbreviation of "propylene glycol monomethylether acetate". (The same applies hereinafter.)

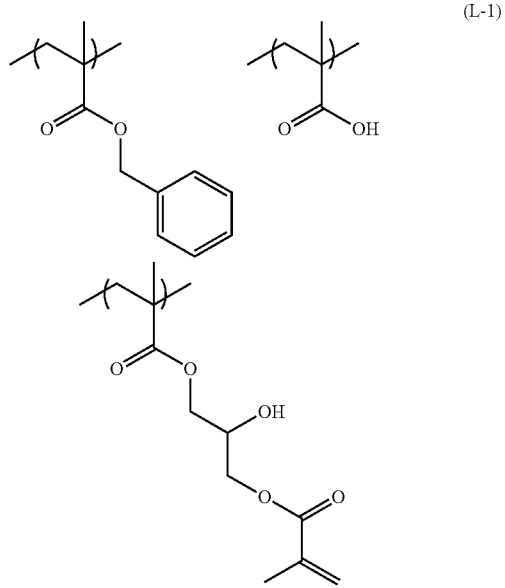

(L-1)

The resin (L-1) is a resin having a copolymerization ratio of 60/10/30 (% by mass), a weight-average molecular weight of 15,000, and a number average molecular weight of 9,000.

2-2. Formation of Colored Curable Composition Layer

The colored curable composition prepared as described above was used as a resist solution to perform slit coating on a glass substrate having a size of 550 mm×650 mm under the following conditions. Then, vacuum drying and prebake (for 80 seconds at 100° C.) were performed to form a coated film (colored curable composition layer) of the colored curable composition on the glass substrate.

(Slit Coating Conditions)

Gap between openings at the front end of coating head: 50 μm

Coating speed: 100 mm/sec

Clearance between substrate and coating head: 150 μm

Dried film thickness: 1.75 μm

Coating temperature: 23° C.

2-3. Exposure and Development

Thereafter, the coated film of the colored curable composition was subjected to patternwise exposure using a 2.5 kW ultrahigh pressure mercury lamp LE4000A (manufactured by Hitachi High-Technology Corporation) at 100 mJ/cm$^2$ and a photomask having a line width of 20 μm. After the exposure, the entire surface of the coated film was coated with a 1% aqueous solution of an inorganic developer solution (trade name: CDK-1, manufactured by Fuji Film Electronic Materials, Co., Ltd.), and was left to stand for 60 seconds to perform a development treatment.

2-4. Heat Treatment

After the standing, purified water was sprayed in shower form to wash off the developer solution, and the coated film which had undergone exposure (photopolymerization) and development treatments was heated in an oven at 220° C. for 1 hour (postbake). Thus, a color filter, in which a pattern (colored layer) was formed by curing the colored curable composition layer on a glass substrate, was obtained.

2-5. Performance Evaluation

The dispersibility and dispersion stability, developability, light resistance, and exposure sensitivity of the colored curable composition prepared as described above were evaluated. In addition, the contrast of the curable composition coated film (colored layer) formed on a glass substrate using the colored curable composition was evaluated.

The evaluation method and criteria are as follows. The evaluation results are presented in Table 4 below.

2-5-1. Dispersibility and Dispersion Stability

Viscosity of the colored curable composition obtained in Section 2-1 was measured 1 day (24 hours) and 1 month (720 hours) after the preparation thereof. The measurement of viscosity was carried out using a TV-22 viscometer cone plate type (manufactured by Toki Sangyo Co., Ltd.). The evaluation environment was 25° C.

A small viscosity value of the colored curable composition represents an excellent dispersibility of the pigment. In addition, a smaller viscosity value of the colored curable composition and a smaller increment in viscosity over time represent a better dispersion stability of the pigment.

2-5-2. Developability

After the development treatment described in the above section 2-3, residue in 20 developed parts (unexposed parts) were observed and counted under SEM. A smaller number of developed parts with residue represents a better developability.

2-5-3. Light Resistance

The coated film formed by the colored curable composition was subjected to irradiation using a xenon lamp at 100,000 lux for 20 hours (corresponding to 2,000,000 lux·h). A color difference (ΔEab value) between pre- and post-irradiation was measured to evaluate the light resistance. A smaller ΔEab value represents a better light resistance.

2-5-4. Exposure Sensitivity

As in Section 2-3, the coated film was subjected to exposure at a varying exposure dose within the range of 10 mJ/cm$^2$ to 500 mJ/cm$^2$, and an exposure dose at which a pattern line width after the postbake process was 20 μm was evaluated as the exposure sensitivity. A smaller exposure sensitivity represents a higher sensitivity.

2-5-5. Contrast of Color Filter

The color filter obtained in Section 2-4 was disposed between two polarizing plates. Then, for a case where a polarizing axis of the polarizing plate was parallel and the case where a polarizing axis of the polarizing plate was perpendicular, the brightness of transmitted light was measured using a color brightness meter BM-7 (manufactured by Topcon Corporation), and the contrast was calculated by dividing the brightness of the case where a polarizing axis of the polarizing plate was parallel by the brightness of the case where a polarizing axis of the polarizing plate was perpendicular. A higher contrast represents a better performance as a color filter for LCDs.

TABLE 4

| | Pigment dispersion | Photopoly-merization initiator | Viscosity (1 day) | Viscosity (1 month) | Develop-ability | Light resistance | Exposure sensitivity (mJ/cm$^2$) | Contrast |
|---|---|---|---|---|---|---|---|---|
| Example 26 | (X-1) | (Z-1) | 13 mPa·s | 14 mPa·s | 2 | 2.1 | 90 | 16000 |
| Example 27 | (X-1) | (Z-2) | 11 mPa·s | 12 mPa·s | 1 | 2.2 | 70 | 16000 |
| Example 28 | (X-1) | (Z-3) | 13 mPa·s | 14 mPa·s | 1 | 2.5 | 90 | 16000 |
| Example 29 | (X-1) | (Z-4) | 15 mPa·s | 18 mPa·s | 3 | 2.2 | 120 | 16000 |
| Example 30 | (X-1) | (Z-5) | 15 mPa·s | 17 mPa·s | 3 | 2.6 | 110 | 16000 |
| Example 31 | (X-1) | (Z-6) | 15 mPa·s | 18 mPa·s | 3 | 2.1 | 120 | 16000 |
| Example 32 | (X-1) | (Z-7) | 13 mPa·s | 14 mPa·s | 1 | 2.3 | 90 | 16000 |
| Example 33 | (X-2) | (Z-2) | 7 mPa·s | 9 mPa·s | 1 | 0.9 | 70 | 19000 |
| Example 34 | (X-3) | (Z-2) | 8 mPa·s | 9 mPa·s | 2 | 1.0 | 70 | 18000 |
| Example 35 | (X-4) | (Z-2) | 15 mPa·s | 18 mPa·s | 1 | 0.8 | 70 | 16000 |
| Example 36 | (X-5) | (Z-2) | 16 mPa·s | 18 mPa·s | 1 | 1.1 | 80 | 15000 |
| Example 37 | (X-6) | (Z-2) | 8 mPa·s | 8 mPa·s | 2 | 0.9 | 70 | 18000 |
| Example 38 | (X-7) | (Z-2) | 7 mPa·s | 8 mPa·s | 1 | 1.0 | 70 | 19000 |
| Example 39 | (X-8) | (Z-2) | 6 mPa·s | 7 mPa·s | 2 | 0.9 | 70 | 18000 |
| Example 40 | (X-9) | (Z-2) | 14 mPa·s | 15 mPa·s | 1 | 1.1 | 80 | 18000 |
| Example 41 | (X-10) | (Z-2) | 16 mPa·s | 18 mPa·s | 9 | 2.5 | 70 | 11000 |
| Example 42 | (X-11) | (Z-2) | 15 mPa·s | 17 mPa·s | 1 | 1.2 | 80 | 13000 |
| Example 43 | (X-12) | (Z-2) | 7 mPa·s | 8 mPa·s | 1 | 1.1 | 80 | 18000 |
| Example 44 | (X-13) | (Z-2) | 7 mPa·s | 8 mPa·s | 1 | 1.5 | 70 | 18000 |
| Example 45 | (X-14) | (Z-2) | 8 mPa·s | 9 mPa·s | 1 | 1.2 | 80 | 17000 |
| Example 46 | (X-15) | (Z-2) | 8 mPa·s | 9 mPa·s | 1 | 2.1 | 80 | 18000 |
| Example 47 | (X-16) | (Z-2) | 7 mPa·s | 9 mPa·s | 1 | 2.2 | 80 | 18000 |
| Example 48 | (X-21) | (Z-2) | 13 mPa·s | 15 mPa·s | 3 | 2.1 | 80 | 15000 |
| Example 49 | (X-22) | (Z-2) | 17 mPa·s | 18 mPa·s | 3 | 2.2 | 80 | 14000 |
| Example 50 | (X-24) | (Z-2) | 13 mPa·s | 14 mPa·s | 2 | 1.2 | 80 | 14000 |
| Example 51 | (X-25) | (Z-2) | 15 mPa·s | 18 mPa·s | 5 | 1.1 | 80 | 12000 |
| Example 52 | (X-26) | (Z-2) | 7 mPa·s | 8 mPa·s | 0 | 1.1 | 70 | 16000 |
| Example 53 | (X-27) | (Z-2) | 10 mPa·s | 12 mPa·s | 2 | 1.2 | 70 | 13000 |
| Example 54 | (X-28) | (Z-2) | 6 mPa·s | 8 mPa·s | 0 | 1.1 | 70 | 16000 |
| Example 55 | (X-29) | (Z-2) | 3 mPa·s | 4 mPa·s | 0 | 0.9 | 70 | 20000 |
| Example 56 | (X-30) | (Z-2) | 12 mPa·s | 16 mPa·s | 0 | 1.2 | 70 | 17000 |
| Comparative Example 6 | (X-17) | (Z-4) | 45 mPa·s | Not measurable | 21 | 7.2 | 150 | 6000 |
| Comparative Example 7 | (X-18) | (Z-4) | 55 mPa·s | Not measurable | 12 | 6.8 | 160 | 5000 |
| Comparative Example 8 | (X-19) | (Z-4) | 55 mPa·s | Not measurable | 32 | 9.2 | 160 | 6000 |
| Comparative Example 9 | (X-20) | (Z-4) | 60 mPa·s | Not measurable | 40 | 9.1 | 160 | 4000 |
| Comparative Example 10 | (X-23) | (Z-4) | 25 mPa·s | 40 mPa·s | 18 | 4.2 | 180 | 9000 |

Details of photopolymerization initiators (Z-1) to (Z-7) shown in Table 4 are as follows. Further, the following photopolymerization initiator (Z-1) is a mixture of (Z-1-a):(Z-1-b) in a ratio of 20:10 (parts by mass).

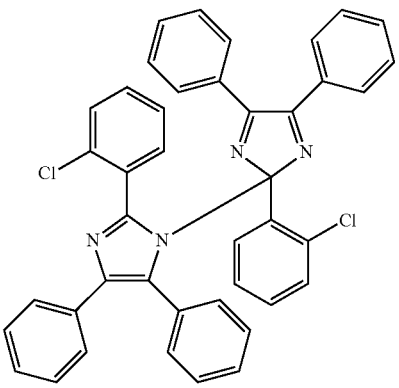

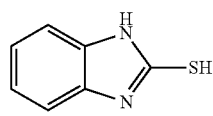

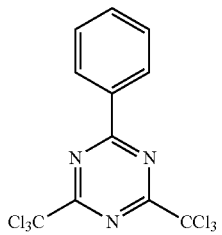

From the results of Table 4, it can be seen that all the colored curable compositions of Examples 26 to 56 used in the preparation of a color filter for LCDs exhibit excellent dispersibility and dispersion stability. Further, it can be seen that when a colored pattern was formed on a substrate using such colored curable compositions, a color filter having less residue formation, excellent developability and light resistance, and excellent contrast can be obtained, as compared to when colored curable compositions of Comparative Examples were used.

Examples 57 to 87, and Comparative Examples 11 to 15

Hereinafter, Examples and Comparative Examples will be described in which colored curable compositions were prepared for the formation of a color filter for use in a solid-state image sensing device.

3-1. Preparation of Resist Solution

The components of the following composition were mixed and dissolved to prepare a resist solution.

<Composition of Resist Solution>

| | |
|---|---|
| Solvent: propylene glycol monomethyl ether acetate | 19.20 parts |
| Solvent: ethyl lactate | 36.67 parts |
| Alkali soluble resin: 40 wt % solution of benzyl methacrylate/methacrylic acid/2-hydroxyethyl methacrylate copolymer in PGMEA (a molar ratio = 60/22/18, a weight-average molecular weight of 15,000, a number average molecular weight of 9,000) | 30.51 parts |
| Compound containing an ethylenically unsaturated double bond: dipentaerythritol hexaacrylate | 12.20 parts |
| Polymerization inhibitor: p-methoxyphenol | 0.0061 parts |
| Fluorine-based surfactant: F-475 (manufactured by DIC Corp.) | 0.83 parts |
| Photopolymerization initiator: trihalomethyltriazine-based photopolymerization initiator (TAZ-107, manufactured by Midori Kagaku Co., Ltd.) | 0.586 parts |

3-2. Production of Silicon Wafer Substrate with Undercoat Layer

A 6-inch silicon wafer was heat treated in an oven at 200° C. for 30 minutes. Subsequently, the resist solution was applied on this silicon wafer to obtain a dried film thickness of 1.5 μm, and the silicon wafer was further heated to dry in an oven at 220° C. for 1 hour to form an undercoat layer. Thus, a silicon wafer substrate with an undercoat layer was obtained.

3-3. Preparation of Colored Curable Composition (a Coating Solution)

Using the pigment dispersions (X-1) to (X-30) prepared in Examples 1 to 25, and Comparative Examples 1 to 5, the components of the following composition were mixed and stirred to prepare colored curable compositions.

<Composition of Colored Curable Composition>

| | |
|---|---|
| The above pigment dispersion: type described in Table 5 | 600 parts |
| 30 wt % solution of resin (L-1) having the above structure in PGMEA | 20 parts (6 parts in terms of solids) |
| Photopolymerization initiator: type described in Table 5 | 20 parts |
| Polymerizable compound: TO-1382 (manufactured by Toagosei Co., Ltd.) (mixture of dipentaerythritol hexaacrylate and dipentaerythritol pentaacrylate mixture with a succinic acid derivative of dipentaerythritol pentaacrylate) | 20 parts |
| Polymerizable compound: dipentaerythritol hexaacrylate | 30 parts |
| Solvent: PGMEA | 900 parts |

3-4. Production and Evaluation of Color Filter Formed from Colored Curable Composition <Formation of Pattern>

The colored curable composition prepared as described above was applied to the undercoat layer of the silicon wafer with undercoat layer obtained in Section 3-2, to form a colored curable composition layer (coating film). Then, the silicon wafer was heat treated (prebake) for 120 seconds using a hot plate at 100° C., so that the dried film thickness of this coating film became 0.5 μm.

Subsequently, the assembly was exposed at a wavelength of 365 nm with various exposure doses in the range of 50 mJ/cm² to 1200 mJ/cm², through a Bayer pattern mask having a pattern with each side of 1.2 μm, using an i-ray stepper exposure apparatus FPA-3000i5+ (manufactured by Canon, Inc.).

Thereafter, the silicon wafer substrate on which an irradiated coating film had been formed after the exposure, was placed on a horizontal rotary table of a spin-shower developing machine (DW-30 type; manufactured by Chemitronics Co., Ltd.), and subjected to a paddle development at 23° C. for 60 seconds using a CD-2000 (manufactured by Fuji Film Electronics Materials Co., Ltd.), to form a colored pattern on the silicon wafer substrate.

The silicon wafer on which a colored pattern had been formed was fixed to the horizontal rotary table by a vacuum chuck method. While the silicon wafer substrate was rotated by a rotating apparatus at a speed of rotation of 50 rpm, a rinsing treatment was conducted by supplying purified water in shower form from above the rotational center of the silicon wafer from an ejection nozzle, and then the silicon wafer was spray-dried.

Thereafter, the size of the colored pattern was measured using a length measuring SEM "S-9260A" (manufactured by Hitachi High-Technologies Corporation). The exposure dose to obtain a pattern size of 1.2 μm was evaluated as the exposure sensitivity.

3-5. Performance Evaluation

The dispersibility and dispersion stability, exposure sensitivity, coatability, and developability of the colored curable composition prepared as described above were evaluated as follows. The evaluation results are presented in Table 5.

In addition, color evenness of the color filter obtained as described above was evaluated as follows. The evaluation results are presented in Table 5.

3-5-1. Dispersibility and Dispersion Stability

Viscosity of the colored curable composition obtained in Section 3-3 was measured 1 day (24 hours) and 1 month (720 hours) after the preparation thereof. The measurement of viscosity was carried out using a TV-22 viscometer cone plate type (manufactured by Toki Sangyo Co., Ltd.). The evaluation environment was 25° C.

A small viscosity value of the colored curable composition represents an excellent dispersibility of the pigment. In addition, a smaller viscosity value of the colored curable composition and a smaller increment in viscosity over time represent a better dispersion stability of the pigment.

3-5-2. Developability

After the development treatment of Section 3-4, residue in 20 developed parts (unexposed parts) were observed and counted under SEM.

3-5-3. Light Resistance

The coated film formed by the colored curable composition was subjected to irradiation using a xenon lamp at 100,000 lux for 20 hours (corresponding to 2,000,000 lux·h). A color difference (ΔEab value) between pre- and post-irradiation was measured to evaluate the light resistance. A smaller ΔEab value represents a better light resistance.

3-5-4. Exposure Sensitivity

The coated film was subjected to exposure at a varying exposure dose within the range of 10 mJ/cm² to 500 mJ/cm², an exposure dose at which a pattern line width after the postbake process was 1.2 μm was evaluated as the exposure sensitivity. A smaller exposure sensitivity represents a higher sensitivity.

3-5-5. Color Evenness of Color Filter

The brightness distribution was interpreted by the following method, and the color evenness of the color filter obtained in Section 3-4 was evaluated on the basis of the proportion occupied by the pixels having a deviation from the average of within ±5%, in the entire number of pixels. The evaluation criteria were as follows.

A method for measuring the brightness distribution is described. First, the colored curable composition obtained in Section 3-3 was coated on the undercoat layer of the glass substrate with an undercoat layer which was prepared by the same method as in Section 3-2, to form a colored curable composition layer (coating film).

Heat treatment (prebake) using a hot plate at 100° C. for 120 seconds was carried out so that the dried film thickness of this coating film became 0.7 μm.

The brightness distribution of the coated glass substrate was interpreted from the images taken with a microscope MX-50 (manufactured by Olympus Corporation), whereby the proportion (%) of pixels having a deviation from the average of within ±5% was calculated. A higher value represents good color evenness.

TABLE 5

| | Pigment dispersion | Photopoly-merization initiator | Viscosity (1 day) | Viscosity (1 month) | Develop-ability | Light resistance | Exposure sensitivity (mJ/cm$^2$) | Color evenness |
|---|---|---|---|---|---|---|---|---|
| Example 57 | (X-1) | (Z-1) | 12 mPa·s | 14 mPa·s | 3 | 3.1 | 150 | 97% |
| Example 58 | (X-1) | (Z-2) | 11 mPa·s | 13 mPa·s | 1 | 2.2 | 120 | 98% |
| Example 59 | (X-1) | (Z-3) | 14 mPa·s | 15 mPa·s | 0 | 3.5 | 160 | 97% |
| Example 60 | (X-1) | (Z-4) | 15 mPa·s | 18 mPa·s | 4 | 3.3 | 250 | 95% |
| Example 61 | (X-1) | (Z-5) | 16 mPa·s | 19 mPa·s | 5 | 3.7 | 350 | 96% |
| Example 62 | (X-1) | (Z-6) | 16 mPa·s | 18 mPa·s | 5 | 3.5 | 290 | 95% |
| Example 63 | (X-1) | (Z-7) | 13 mPa·s | 14 mPa·s | 4 | 3.1 | 160 | 97% |
| Example 64 | (X-2) | (Z-2) | 6 mPa·s | 7 mPa·s | 1 | 1.0 | 110 | 99% |
| Example 65 | (X-3) | (Z-2) | 7 mPa·s | 8 mPa·s | 1 | 0.8 | 120 | 99% |
| Example 66 | (X-4) | (Z-2) | 16 mPa·s | 20 mPa·s | 1 | 0.7 | 110 | 99% |
| Example 67 | (X-5) | (Z-2) | 14 mPa·s | 21 mPa·s | 1 | 0.9 | 120 | 99% |
| Example 68 | (X-6) | (Z-2) | 8 mPa·s | 9 mPa·s | 2 | 0.8 | 130 | 99% |
| Example 69 | (X-7) | (Z-2) | 6 mPa·s | 7 mPa·s | 1 | 0.9 | 110 | 99% |
| Example 70 | (X-8) | (Z-2) | 5 mPa·s | 6 mPa·s | 2 | 0.8 | 120 | 99% |
| Example 71 | (X-9) | (Z-2) | 14 mPa·s | 17 mPa·s | 1 | 1.2 | 100 | 99% |
| Example 72 | (X-10) | (Z-2) | 18 mPa·s | 19 mPa·s | 9 | 2.6 | 110 | 96% |
| Example 73 | (X-11) | (Z-2) | 16 mPa·s | 17 mPa·s | 1 | 1.1 | 120 | 99% |
| Example 74 | (X-12) | (Z-2) | 7 mPa·s | 8 mPa·s | 1 | 1.2 | 120 | 99% |
| Example 75 | (X-13) | (Z-2) | 8 mPa·s | 9 mPa·s | 1 | 1.3 | 130 | 99% |
| Example 76 | (X-14) | (Z-2) | 7 mPa·s | 8 mPa·s | 1 | 1.2 | 120 | 99% |
| Example 77 | (X-15) | (Z-2) | 8 mPa·s | 9 mPa·s | 2 | 2.1 | 130 | 99% |
| Example 78 | (X-16) | (Z-2) | 8 mPa·s | 9 mPa·s | 1 | 2.2 | 130 | 99% |
| Example 79 | (X-21) | (Z-2) | 16 mPa·s | 17 mPa·s | 3 | 2.2 | 130 | 98% |
| Example 80 | (X-22) | (Z-2) | 18 mPa·s | 19 mPa·s | 4 | 2.5 | 140 | 97% |
| Example 81 | (X-24) | (Z-2) | 15 mPa·s | 17 mPa·s | 3 | 2.1 | 140 | 98% |
| Example 82 | (X-25) | (Z-2) | 17 mPa·s | 19 mPa·s | 7 | 2.6 | 160 | 97% |
| Example 83 | (X-26) | (Z-2) | 7 mPa·s | 9 mPa·s | 0 | 1.2 | 160 | 98% |
| Example 84 | (X-27) | (Z-2) | 12 mPa·s | 13 mPa·s | 2 | 1.1 | 160 | 97% |
| Example 85 | (X-28) | (Z-2) | 7 mPa·s | 8 mPa·s | 0 | 1.3 | 160 | 98% |
| Example 86 | (X-29) | (Z-2) | 4 mPa·s | 4 mPa·s | 0 | 0.8 | 150 | 99% |
| Example 87 | (X-30) | (Z-2) | 12 mPa·s | 16 mPa·s | 0 | 1.5 | 160 | 99% |
| Comparative Example 11 | (X-17) | (Z-4) | 50 mPa·s | Not measurable | 28 | 8.5 | 260 | 92% |
| Comparative Example 12 | (X-18) | (Z-4) | 60 mPa·s | Not measurable | 18 | 9.2 | 280 | 91% |
| Comparative Example 13 | (X-19) | (Z-4) | 65 mPa·s | Not measurable | 38 | 8.2 | 240 | 92% |
| Comparative Example 14 | (X-20) | (Z-4) | 70 mPa·s | Not measurable | 42 | 9.5 | 260 | 90% |
| Comparative Example 15 | (X-23) | (Z-4) | 28 mPa·s | 45 mPa·s | 25 | 3.8 | 280 | 92% |

From the results of Table 5, it can be seen that all the colored curable compositions of Examples 57 to 87 used in the preparation of a color filter for solid-state image sensing devices exhibit excellent dispersibility and dispersion stability. Further, it can be seen that when a colored pattern was formed on a substrate using such colored curable compositions, a color filter having less residue formation, excellent developability and light resistance, and good color evenness can be obtained, as compared to when colored curable compositions of Comparative Examples were used.

Example 88

4. Production of Solid-State Image Sensing Device 4-1. Preparation of Pigment Dispersion A pigment dispersion R-1 for red color (R), and a pigment dispersion B-1 for blue color (B) were respectively prepared in the same manner as in the pigment dispersion prepared in Example 3, except that a pigment was changed to the following chromatic color pigment, and a resin was changed to Disperbyk-161 (manufactured by Byk Chemie (BYK), 30% solution).

Chromatic color pigment for formation of individual RGB colored pixels

Pigment for red color (R)

C.I. Pigment Red 254

Pigment for blue color (B)

30/70 [mass ratio] mixture of C.I. Pigment Blue 15:6 and C.I. Pigment Violet 23

4-2. Production of Color Filter for Solid-State Image Sensing Device

A colored curable composition R-2 for red color (R) and a colored curable composition dispersion B-2 for blue color (B) were respectively prepared in the same manner as in Example 57, except that the pigment dispersion (X-1) used in Example 57 was changed to a pigment dispersion R-1 for red color (R), and a pigment dispersion B-1 for blue color (B).

Using the colored polymerizable composition R-2 for red color (R), a red (R) colored pattern with a size of 1.2 μm×1.2 μm was formed on the wafer having a green (G) colored pattern prepared in Example 86. In addition, using the colored curable composition B-2 for blue color (B), a blue (B) colored pattern with a size of 1.2 μm×1.2 μm was formed on the substrate, thereby producing a full-color filter for a solid-state image sensing device.

4-3. Evaluation

When the resulting full-color filter was mounted into a solid-state image sensing device, it was confirmed that the solid-state image sensing device is of high resolution and exhibits excellent color separation properties.

Example 89

5. Production of LCD 5-1. Preparation of Chromatic Color Polymerizable Composition A colored curable composition R-3 for red color (R) and a colored curable composition dispersion B-3 for blue color (B) were respectively prepared in the same manner as in Example 26, except that the pigment dispersion (X-1) used in Example 26 was changed to a pigment dispersion R-1 for red color (R), and a pigment dispersion B-1 for blue color (B).

5-1. Production of Color Filter for LCD

Using the colored curable composition R-3 for red color (R), a line-shaped red (R) colored pattern having a line width of 20 μM was formed on a glass substrate having a green (G) colored pattern prepared in Example 55. In the same manner, using the colored curable composition dispersion B-3 for blue color (B), a line-shaped blue (B) chromatic color pattern having a line width of 20 μm was formed on the substrate, thereby producing a color filter having a black matrix for an LCD.

5-2. Evaluation

An ITO transparent electrode, an oriented film, and the like were processed on the full-color filter, on which an LCD was then provided. The polymerizable composition of the present invention exhibited good uniformity of the coating surface, no display irregularities of the LCD, and good image quality.

The invention claimed is:

1. A pigment dispersion comprising:

a halogenated zinc phthalocyanine pigment; and a copolymer of at least a monomer having at least one of an amino group or a nitrogen-containing heterocyclic group; a monomer having a carboxyl group; and a macromonomer having a weight-average molecular weight of from 1,000 to 50,000.

2. The pigment dispersion of claim 1, further comprising a pigment derivative.

3. The pigment dispersion of claim 2, wherein the pigment derivative has a structure represented by the following formula (P):

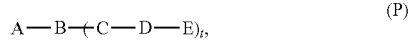

(P)

wherein, in Formula (P), A represents a partial structure selected from the following Formulae (PA-1) to (PA-3), B represents a single bond, or a (t+1)-valent linking group, C represents a single bond, —NH—, —CONH—, —CO$_2$—, —SO$_2$NH—, —O—, —S— or —SO$_2$—, D represents a single bond, an alkylene group, a cycloan alkylene group or an arylene group, E represents —SO$_3$H, —CO$_2$H or —N(Rpa)(Rpb), Rpa and Rpb each independently represents an alkyl group, a cycloalkyl group or an aryl group, Rpa and Rpb may form a ring, and t represents an integer of 1 to 5:

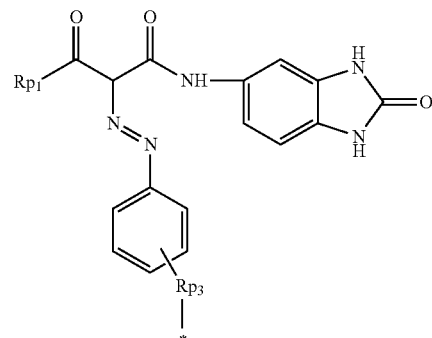

(PA-1)

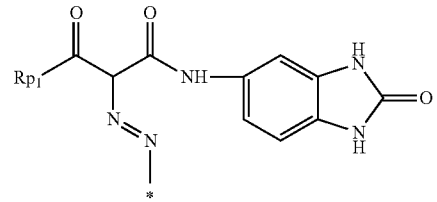

(PA-2)

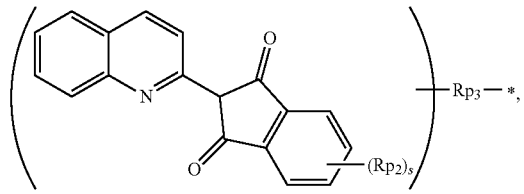

(PA-3)

wherein, in Formulae (PA-1) and (PA-2), Rp1 represents an alkyl group or aryl group having 1 to 5 carbon atoms; in Formula (PA-3), Rp2 represents a hydrogen atom, a halogen atom, an alkyl group, or a hydroxyl group, and s represents an integer of 1 to 4; in Formula (PA-1) and Formula (PA-3), Rp3 represents a single bond, —NH—, —CONH—, —CO$_2$—, —SO$_2$NH—, —O—, —S— or —SO$_2$—; and * represents a linking portion with B.

4. The pigment dispersion of claim 1, wherein the monomer having at least one of an amino group or a nitrogen-containing heterocyclic group is a monomer represented by the following Formula (K) or Formula (L):

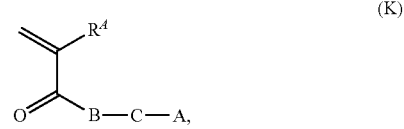

(K)

wherein, in Formula (K), R$^A$ represents a hydrogen atom, a methyl group, a trifluoromethyl group, a hydroxy methyl group, a fluorine atom, or a chlorine atom, B represents an oxygen atom or —N(R$^B$)—, R$^B$ represents a hydrogen atom, an alkyl group, a cycloalkyl group, or an aryl group, C represents a divalent linking group, and A represents an amino group or a nitrogen-containing heterocyclic group:

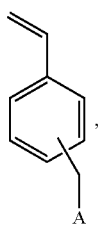

wherein, in Formula (L), A represents an amino group or a nitrogen-containing heterocyclic group.

5. The pigment dispersion of claim 1, wherein the monomer having at least one of an amino group or a nitrogen-containing heterocyclic group is a monomer having an amino group.

6. The pigment dispersion of claim 1, wherein the monomer having a carboxyl group is acrylic acid or methacrylic acid.

7. The pigment dispersion of claim 1, wherein the monomer having a weight-average molecular weight of from 1,000 to 50,000 is a polyester macromonomer.

8. The pigment dispersion of claim 1, wherein a weight-average molecular weight of the monomer having a weight-average molecular weight of from 1,000 to 50,000 is from 2,000 to 5,000.

9. A colored curable composition comprising the pigment dispersion of claim 1, a photopolymerizable compound, and a photopolymerization initiator.

10. The colored curable composition of claim 9, wherein the photopolymerization initiator is at least one of an oxime compound, a hexaaryl biimidazole compound, or a triazine compound.

11. A color filter comprising, on a substrate, a colored region formed by the colored curable composition of claim 9.

12. A solid-state image sensing device, comprising the color filter of claim 11.

13. An image display device, comprising the color filter of claim 11.

14. A liquid crystal display, comprising the color filter of claim 11.

15. A method of manufacturing a color filter comprising:
applying the colored curable composition of claim 9 onto a substrate to form a colored layer;
pattern exposing the colored layer through a mask; and
developing the exposed colored layer to form a colored region.

* * * * *